United States Patent
Shiozaki et al.

(10) Patent No.: US 8,766,834 B2
(45) Date of Patent: Jul. 1, 2014

(54) DISCRETE TIME ANALOG CIRCUIT AND RECEIVER USING SAME

(75) Inventors: Hiroka Shiozaki, Kanagawa (JP); Kiyomichi Araki, Saitama (JP); Yohei Morishita, Kanagawa (JP); Masaki Kanemaru, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/808,481

(22) PCT Filed: Jul. 27, 2011

(86) PCT No.: PCT/JP2011/004239
§ 371 (c)(1),
(2), (4) Date: Jan. 24, 2013

(87) PCT Pub. No.: WO2012/014464
PCT Pub. Date: Feb. 2, 2012

(65) Prior Publication Data
US 2013/0222164 A1    Aug. 29, 2013

(30) Foreign Application Priority Data
Jul. 28, 2010   (JP) .................. 2010-169628

(51) Int. Cl.
*H03M 1/00*      (2006.01)
(52) U.S. Cl.
USPC .......................................... 341/122; 341/124
(58) Field of Classification Search
USPC .......................................... 341/122, 124, 155
See application file for complete search history.

(56) References Cited

U.S. PATENT DOCUMENTS 7,102,558 B2 *  9/2006  Deval .......................... 341/150
7,825,838 B1 * 11/2010  Srinivas et al. ............... 341/121

(Continued)

FOREIGN PATENT DOCUMENTS

| CN | 101395798 A | 3/2009 |
| WO | 2007/102459 A1 | 9/2007 |

(Continued)

OTHER PUBLICATIONS

IEEE Journal of Solid-State Circuits, vol. 39, No. 12, Dec. 2004, "All-Digital Tx Frequency Synthesizer and Discrete-time Receiver for Blue tooth Radio in 130-nm CMOS".

(Continued)

*Primary Examiner* — Brian Young
(74) *Attorney, Agent, or Firm* — Pearne & Gordon LLP

(57) ABSTRACT

The discrete time analog circuit (100) is provided with: a rotate capacitor circuit (150); an amplifier (141) that is connected to the input line or the output line of the rotate capacitor (150), and amplifies the input potential or input charge; a coefficient circuit (140) that is positioned in series with the amplifier (141), and has two history capacitors (143-1, 143-2) positioned parallel to each other; a first active capacitor among the two history capacitors (143-1, 143-2) that is connected to and charges the amplifier (141); and a clock generation circuit (110) that is connected to the input line or the output line without the involvement of the amplifier (141), and that sequentially changes the pairing of the rotate capacitor circuit (150) a second active capacitor, which shares a charge with the rotate capacitor circuit (150).

18 Claims, 46 Drawing Sheets

(56) References Cited

U.S. PATENT DOCUMENTS

| | | | |
|---|---|---|---|
| 7,994,958 B2* | 8/2011 | Quiquempoix et al. | 341/150 |
| 8,229,987 B2* | 7/2012 | Hosokawa et al. | 708/313 |
| 2003/0035499 A1 | 2/2003 | Staszewski et al. | |
| 2009/0009155 A1 | 1/2009 | Hosokawa et al. | |
| 2009/0219086 A1 | 9/2009 | Iida et al. | |
| 2011/0183639 A1 | 7/2011 | Morishita | |

FOREIGN PATENT DOCUMENTS

| | | |
|---|---|---|
| WO | 2008/032601 A1 | 3/2008 |
| WO | 2010/064450 A1 | 6/2010 |

OTHER PUBLICATIONS

The Institute of Electrical Engineers of Japan, Electronic Circuit Research Meetings, ECT-08-89, Nov. 2008, "Direct Sampling Mixer with Complex Poles Enhansing Sharpness Passband Edge Characteristic".

International Search Report for application No. PCT/JP2011/004239 dated Sep. 27, 2011.

* cited by examiner

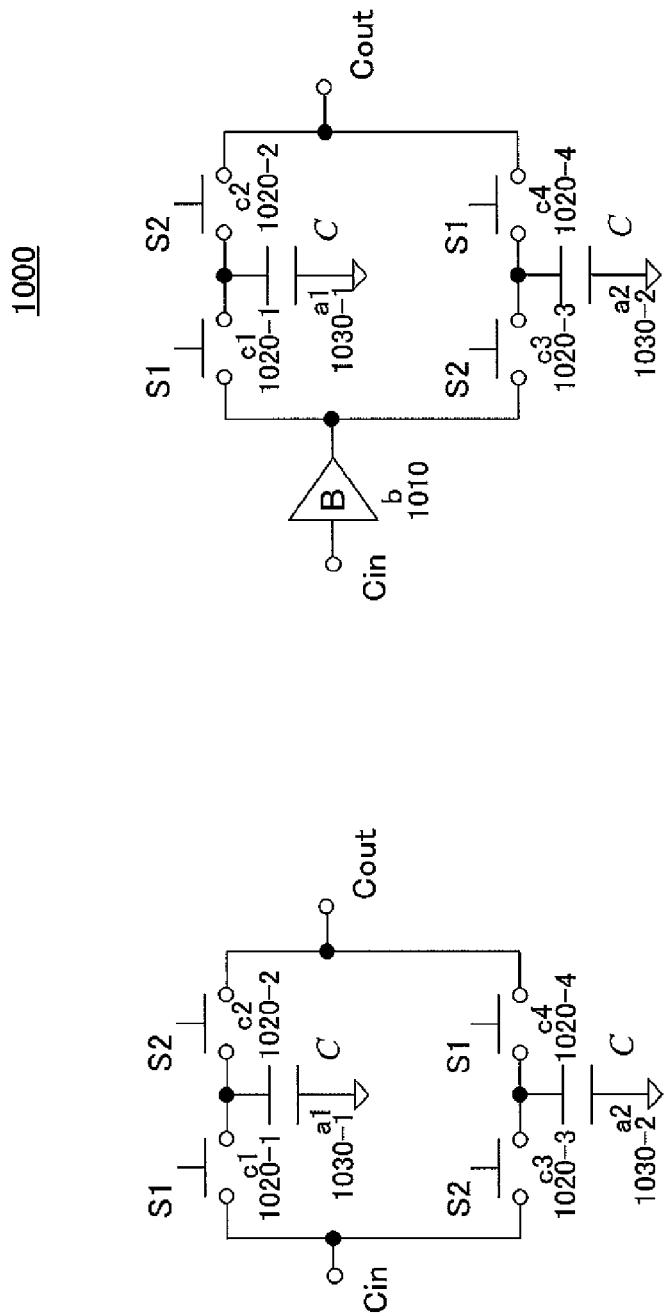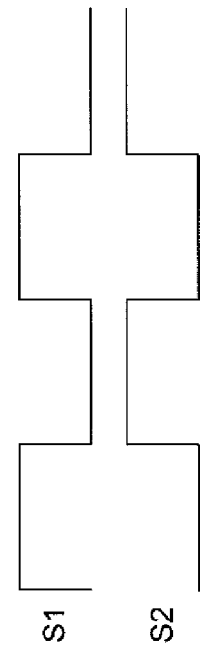
FIG.24

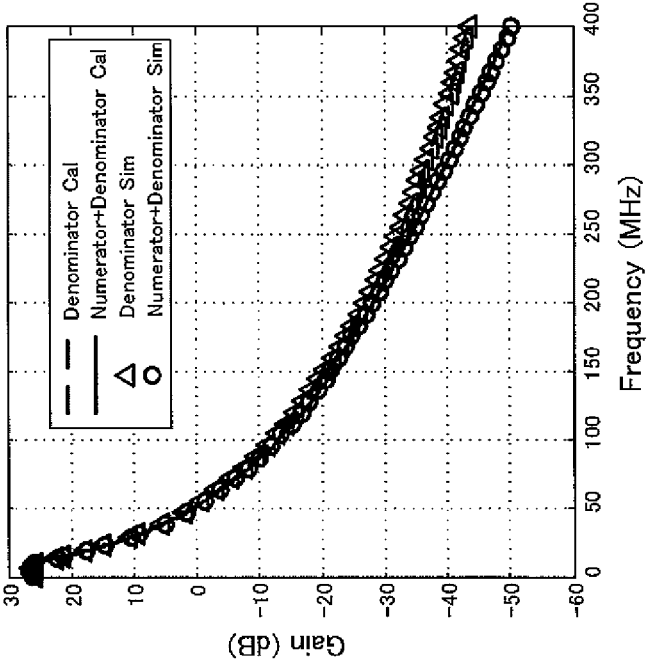
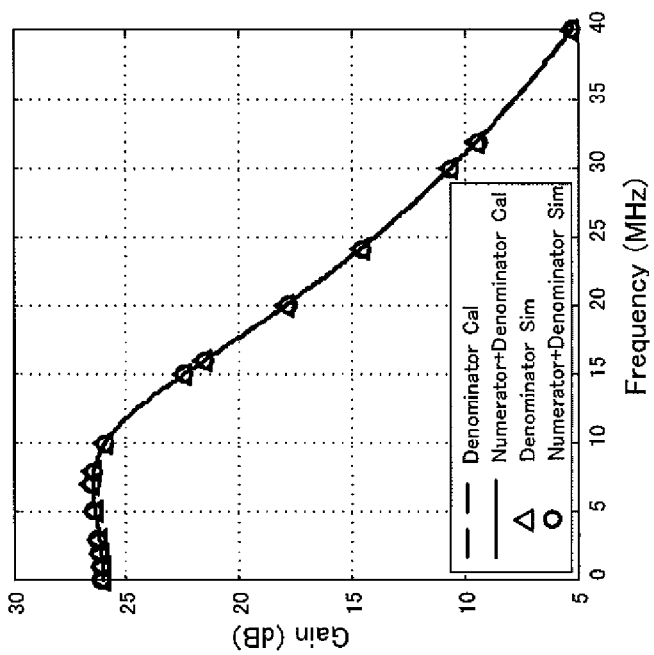
FIG.34

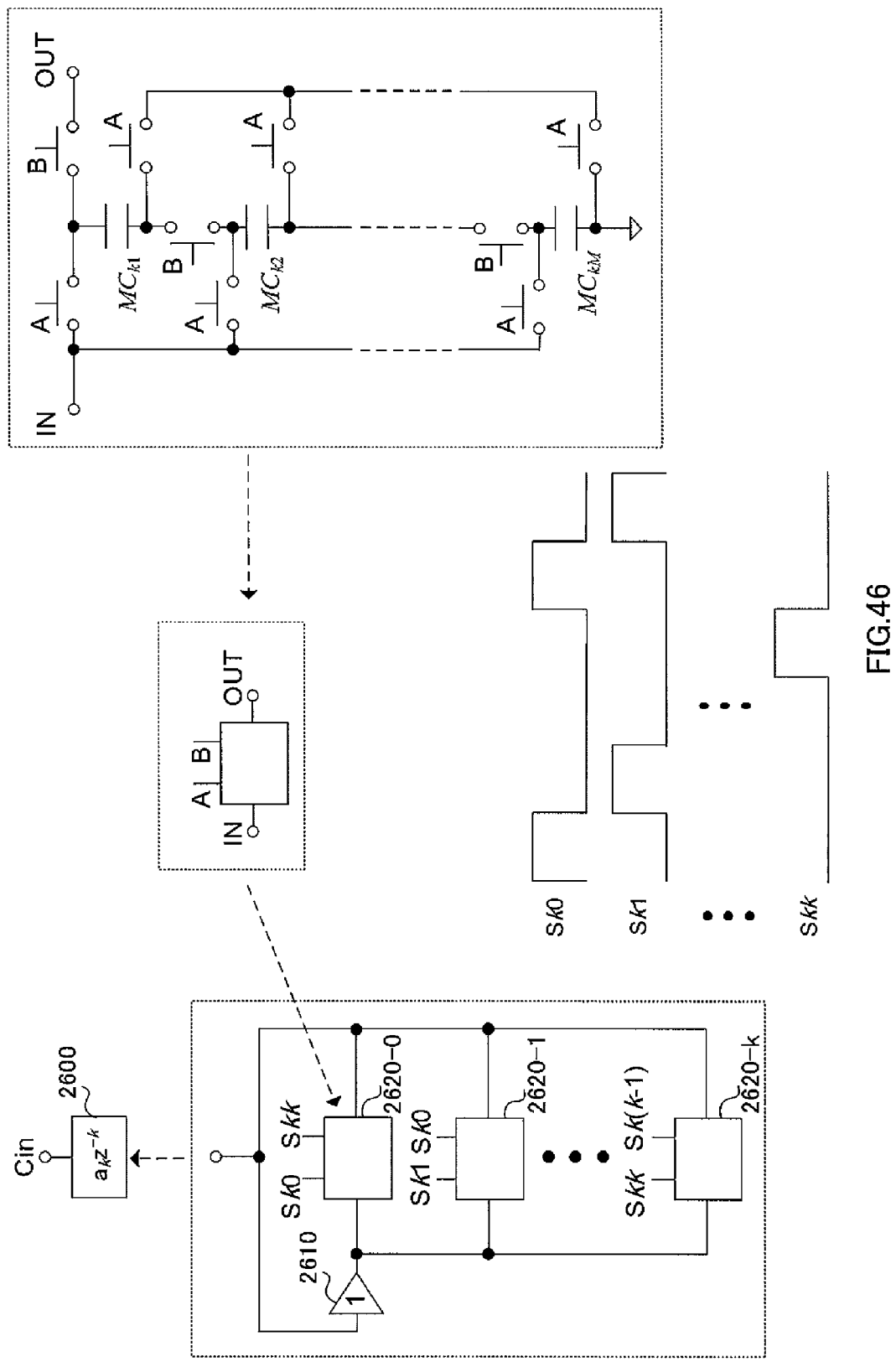

DISCRETE TIME ANALOG CIRCUIT AND RECEIVER USING SAME

TECHNICAL FIELD

The claimed invention relates to a discrete-time analog circuit and a receiver using the same, and more particularly to a technology for performing frequency conversion, filtering, and other types of received signal processing based on discrete-time analog processing.

BACKGROUND ART

Reception processing for radio receivers, in which a high-frequency signal is directly sampled in a discrete-time manner, is known. Such processing is used for reducing the size and power consumption of the radio receiver and also for achieving integration of an analog signal processing section and a digital signal processing section (see Patent Literature 1 and Non-Patent Literature 1, for example).

FIG. 1 shows an overall configuration of the direct sampling circuit disclosed in Patent Literature 1. FIG. 2 is a timing chart showing control signals inputted to the circuit shown in FIG. 1. The direct sampling circuit shown in FIG. 1 converts a received analog radio frequency (RF) signal into a discrete-time analog signal by frequency conversion. This frequency conversion is performed by a multi-tap direct sampling mixer. More specifically, a filter characteristic which is a product of filter characteristics of a finite impulse response (FIR) filter and an infinite impulse response (IIR) filter is achieved by charge transfer among a plurality of capacitors provided in the circuit shown in FIG. 1. The characteristic in the vicinity of a passband is determined by a second-order IIR filter characteristic. FIG. 3(a) shows an example of a broadband frequency characteristic, and FIG. 3(b) shows an example of a narrowband frequency characteristic in the vicinity of a passband.

There is another known configuration of the direct sampling circuit that is based on the configuration described above but uses a transfer function having complex poles (see Non-Patent Literature 2). FIG. 4 shows an overall configuration of the direct sampling circuit disclosed in Non-Patent Literature 2. FIG. 5 is a timing chart showing control signals inputted to the circuit shown in FIG. 4. FIG. 6 shows an example of a frequency characteristic provided by the circuit shown in FIG. 4 (i.e., local (LO) frequency $f_{LO}$=2.4 GHz). It is known that a direct sampling circuit that uses a transfer function having complex poles produces a ripple in a passband.

CITATION LIST

Patent Literature

PTL 1
United States Patent Application Publication No. 2003/0035499

Non-Patent Literature

NPL 1
IEEE Journal of Solid-State Circuits, Vol. 39, No. 12, December 2004, "All-Digital Tx Frequency Synthesizer and Discrete-time Receiver for Blue tooth Radio in 130-nm CMOS"

NPL 2
The Institute of Electrical Engineers of Japan, Electronic Circuit Research Meetings, ECT-08-89, November 2008, "Direct Sampling Mixer with Complex Poles Enhansing Sharpness Passband Edge Characteristic"

SUMMARY OF INVENTION

Technical Problem

The above-mentioned related arts described above, however, have the following problems.

In the direct sampling circuit of the related art shown in FIG. 1, the characteristic of vicinity of a passband is determined by the second-order IIR, it is difficult to achieve a broadband and steep filter characteristic.

In the direct sampling circuit having the configuration shown in FIG. 4, the transfer function has complex poles, whereby a filter characteristic having a flat passband is achieved. In the configuration described above, however, each filter coefficient can only have a value smaller than one as indicated by equation 1, which narrows the range of each achievable pole, making it difficult to have a higher frequency characteristic by the pole at low frequencies.

(Equation 1)

$$T = \frac{1}{1 - C_H/(C_H + C_F + C_R)z^{-1} + C_F/(C_H + C_F + C_R)z^{-2}} \quad [1]$$

In the direct sampling circuits of related art, for example, it is difficult to achieve a broadband filter having a bandwidth of $\frac{1}{1000}$ of the sampling frequency. The solid line in FIG. 6 shows that the position of a ripple is located in the vicinity of 10 MHz, and the sampling frequency having undergone decimation is 120 MHz, which means that the ratio between the two values is only 12.

To achieve a broadband filter characteristic, decimation is necessary. A decimation filter, however, has a problem of aliasing that occurs at the frequency corresponding to the decimation ratio, which makes it difficult to readily use a filter having the filter characteristic described above.

That is, since each coefficient can be achieved in a limited range in the configurations of related art, the Butterworth characteristic or the Chebyshev characteristic, which is typically used, cannot be achieved at an optional sampling frequency in analog and digital filter design.

The claimed invention has been made in view of the points described above. An object of the claimed invention is to provide a discrete-time analog circuit having a high degree of freedom in setting the positions of zero and poles of a filter and having a broadband and steep filter characteristic, and also to provide a receiver.

Solution to Problem

A discrete-time analog circuit reflecting an aspect of the claimed invention includes: a rotating capacitor circuit; at least one coefficient circuit including: a potential holding section that amplifies input potential or input charge, the potential holding section connected to an input line of the rotating capacitor circuit; and n charge holding sections disposed in series with the potential holding section and in parallel with each other, and a circuit connection switching section that sequentially changes the pairing of a first charge holding section and a second charge holding section among the n charge holding sections, the first charge holding section being connected to the potential holding section and charged thereby, the second charge holding section being connected to the input line not via the potential holding section and sharing charge with the rotating capacitor circuit or being held at the potential at the rotating capacitor circuit.

A discrete-time analog circuit reflecting one aspect of the claimed invention includes: a rotating capacitor circuit; at least one coefficient circuit including: a potential holding section that amplifies output potential or output charge, the potential holding section connected to an output line of the rotating capacitor circuit; and n charge holding sections disposed in series with the potential holding section and in parallel with each other, and a circuit connection switching section that sequentially changes the pairing of a first charge holding section and a second charge holding section among the n charge holding sections, the first charge holding section being connected to the potential holding section and charged thereby, the second charge holding section being connected to the output line not via the potential holding section and sharing charge with the rotating capacitor circuit or held at the potential at the rotating capacitor circuit.

To achieve at least one of the abovementioned objects, a receiver reflecting one aspect of the claimed invention includes: the discrete-time analog circuit described above; an antenna that receives an input signal; a low noise amplifier that amplifies the signal received by the antenna and outputs the amplified signal to the discrete-time analog circuit; and an analog-to-digital conversion section that allows a baseband signal outputted from the discrete-time analog circuit to undergo analog-to-digital conversion and outputs a digital baseband signal.

Advantageous Effects of Invention

According to the claimed invention, the degree of freedom in designing a sampling circuit can be increased, and a broadband and steep filter characteristic is achieved.

BRIEF DESCRIPTION OF DRAWINGS

FIG. 24 shows a configuration diagram of a coefficient circuit according to Embodiment 4;

FIG. 34 is a characteristic diagram showing an example of a filter characteristic achieved by the discrete-time analog circuit according to Embodiment 5;

FIG. 46 shows a configuration of a k-th-order coefficient circuit according to Embodiment 9.

DESCRIPTION OF EMBODIMENTS

Embodiments of the claimed invention will be described below in detail with reference to the drawings.

Embodiment 1

Description of Entire Sampling Receiver

Figure 1:
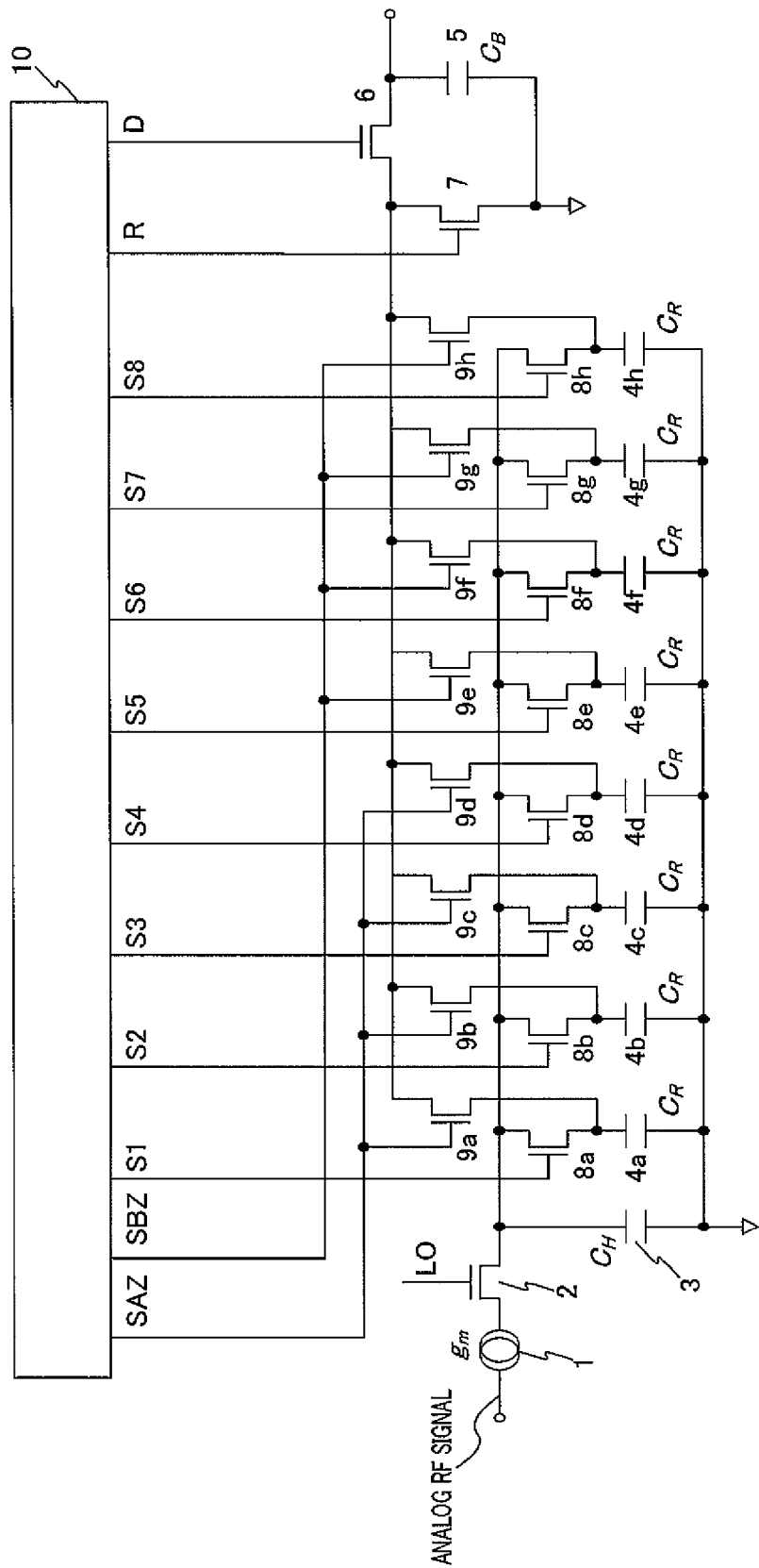
FIG. 1 shows a configuration of a direct sampling circuit having configuration 1 of related art.
Figure 2:
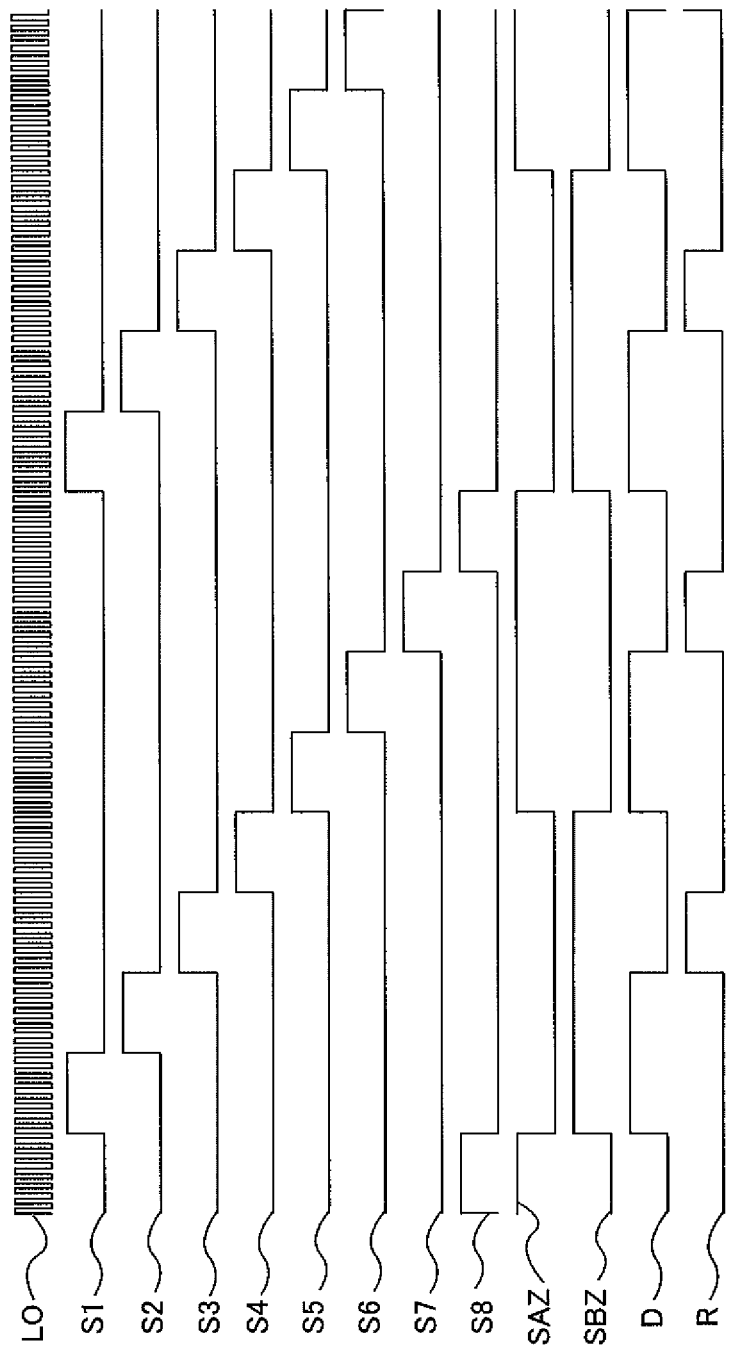
FIG. 2 is a timing chart showing control signals inputted to the direct sampling circuit having configuration 1 of related art.
Figure 3:
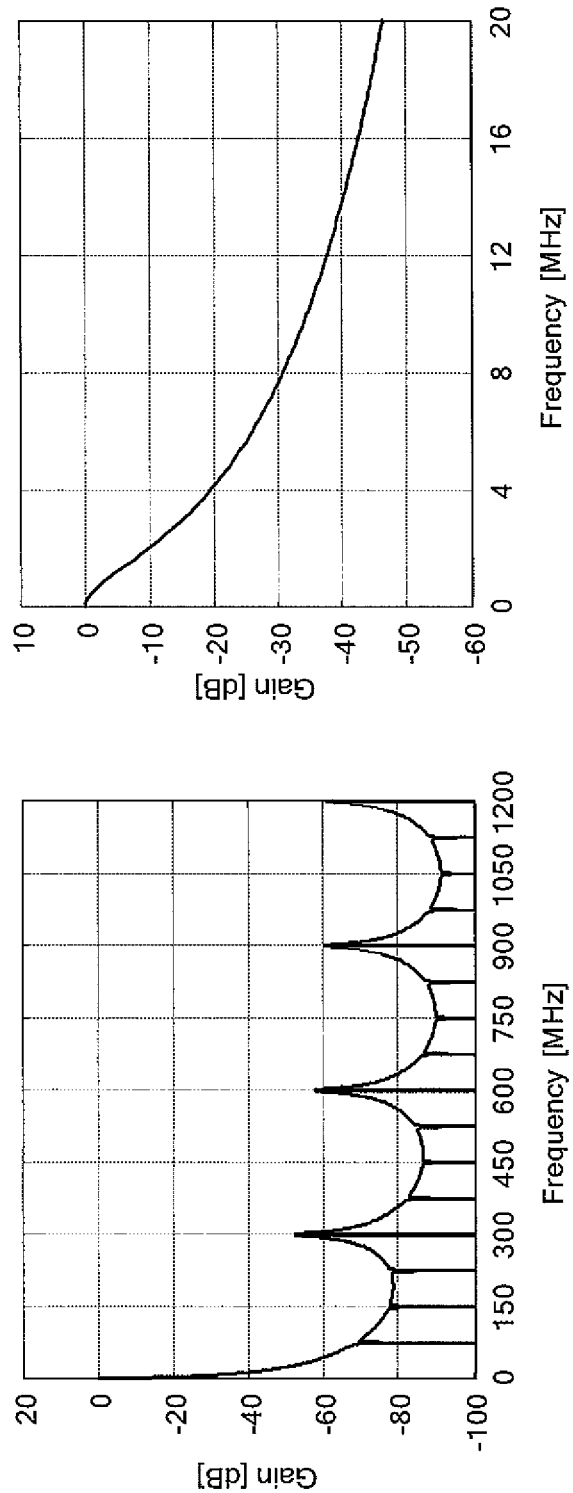
FIG. 3 is a characteristic diagram showing an example of a filter characteristic achieved by the direct sampling circuit having configuration 1 of related art.
Figure 4:
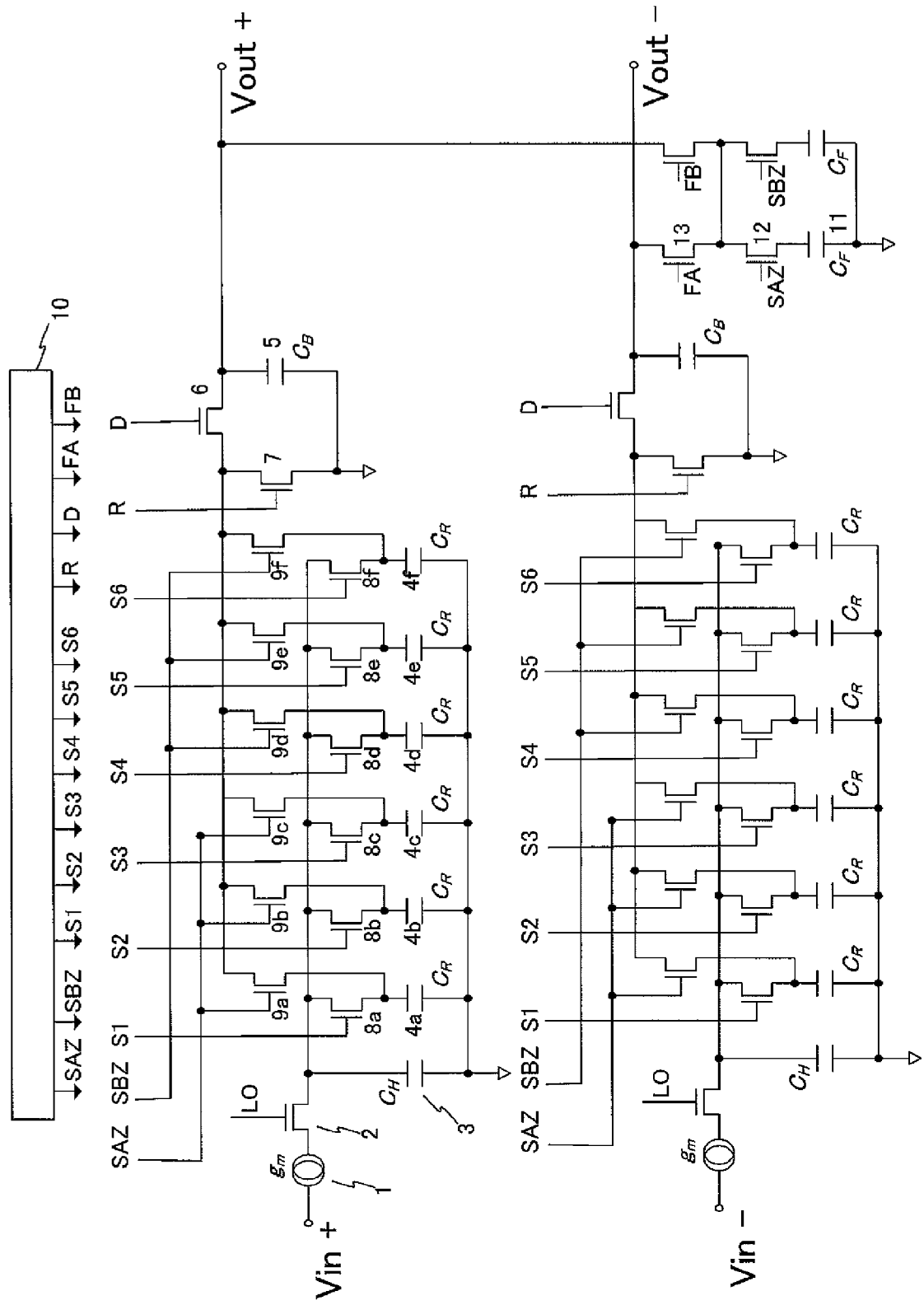
FIG. 4 shows a configuration of a direct sampling circuit having configuration 2 of related art.
Figure 5:
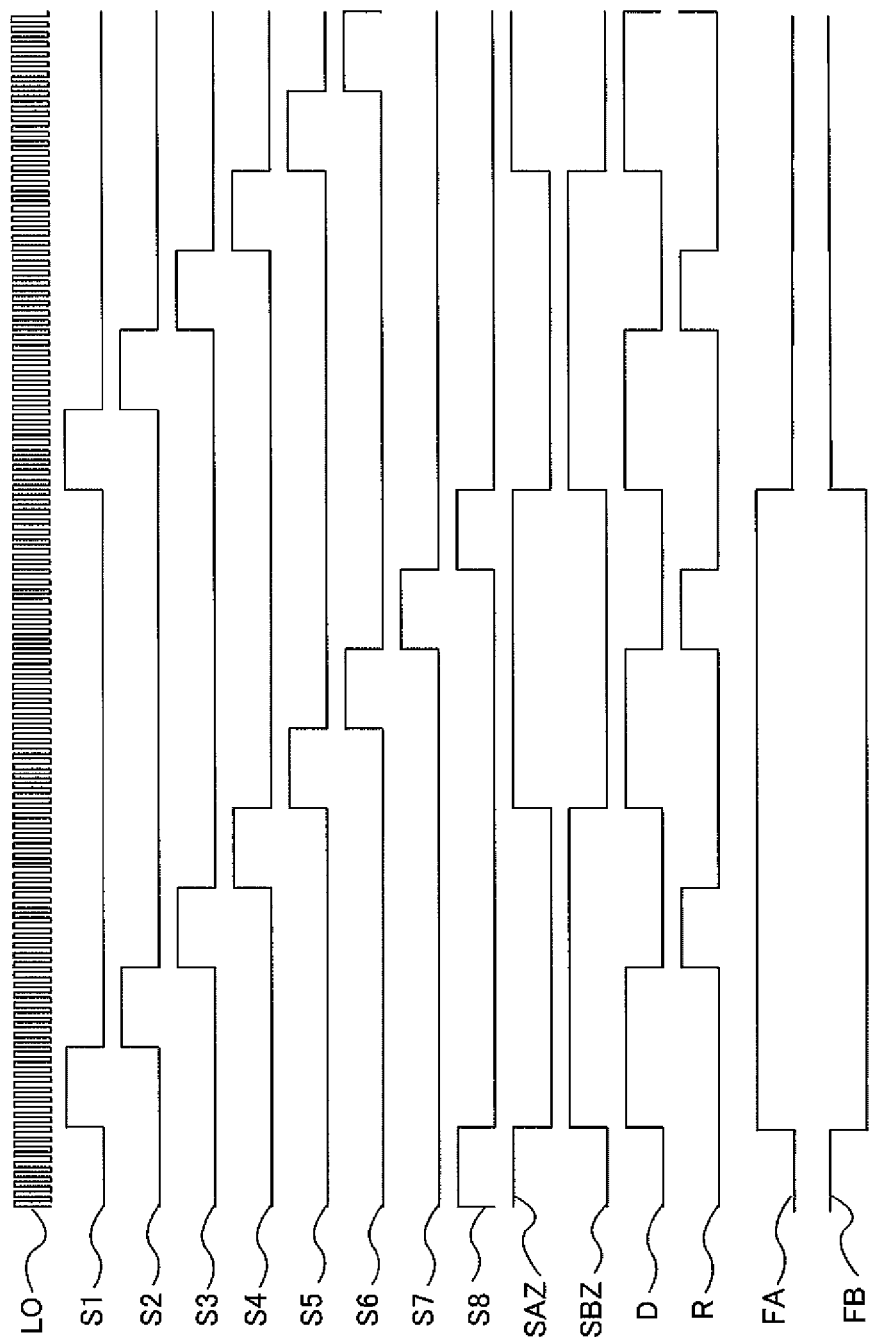
FIG. 5 is a timing chart showing control signals inputted to the direct sampling circuit having configuration 2 of related art.
Figure 6:
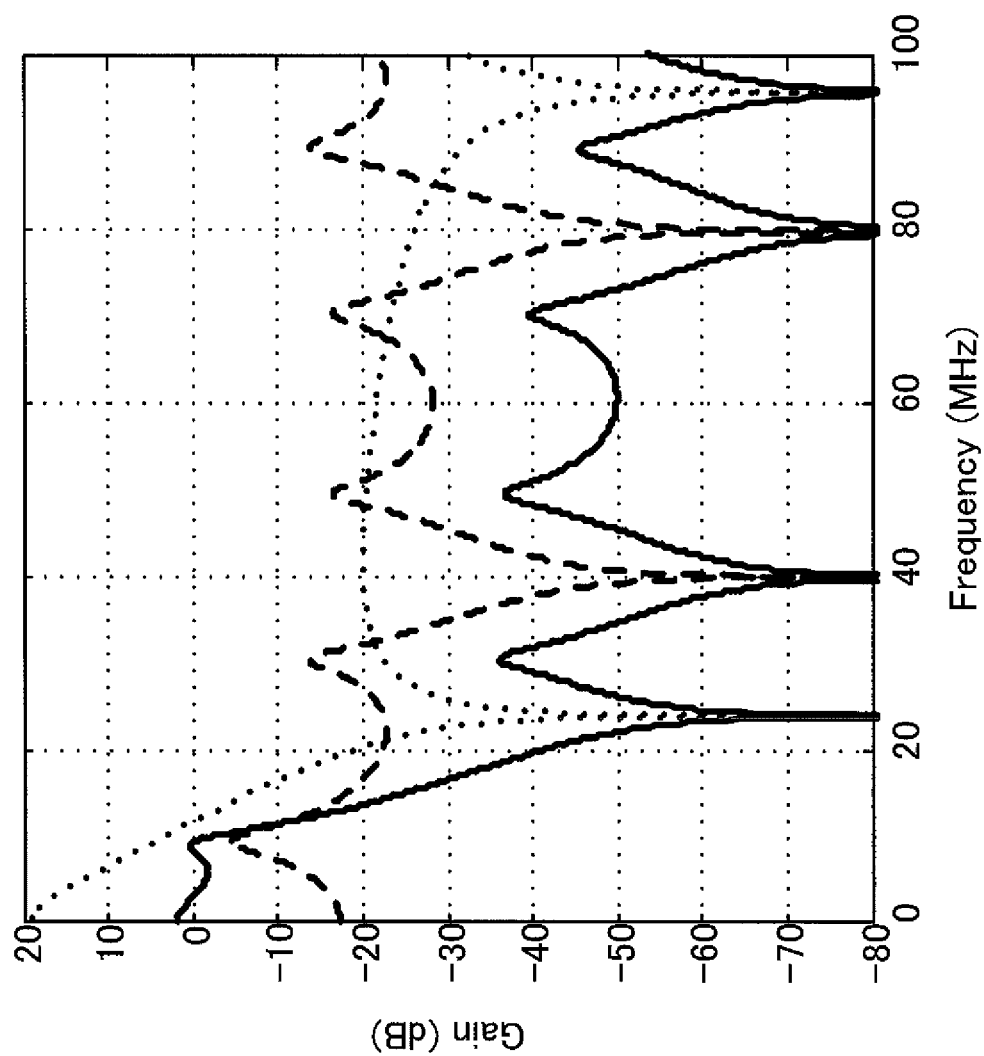
FIG. 6 is a characteristic diagram showing an example of filter characteristics achieved by the direct sampling circuit having configuration 2 of related art.
Figure 7:
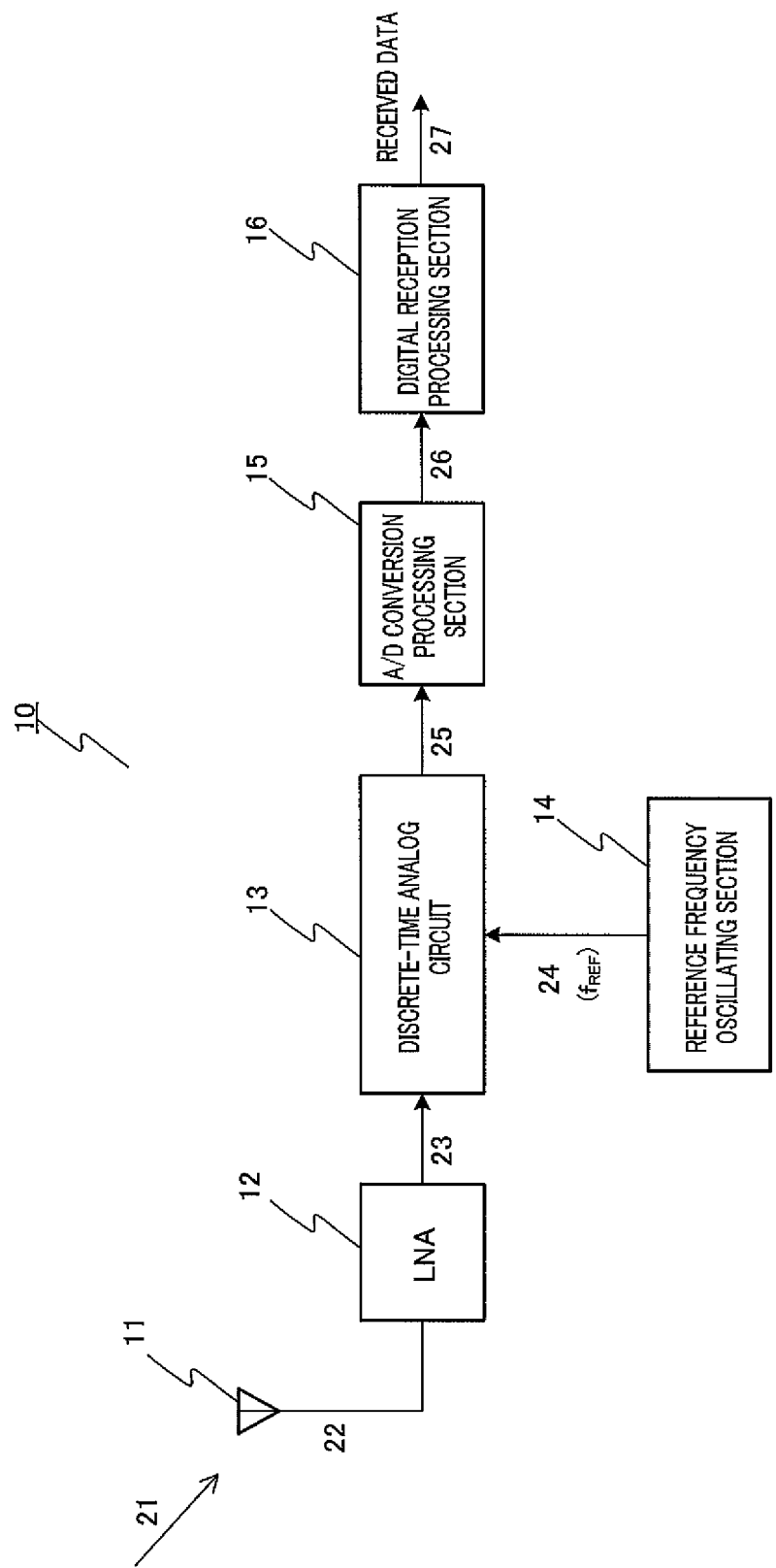
FIG. 7 is a block diagram showing a configuration of a direct sampling receiver according to Embodiment 1 of the invention.

FIG. 7 is a block diagram showing a configuration of a direct sampling receiver according to the present embodiment. In FIG. 7, direct sampling receiver 10 includes antenna 11, low noise amplifier (LNA) 12, discrete-time analog circuit 13, reference frequency oscillating section 14, (Analog to digital (A/D) conversion processing section 15, and digital reception processing section 16.

Direct sampling receiver 10 receives electromagnetic wave 21 transmitted at carrier frequency $f_{RF}$ and performs frequency conversion and filtering on the received signal in a discrete-time manner to extract a desired signal component. Direct sampling receiver 10 then converts the extracted desired signal component into a digital signal and outputs resultant received data 27.

Antenna 11 receives electromagnetic wave 21 transmitted at carrier frequency $f_{RF}$ from a transmitting station (not shown) and converts electromagnetic wave 21 into analog RF signal 22. Low noise amplifier 12 amplifies analog RF signal 22 and outputs the amplified signal.

Discrete-time analog circuit 13 receives amplified analog RF signal 23 and reference frequency signal 24 as inputs. Discrete-time analog circuit 13 then performs frequency conversion and filtering on analog RF signal 23 in a discrete time manner and outputs the resultant baseband signal (or intermediate frequency (IF) signal) 25 having only the extracted desired signal component.

Reference frequency oscillating section 14 produces reference frequency signal 24 used in sampling and frequency conversion and outputs reference frequency signal 24 to discrete-time analog circuit 13.

A/D conversion processing section 15 quantizes inputted baseband signal 25 at a predetermined sampling frequency to form digital values and outputs the converted digital baseband signal 26.

Digital reception processing section 16 performs predetermined digital reception processing, such as demodulation and decoding, on inputted digital baseband signal 26 and outputs resultant received data 27.

Figure 8:
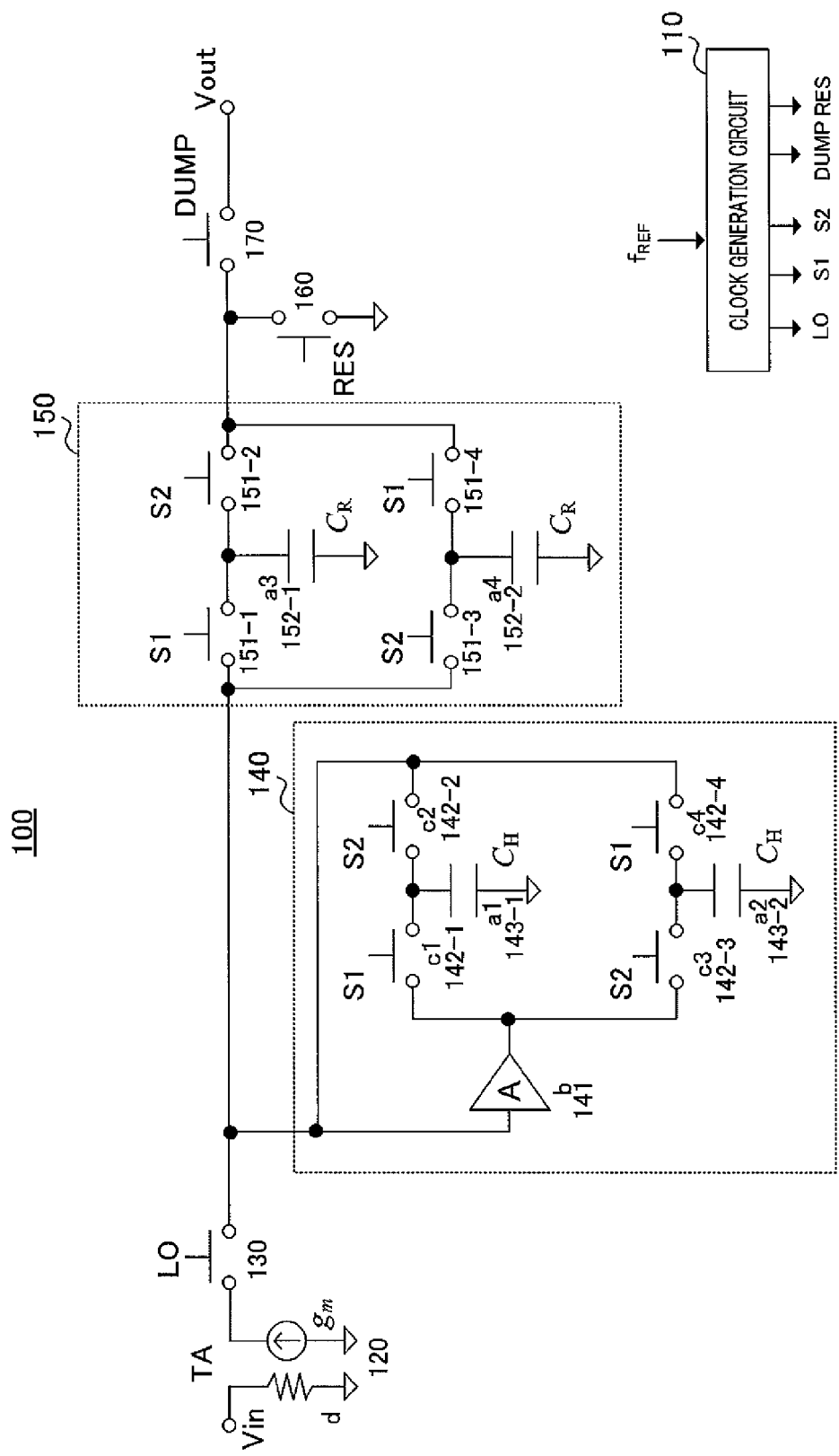
FIG. 8 shows a configuration of a discrete-time analog circuit according to Embodiment 1.

FIG. 8 is a block diagram showing an example of a key configuration of discrete-time analog circuit 13 according to the present embodiment. In FIG. 8, discrete-time analog circuit 100 corresponds to discrete-time analog circuit 13 shown in FIG. 7 and forms a sampling mixer.

[Configuration of Discrete-Time Analog Circuit 100]

In FIG. 8, discrete-time analog circuit 100 includes clock generation circuit 110, transconductance amplifier (TA: voltage-current converter (having transconductance: gm)) 120, sampling switch 130, coefficient circuit 140, rotating capacitor circuit 150, reset switch 160, and dump switch 170.

Discrete-time analog circuit 100 shown in FIG. 8 has a configuration in which coefficient circuit 140 is disposed in a position upstream of rotating capacitor circuit 150 and is called an upstream discrete-time analog circuit in the following description. In the upstream discrete-time analog circuit, coefficient circuit 140 is connected to an input line of rotating capacitor circuit 150.

Coefficient circuit 140 includes CHs (history capacitors) 143-1 and 143-2 (a1, a2), amplifier 141 (b), connection switches (hereinafter, referred to as switches) 142-1 to 142-4 (c1 to c4). Coefficient circuit 140, which shares charge with (charge holding circuit in) rotating capacitor circuit 150, provides the denominator of the transfer function of discrete-time analog circuit 100 with first-order coefficients having optional values. Clock generation circuit 110 inputs control signals S1 and S2 to coefficient circuit 140.

In coefficient circuit 140, amplifier 141 (b) is connected to the input line of rotating capacitor circuit 150 and functions as a potential holding section that amplifies input potential or input charge. CHs 143-1 and 143-2 are connected in series with amplifier 141 (b) and disposed in parallel with each other. Each of CHs 143-1 and 143-2 functions as a charge holding section.

Rotating capacitor circuit 150 includes switches 151-1 to 151-4 and CRs (rotating capacitors) 152-1 and 152-2 (a3, a4).

Figure 9:
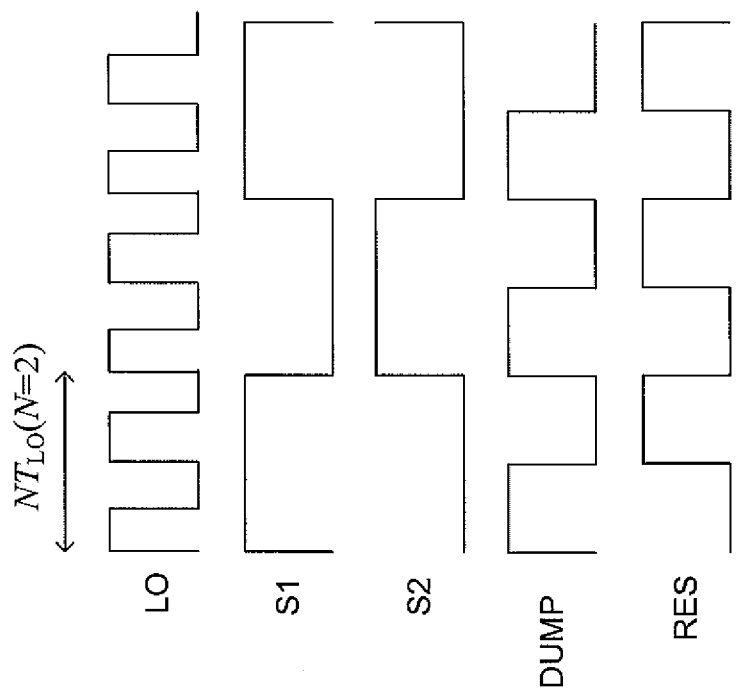
FIG. 9 shows clocks (control signals) provided from a clock generation circuit.

Clock generation circuit 110 provides clocks (i.e., control signals) to sampling switch 130, coefficient circuit 140, switches 151-1 to 151-4, reset switch 160 and dump switch 170. FIG. 9 shows the clocks (i.e., control signals) provided from clock generation circuit 110. Specifically, clock generation circuit 110 generates control signals LO, S1, S2, RES, and DUMP from reference frequency signal 24 produced by reference frequency oscillating section 14 and supplies the switches with the generated control signals.

In FIG. 9, N represents a decimation ratio resulting from charge accumulation at the time of charge sampling and is one-half the ratio between the cycle of LO and the cycle of the clocks with prefix S (S1, S2). Specifically, 2NTLO=TSCLK, or the decimation ratio is the ratio between the cycle of LO and the cycle of RES or DUMP. DUMP and RES are signals shifted from each other by one-half the cycles thereof.

[Operation of Discrete-Time Analog Circuit 100]

Clock generation circuit 110 generates control signals LO, S1, S2, RES, and DUMP from reference frequency signal 24 produced by reference frequency oscillating section 14 and supplies the switches with the control signals.

TA 120 receives analog RF signal 23 amplified by low noise amplifier 12 as an input voltage signal and converts the voltage signal into a current (gm×Vin).

Sampling switch 130 is connected to an output stage of TA 120 and stays ON only during the period when LO supplied from the clock generation circuit is high. LO is a signal having a frequency that agrees with $f_{RF}$ of analog RF signal 23 (fLO=fRF) in the case of direct conversion. When frequency IF is used, LO is a signal having a frequency shifted from fRF by frequency IF (i.e., fLO=fRF±fIF).

[1] Interval where S1 is High

In the interval where LO is high, the input current (gm×Vin) is accumulated as charge (i.e., input charge) in CH 143-2 (a2) and CR 152-1 (a3). In the interval where S1 is high, the charge held in CH 143-2 (a2) (i.e., charge accumulated by A×Vout) and the input charge described above are shared, and output potential Vout is determined.

At the same time, amplifier 141 monitors output potential Vout, amplifies output potential Vout by a factor of A, and charges CH 143-1 (a1) with the amplified potential.

On the other hand, in the interval where DUMP is high, output potential Vout at CR 152-1 (a3) is outputted (Vout) as baseband signal or intermediate frequency (IF) signal 25. That is, output potential Vout is outputted as baseband signal (or IF signal) 25 that is produced by performing frequency conversion and filtering on analog RF signal 23 in a discrete-time manner and extracting only a desired signal component.

Furthermore, in the interval where RES is high, DUMP is low and the potential at CR 152-1 (a3) is reset.

[2] Interval where S2 is High

In the section where LO is high, the input current (gm×Vin) is accumulated as charge (i.e., input charge) in CH 143-1 (a1) and CR 152-2 (a4). In the interval where S2 is high, the charge held in CH 143-1 (a1) (i.e., charge accumulated by A×Vout) and the input charge described above are shared, and output potential Vout is determined.

At the same time, amplifier 141 (*b*) monitors output potential Vout, amplifies output potential Vout by a factor of A, and charges CH 143-2 (a2) with the amplified potential.

On the other hand, in the interval where DUMP is high, output potential Vout at CR 152-1 (a3) is outputted as baseband signal or IF signal 25. That is, output potential Vout is outputted as baseband signal (or IF signal) 25 that is produced by performing frequency conversion and filtering in a discrete-time manner on analog RF signal 23 and extracting only a desired signal component.

Furthermore, in the interval where RES is high, DUMP is low and the potential at CR 152-1 (a3) is reset.

In [3] and thereafter, the operations in [1] and [2] are repeated. That is, clock generation circuit 110 and the switches as a circuit connection switching section sequentially change the pairing of first and second capacitors. The first capacitor is a capacitor connected to amplifier 141 (*b*) and charged thereby. The second capacitor is a capacitor which is connected to the input line of rotating capacitor circuit 150 not via amplifier 141 (*b*) and whose charge and the charge in rotating capacitor circuit 150 are shared.

The above operation is described by a difference equation as follows:

[2]

$$q_{in}(n) + AC_H v_{out}(n-N) = (C_R + C_H) v_{out}(n) \quad \text{(Equation 2)}$$

In equation 2, first term $q_{in}(n)$ on the left side corresponds to the input charge, and the second term on the left side is charge held in the CHs based on the output potential produced 1 timing before the charge inputting and multiplied by A. In addition, n represents timing.

Performing z transform on equation 2 derives equation 3.

[3]

$$Q_{in} + AC_H z^{-N} V_{out} = (C_R + C_H) V_{out} \quad (3)$$

In equation 3, first term $Q_{in}$ corresponds to input charge $q_{in}(n)$ having undergone the z transform and can be expressed by the following equation. Since the value of sin θ does not greatly change in the vicinity of π/2, equation 3 can be rewritten by substituting $f=f_{LO}$ and simply expressed by equation 4 as an approximate expression in the vicinity of $f=f_{LO}$.

(Equation 4)

$$Q_{in} = g_m V_{in} \left| \int_0^{T_{LO}/2} \exp(j\omega t) dt \right| \cdot (1 + z^{-1} + \ldots + z^{-(N-1)}) \quad [4]$$

$$= \frac{g_m}{\pi f} \cdot \left| \exp\left(j\omega\left(\frac{T_{LO}}{4}\right)\right) \right| \cdot \sin\left(\frac{\pi f T_{LO}}{2}\right) \cdot \frac{1-z^{-N}}{1-z^{-1}} \cdot V_{in}$$

$$\approx \frac{g_m T_{LO}}{\pi} \cdot \frac{1-z^{-N}}{1-z^{-1}} \cdot V_{in}$$

The transfer function is expressed by equation 5 as follows:

(Equation 5)

$$\frac{V_{out}}{V_{in}} = \frac{g_m T_{LO}}{\pi} \cdot \frac{1-z^{-N}}{1-z^{-1}} \cdot \frac{1/(C_R+C_H)}{1-\{AC_H/(C_R+C_H)\}z^{-N}} \quad [5]$$

Equation 5 shows that the discrete-time analog circuit according to the present embodiment allows optional coefficients to be set by multiplying the coefficient of $z^{-N}$ in the denominator by a weighting value A.

The above description relates to an example in which the history capacitors that form the sampling mixer are used as components of the coefficient circuit. A description will next be made of a case where buffer capacitors that form the sampling mixer are used as components of the coefficient circuit.

Figure 10:
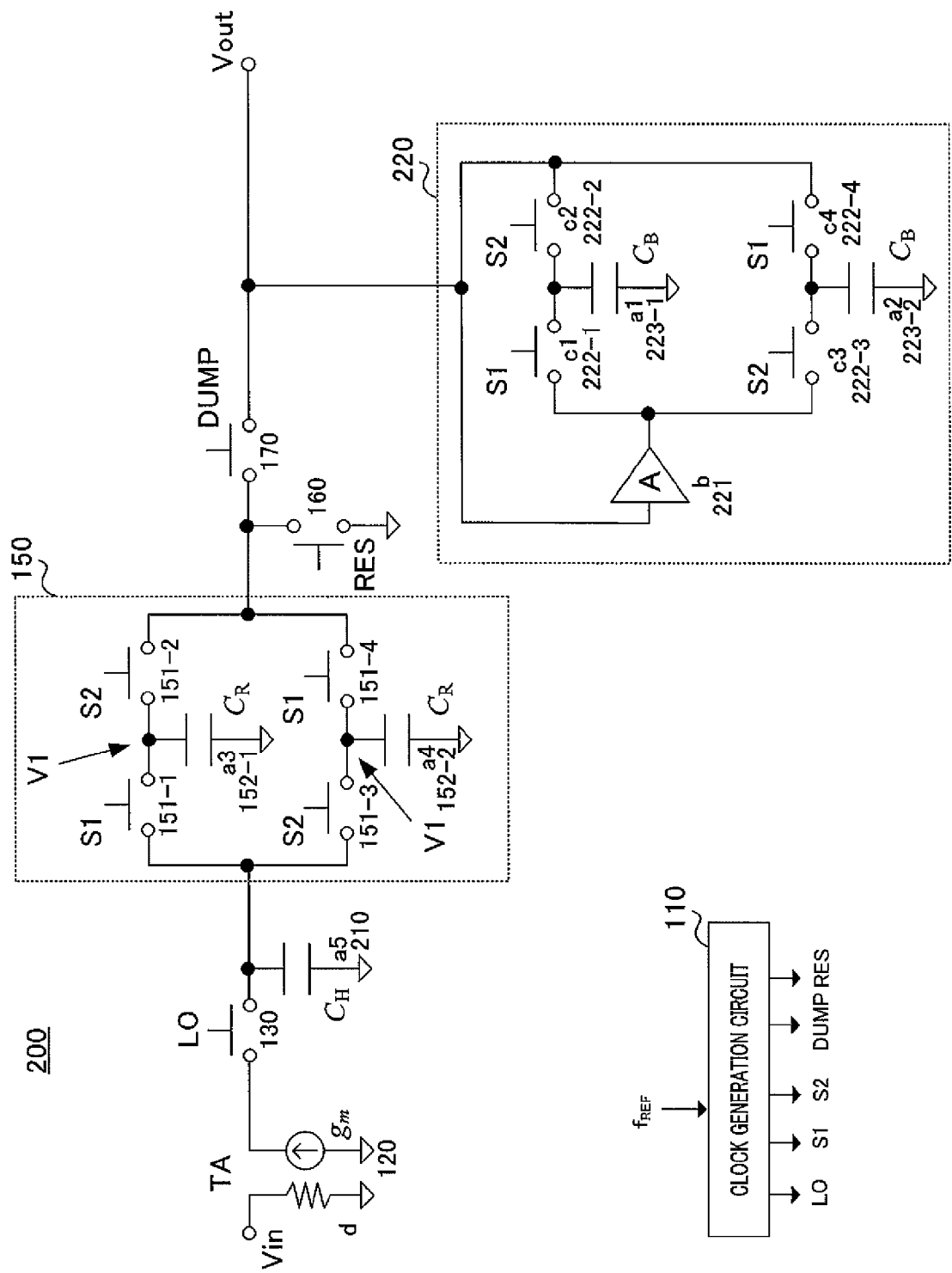
FIG. 10 shows another configuration of the discrete-time analog circuit according to Embodiment 1.

FIG. 10 shows another key configuration of discrete-time analog circuit 13 according to the present embodiment. In FIG. 10, discrete-time analog circuit 200 corresponds to discrete-time analog circuit 13 shown in FIG. 7 and forms a sampling mixer. In discrete-time analog circuit 200 shown in FIG. 10, components common to those of discrete-time analog circuit 100 shown in FIG. 8 are assigned the same reference numerals as those in FIG. 8, and the descriptions thereof will be omitted. Discrete-time analog circuit 200 shown in FIG. 10 differs from discrete-time analog circuit 100 shown in FIG. 8 in that coefficient circuit 140 is replaced with coefficient circuit 220 and CH 210 (a5) is added. Discrete-time analog circuit 200 shown in FIG. 10 has a configuration in which coefficient circuit 220 is disposed in a position downstream of rotating capacitor circuit 150. Discrete-time analog circuit 200 is hereinafter called a downstream discrete-time analog circuit. In the downstream discrete-time analog circuit, coefficient circuit 220 is connected to an output line of rotating capacitor circuit 150.

Figure 11:
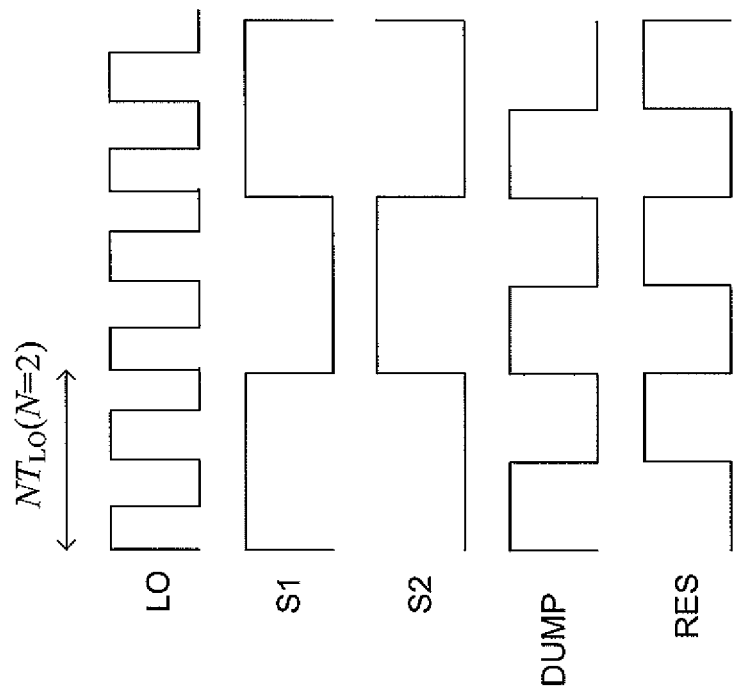
FIG. 11 shows clocks (i.e., control signals) provided from the clock generation circuit.

Coefficient circuit 220 includes CBs (buffer capacitors) 223-1 and 223-2 (a1, a2), amplifier 221 (*b*), and switches 222-1 to 222-4 (c1 to c4). CBs 223-1 and 223-2 (a1, a2) in coefficient circuit 220 share charge with CRs 152-1 and 152-2 (a3, a4), thereby providing the denominator of the transfer function of discrete-time analog circuit 200 with higher-order coefficients. Coefficient circuit 220 receives control signals S1 and S2 as inputs from clock generation circuit 110. FIG. 11 shows clocks (i.e., control signals) provided from clock generation circuit 110.

In coefficient circuit 220, amplifier 221 (*b*) is connected to the output line of rotating capacitor circuit 150 and functions as a potential holding section that amplifies output potential or output charge. CBs 223-1 and 223-2 (a1, a2) are connected in series with amplifier 221 (*b*) and disposed in parallel with each other. Each of CBs 223-1 and 223-2 (a1, a2) functions as a charge holding section.

[Operation of Discrete-Time Analog Circuit 200]

Clock generation circuit 110 generates control signals LO, S1, S2, RES, and DUMP from reference frequency signal 24 produced by reference frequency oscillating section 14 and supplies the switches with the control signals.

TA 120 receives analog RF signal 23 amplified by low noise amplifier 12 as an input voltage signal and converts the voltage signal into a current (gm×Vin).

[1] Interval where S1 is High

In the interval where LO is high, the input current (gm× Vin) is accumulated as charge (i.e., input charge) in CH 210 (a5) and CR 152-1 (a3). In the interval where S1 is high, the charge held in CH 210 (a5) and the input charge described above are shared, and potential V1 at CH 210 (a5) and CR 152-1 (a3) is determined. This charge sampling allows frequency conversion to be performed at the same time, and the radio frequency (RF) signal is converted into an intermediate frequency (IF) signal or a baseband (BB) signal.

On the other hand, in the interval where DUMP is high, CR 152-2 (a4) is connected to CB 223-2 (a2). In the interval where S1 is high, the charge held in CR 152-2 (a4) and the charge held in CB 223-2 (a2) (charge multiplied by A and accumulated) are shared. The shared charge is held in CR 152-2 (a4) and CB 223-2 (a2), and output potential Vout is determined.

At the same time, amplifier 221 (b) monitors output potential Vout, amplifies output potential Vout by a factor of A, and charges CB 223-1 (a1) with the amplified potential. Output potential Vout is outputted as BB signal or IF signal 25 obtained by performing frequency conversion and filtering on analog RF signal 23. Furthermore, in the interval where RES is high, DUMP is low and the charge in CR 152-2 (a4) is grounded and reset.

[2] Interval where S2 is High

In the interval where LO is high, the input current (gm× Vin) is accumulated as charge (i.e., input charge) in CH 210 (a5) and CR 152-2 (a4). The charge held in CH 210 (a5) and the input charge described above are shared, and potential V1 at CH 210 (a5) and CR 152-2 (a4) is determined. This charge sampling allows frequency conversion to be performed at the same time, and the RF signal is converted into an IF signal or BB signal.

On the other hand, in the interval where DUMP is high, CR 152-1 (a3) is connected to CB 223-1 (a1). In the interval where S2 is high, the charge held in CR 152-1 (a3) and the charge held in CB 223-1 (a1) (i.e., change multiplied by A and accumulated) are shared. The shared charge is held in CR 152-1 (a3) and CB 223-1 (a1), and output potential Vout is determined. At the same time, amplifier 221 (b) monitors output potential Vout, amplifies output potential Vout by a factor of A, and charges CB 223-2 (a2) with the amplified potential. Output potential Vout is outputted as BB signal or IF signal 25 obtained by performing frequency conversion and filtering on analog RF signal 23. Furthermore, in the interval where RES is high, the charge in CR 152-1 (a3) is grounded and reset.

In [3] and thereafter, the operations in [1] and [2] are repeated. That is, clock generation circuit 110 and the switches as a circuit connection switching section sequentially change the pairing of first and second capacitors. The first capacitor is a capacitor connected to amplifier 221 (b) and charged thereby. The second capacitor is a capacitor which is connected to the output line of rotating capacitor circuit 150 not via amplifier 221 (b) and whose charge and the charge in rotating capacitor circuit 150 are shared.

The above operation is described by a difference equation as follows:

[6]

$$q_{in}(n) + C_H v_1(n-N) = (C_R + C_H) v_1(n) \quad \text{(Equation 6)}$$

In equation 6, first term $q_{in}(n)$ on the left side corresponds to the input charge, and the second term on the left side is the charge held in the CH and determined by the charge sharing performed 1 timing before the charge inputting.

[7]

$$C_R v_1(n) + A C_B v_{out}(n-N) = (C_R + C_B) v_{out}(n) \quad \text{(Equation 7)}$$

In equation 7, the first term on the left side is the charge held in the CRs, and the second term on the left side is the charge held in the CBs based on the potential determined by the charge sharing performed 1 timing before the charge holding.

Performing z transformation on equations 6 and 7 and organizing the results derives a transfer function expressed in equation 8 as follows:

(8)

$$\frac{V_{out}}{V_{in}} = \frac{g_m T_{LO}}{\pi} \cdot \frac{1 - z^{-N}}{1 - z^{-1}} \cdot \frac{1/(C_R + C_H)}{1 - \{C_H/(C_R + C_H)\}z^{-N}} \cdot \frac{C_R/(C_R + C_B)}{1 - \{AC_B/(C_R + C_B)\}z^{-N}} \quad [8]$$

Equation 8 shows that the discrete-time analog circuit according to the present embodiment allows optional coefficients to be set by multiplying the coefficient of $z^{-N}$ in the denominator by a weighting value A.

Discrete-time analog circuit 200 described above relates to an example in which the buffer capacitors that form the sampling mixer are used as components of the coefficient circuit. The sampling filter to be described next relates to an example in which buffer capacitors are used as components of the coefficient circuit.

[Configuration of Discrete-Time Analog Circuit 300]

Figure 12:
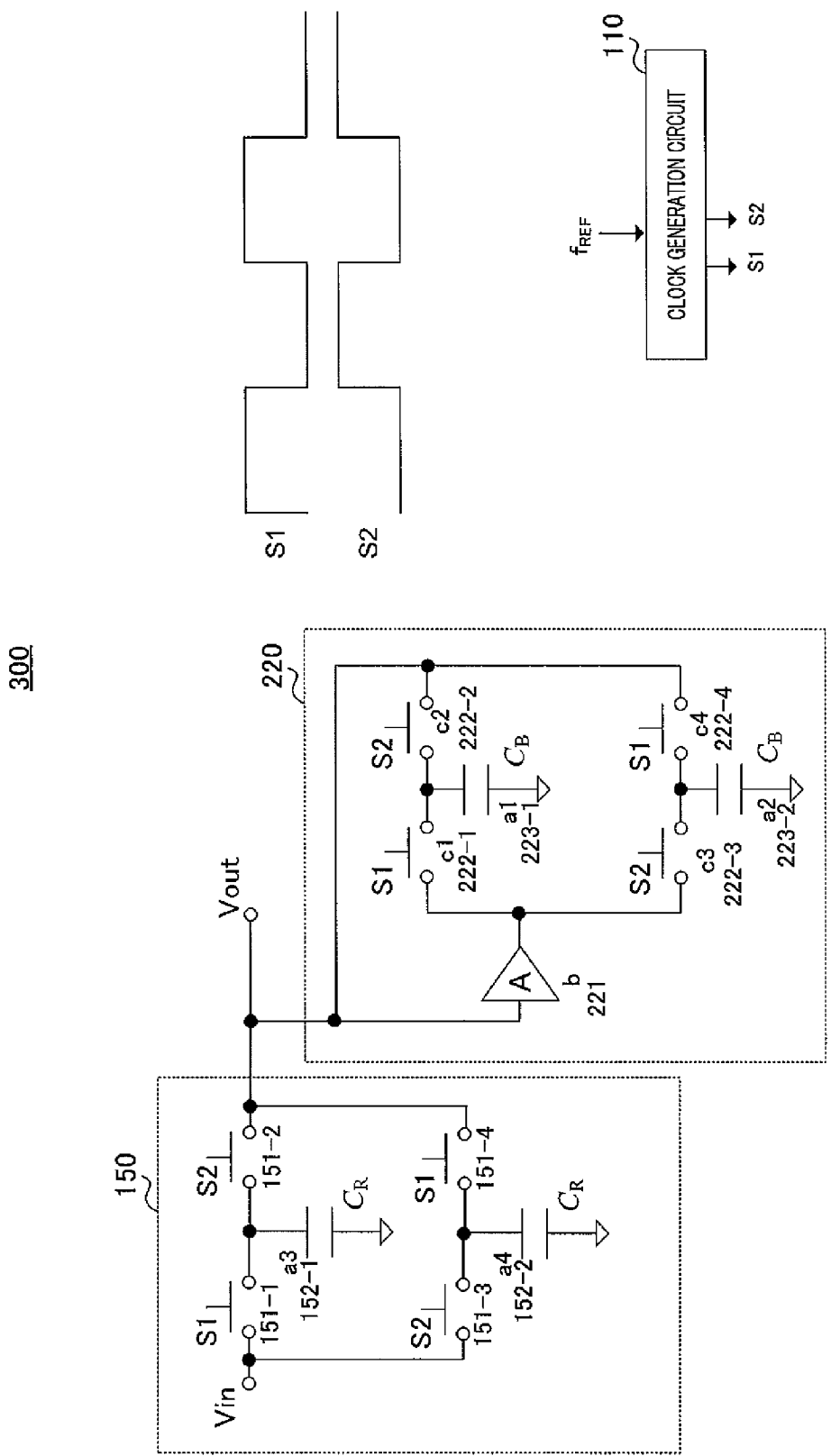
FIG. 12 shows still another configuration of the discrete-time analog circuit according to Embodiment 1.

FIG. 12 shows another key configuration of discrete-time analog circuit 13 according to the present embodiment. In FIG. 12, discrete-time analog circuit 300 forms a sampling filter. In discrete-time analog circuit 300 shown in FIG. 12, components common to those of discrete-time analog circuit 200 shown in FIG. 10 are assigned the same reference numerals as those in FIG. 10, and the descriptions thereof will be omitted. Discrete-time analog circuit 300 shown in FIG. 12 differs from discrete-time analog circuit 200 shown in FIG. 10 in that TA 120, sampling switch 130, CH 210, reset switch 160, and dump switch 170 are omitted.

Discrete-time analog circuit 300 includes coefficient circuit 220 disposed in a position downstream of rotating capacitor circuit 150 and is a downstream discrete-time analog circuit.

[Operation of Discrete-Time Analog Circuit 300]

Clock generation circuit 110 generates control signals S1 and S2 from reference frequency signal 24 produced by reference frequency oscillating section 14 and supplies the circuits with the control signals.

[1] Interval where S1 is High

In the interval where S1 is high, charge according to input potential Vin (or potential determined by charge sharing with an external charge holding section) is accumulated in CR 152-1 (a3).

On the other hand, the charge accumulated in CR 152-2 (a4) and the charge accumulated in CB 223-2 (a2) are shared. The shared charge is held in CR 152-2 (a4) and CB 223-2 (a2), and output potential Vout is determined.

At the same time, amplifier 221 (*b*) monitors output potential Vout, amplifies output potential Vout by a factor of A, and charges CB 223-1 (a1) with the amplified potential.

[2] Interval where S2 is High

In the interval where S2 is high, charge according to input potential Vin (or potential determined by charge sharing with an external charge holding section) is accumulated in CR 152-2 (a4).

On the other hand, the charge accumulated in CR 152-1 (a3) and the charge accumulated in CB 223-1 (a1) are shared. The shared charge is held in CR 152-1 (a3) and CB 223-1 (a1), and output potential Vout is determined.

At the same time, amplifier 221 (*b*) monitors output potential Vout, amplifies output potential Vout by a factor of A, and charges CB 223-2 (a2) with the amplified potential.

In [3] and thereafter, the operations in [1] and [2] are repeated.

The above operation is described by a difference equation as follows:

[9]

$$C_R v(n) + A C_B v_{out}(n-N) = (C_R + C_B) v_{out}(n) \quad \text{(Equation 9)}$$

Performing z transform on equation 9 and organizing the result derives a transfer function expressed as follows:

(Equation 10)

$$\frac{V_{out}}{V_{in}} = \frac{C_R/(C_R + C_B)}{1 - \{AC_B/(C_R + C_B)\}z^{-N}} \quad [10]$$

Equation 10 shows that the discrete-time analog circuit according to the present embodiment allows optional coefficients to be set by multiplying the coefficient of $z^{-N}$ in the denominator by a weighting value A.

Coefficient circuit 220 shown in FIG. 12 can alternatively be configured as an upstream sampling filter having a transfer function similar to that expressed by equation 10 when connected to $V_{in}$.

As described above, in the present embodiment, when the history capacitors or the buffer capacitors that form the sampling mixer are used as components of the coefficient circuit, the denominator of the transfer function can be provided with optional coefficients, as indicated by equations 5 and 8. Furthermore, in the present embodiment, when the buffer capacitors that form the sampling filter are used as components of the coefficient circuit, the denominator of the transfer function can be provided with optional coefficients, as indicated by equation 10.

An internal configuration and operation of coefficient circuits 140 and 220 shown in FIGS. 8 and 10 will next be described with reference to FIGS. 13 and 14.

Figure 13:
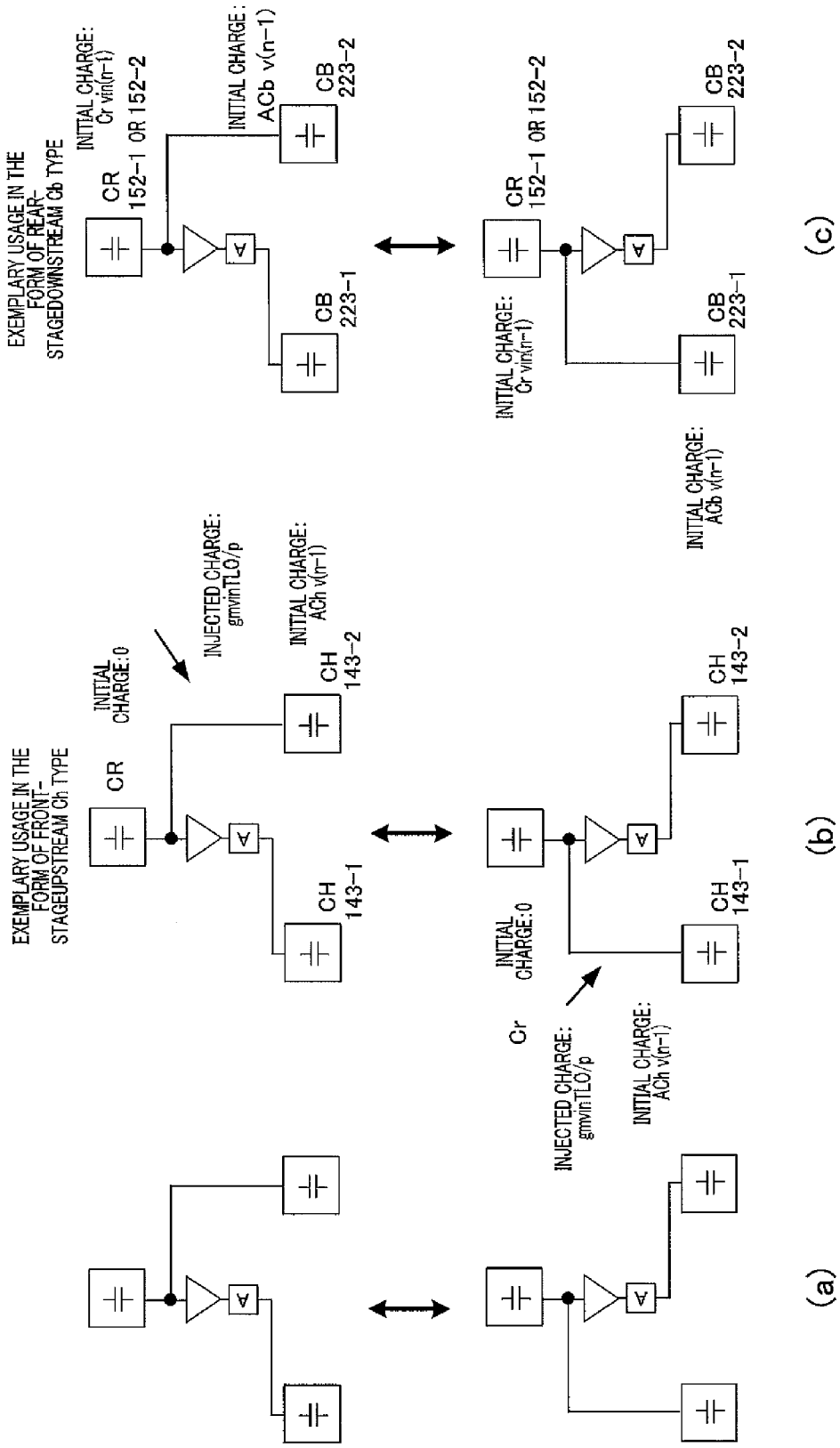
FIG. 13 describes operation of a coefficient circuit according to Embodiment 1.

FIG. 13 describes the operation of coefficient circuits 140 and 220.

FIG. 13(*b*) shows an example of how to use upstream coefficient circuit 140, and FIG. 13(*c*) shows an example of how to use downstream coefficient circuit 220. FIG. 13(*a*) shows operation common to upstream coefficient circuit 140 and downstream coefficient circuit 220.

In the case of the upstream type as shown in FIG. 13(*b*), the input charge and the charge held in CH 143-2 are shared. The shared charge is multiplied by A, and CH 143-1 is charged with the multiplied charge, as shown in FIG. 13(*b*). The sharing operation and the charging operation are alternately repeated.

On the other hand, in the case of the downstream type shown in FIG. 13(*c*), the charge held in CR 152-1 or 152-2 and the charge held in CB 223-2 are shared. The shared charge is multiplied by A, and CH 223-1 is charged with the multiplied charge. The sharing operation and the charging operation are alternately repeated.

In the above processes, the charge held in CH 143-1 or 143-2, or CB 223-1 or 223-2 is accumulated based on the potential produced 1 timing before the charge holding and multiplied by A.

The coefficient circuit in the present embodiment can thus provide the denominator of the transfer function with optional coefficients, as indicated by equations 5, 8, and 10.

Figure 14:
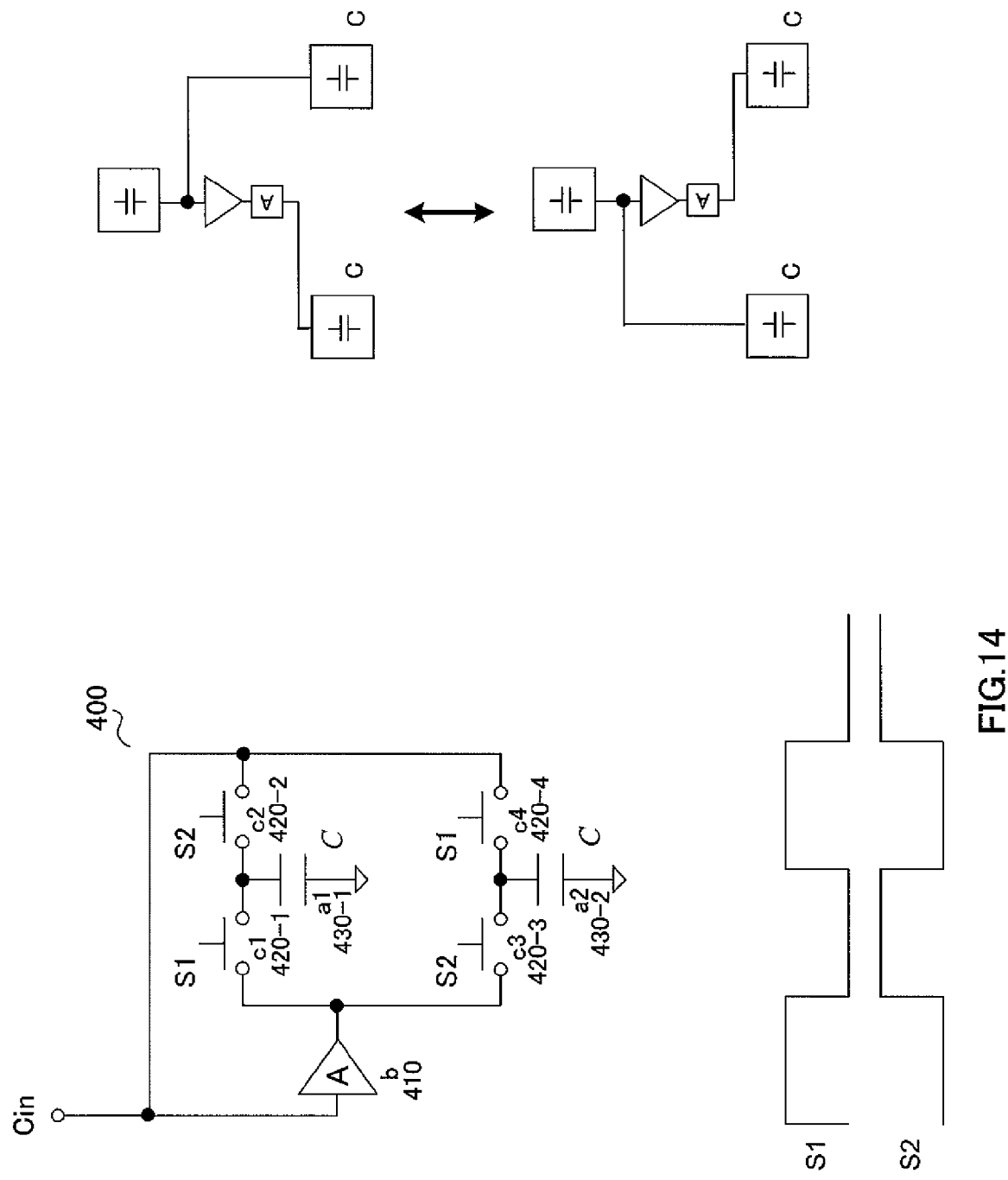
FIG. 14 shows a common configuration of the coefficient circuit according to Embodiment 1.

FIG. 14 shows a configuration common to coefficient circuits 140 and 220.

Coefficient circuit 400 includes capacitors 430-1 and 430-2 (a1, a2), amplifier 410 (*b*), and switches 420-1 to 420-4 (c1 to c4). Coefficient circuit 400 receives S1 and S2 as inputs from clock generation circuit 110.

[Operation of Coefficient Circuit 400]

Amplifier 410 (*b*) amplifies the potential at node Cin by a factor of A.

In the interval where S1 is high, switch 420-4(c4) and switch 420-1 (c1) are ON. As a result, capacitor 430-2 (a2) is connected to an external circuit at node Cin via switch 420-4 (c4). At the same time, charge corresponding to the potential amplified by amplifier 410 (*b*) by a factor of A is accumulated in capacitor 430-1 (a1) via switch 420-1 (c1).

In the interval where S2 is high, switch 420-2(c2) and switch 420-3 (c3) are ON. As a result, capacitor 430-1 (a1) is connected to the external circuit at node Cin via switch 420-2 (c2). At the same time, charge corresponding to the potential amplified by amplifier 410 (*b*) by a factor of A is accumulated in capacitor 430-2 (a2) via switch 420-3 (c3).

The operation described above is repeated.

Discrete-time analog circuit 100 shown in FIG. 8 relates to an example in which node Cin is alternately connected to CR 152-1 or 152-2 having an initial charge of zero. Discrete-time analog circuit 200 shown in FIG. 10 relates to an example in which node Cin is alternately connected to CR 152-1 or 152-2 having an initial charge CrVin(n−1). Discrete-time analog circuit 300 shown in FIG. 12 relates to an example in which node Cin is alternately connected to CR 152-1 or 152-2 having an initial charge CrVin(n−1). The initial charge in CR 152-1 or 152-2, to which node Cin is connected, differs between the upstream type and the downstream type.

In thus configured coefficient circuit 400, capacitor 430-1 (a1) functions as a charge holding section. When coefficient circuit 400 is used as upstream coefficient circuit 140, capacitors 430-1 and 430-2 (a1, a2) correspond to CHs 143-1 and 143-2. On the other hand, when coefficient circuit 400 is used as downstream coefficient circuit 220, capacitors 430-1 and 430-2 (a1, a2) correspond to CBs 223-1 and 223-2.

Furthermore, amplifier 410 (*b*) functions as a potential holding section in coefficient circuit 400. The switches and clock generation circuit 110 as a whole function as a circuit connection switching section and switch the connection between the rotating capacitor and capacitors 430-1, 430-2 (a1, a2) at timings 1 and 2.

The configurations shown in FIGS. 8 and 10 allow not only frequency conversion based on charge sampling but also filtering expressed by a transfer function whose denominator has a first-order term having optional coefficients. The configurations shown in FIGS. 8 and 10 differ from each other in that the denominator-type coefficient circuit is connected or not at the time of charge sampling for the frequency conversion, and it is believed that the difference affects noise and linearity.

Coefficient circuit 220 shown in FIG. 12 can similarly perform filtering expressed by a transfer function whose denominator has a first-order term having optional coefficients. Since the configuration shown in FIG. 12 includes no transconductance amplifier or sampling switch for performing charge sampling is present, coefficient circuit 220 can be used as a filter circuit.

As described above, in the present embodiment, providing the denominator of the transfer function with optional coefficients A increases the degree of freedom in designing a discrete-time analog circuit and achieves a broadband and steep filter characteristic.

In Patent Literature 1 and Non-Patent Literature 1, an FIR filter characteristic is achieved by providing a plurality of rotating capacitors to hold values sampled at different timings and simultaneously output the sampled values. Although the present embodiment and the following embodiments omit the configuration described above, the present embodiment and the following embodiments can employ a similar form.

Furthermore, in Patent Literature 1 and Non-Patent Literature 1, a feedback system precharges the rotating capacitors. Although the present embodiment and the following embodiments omit the configuration described above, the present embodiment and the following embodiments can employ a similar form.

Embodiment 2

Embodiment 1 has been described with reference to the case where the denominator of the transfer function of a discrete-time analog circuit is provided with first-order optional coefficients. The present embodiment will be described with reference to a case where the denominator of the transfer function of a discrete-time analog circuit is provided with second-order optional coefficients.

[Sampling Mixer (Upstream and Second-Order Type)]

Figure 15:
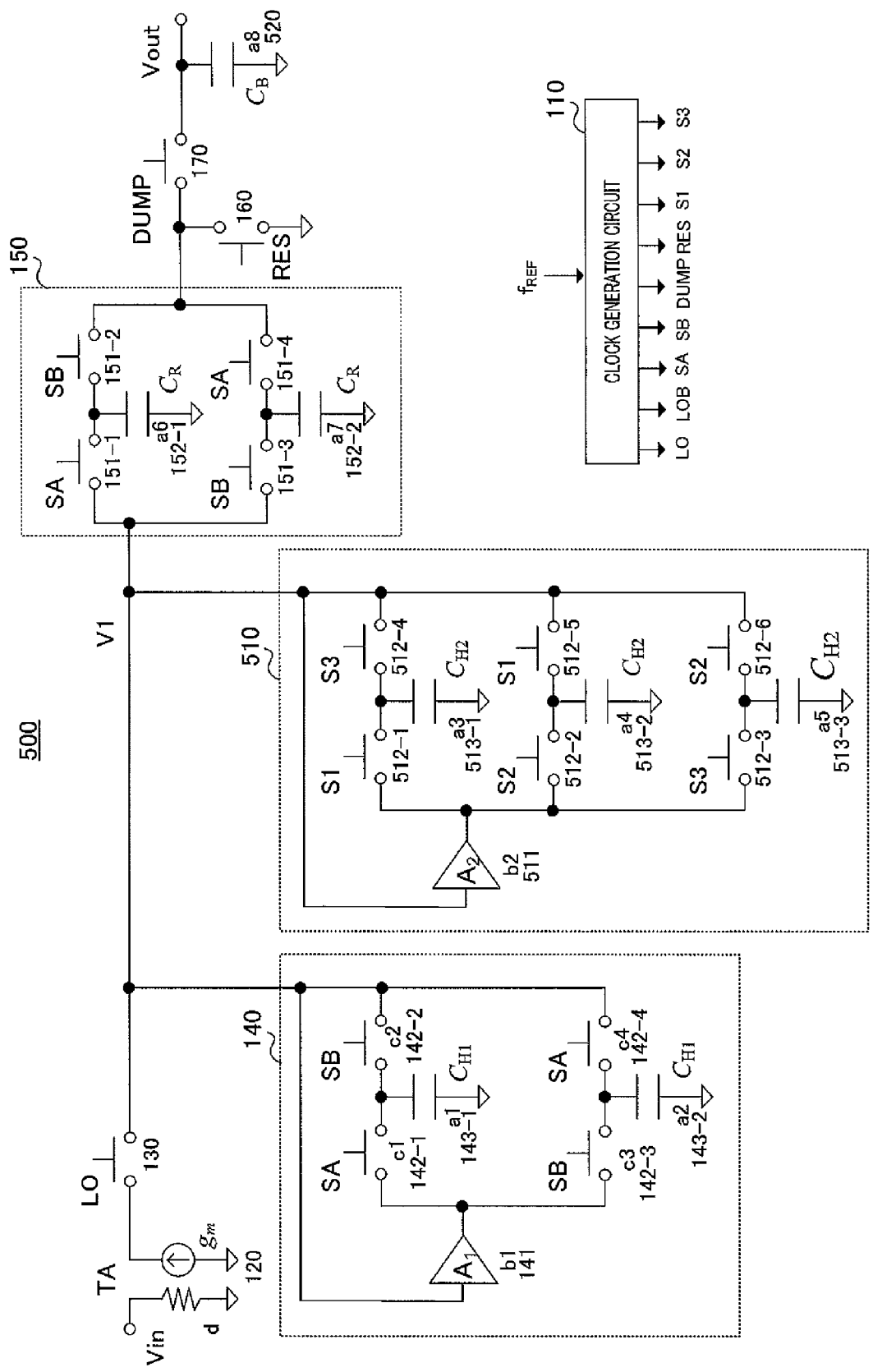
FIG. 15 is a configuration diagram of a discrete-time analog circuit according to Embodiment 2.

FIG. 15 is a block diagram showing an example of a key configuration of discrete-time analog circuit 13 according to the present embodiment. In FIG. 15, discrete-time analog circuit 500 corresponds to discrete-time analog circuit 13 shown in FIG. 7 and forms a sampling mixer having a transfer function whose denominator has second-order coefficients. In discrete-time analog circuit 500 shown in FIG. 15, components common to those of discrete-time analog circuit 100 shown in FIG. 8 are assigned the same reference numerals as those in FIG. 8, and the descriptions thereof will be omitted. Discrete-time analog circuit 500 shown in FIG. 15 differs from discrete-time analog circuit 100 shown in FIG. 8 in that coefficient circuit 510 and buffer capacitor 520 are added. As described above, discrete-time analog circuit 500 has a configuration in which coefficient circuit 140 and coefficient circuit 510 are disposed in positions upstream of rotating capacitor circuit 150. Discrete-time analog circuit 500 provides the denominator of the transfer function with a second-order polynomial by using the two coefficient circuits, which are coefficient circuits 140 and 510.

Coefficient circuit 510 includes amplifier 511 (b2), switches 512-1 to 512-6, and CHs (history capacitors) 513-1 to 513-3 (a3 to a5).

[Operation of Discrete-Time Analog Circuit 500]

Figure 16:
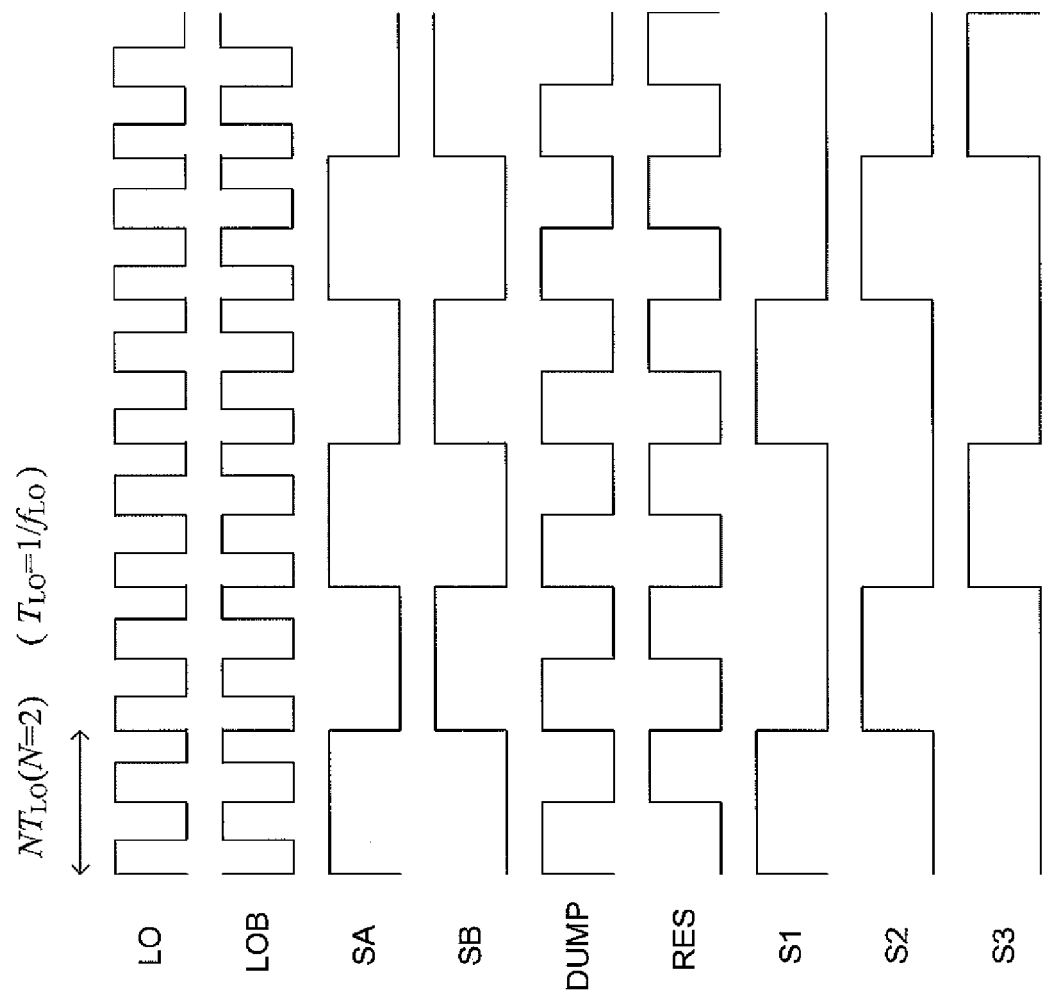
FIG. 16 shows clocks (i.e., control signals) provided from a clock generation circuit.

Clock generation circuit 110 generates control signals LO, SA, SB, DUMP, RES, S1, S2, and S3 shown in FIG. 16 from reference frequency signal 24 produced by reference frequency oscillating section 14 and supplies the switches with the control signals.

TA 120 receives analog RF signal 23 amplified by low noise amplifier 12 as an input voltage signal and converts the voltage signal into a current (gm×Vin).

Coefficient circuit 140 operates in the same manner as in Embodiment 1, and the description thereof will therefore be omitted. The operation of coefficient circuit 510 will be primarily described below.

[1] Interval where S1 is High

In the interval where LO is high, the input current (gm× Vin) is accumulated as charge (input charge) in CH 143-1 (a1) or CH 143-2 (a2), CR 152-1 (a6) or CR 152-2 (a7), and CH 513-2 (a4). In the interval where S1 is high, the charge held in CH 143-1 (a1) or CH 143-2 (a2), the charge held in CH 513-2 (a4), and the input charge described above are shared. The shared charge is thus held in CH 143-1 (a1) or CH 143-2 (a2), CH 513-2 (a4), and CR 152-1 (a6) or CR 152-2 (a7), and potential V1 is determined.

The charge sampling allows discrete-time analog circuit 500 to perform frequency conversion at the same time, and the RF signal is converted into an IF signal or BB signal.

At the same time, amplifier 141 (b1) amplifies potential V1 by a factor of A1 and charges one of CH 143-1 (a1) and CH 143-2 (a2) that does not share charge with CH 513-2 (a4), with the amplified potential. On the other hand, amplifier 511 (b2) monitors potential V1, amplifies potential V1 by a factor of A2, and charges CH 513-1 (a3) with the amplified potential.

On the other hand, in the interval where DUMP is high, the charge held in one of CR 152-1 (a6) and CR 152-2 (a7) that does not share charge with CH 513-2 (a4), and the charge held in CB 520 (a8) are shared. The shared charge is held in one of CR 152-1 (a6) and CR 152-2 (a7) that does not share charge with CH 513-2 (a4), and in CB 520 (a8), and output potential Vout is determined. Output potential Vout is outputted as baseband signal 25. In the interval where RES is high, DUMP is low and the charge in one of CR 152-1 (a6) and CR 152-2 (a7) that does not share charge with CH 513-2 (a4) is grounded and reset.

[2] Interval where S2 is High

In the interval where LO is high, the input current is accumulated as charge (input charge) in CH 143-1 (a1) or CH 143-2 (a2), CR 152-1 (a6) or CR 152-2 (a7), and CH 513-3 (a5). In the interval where S2 is high, the charge held in CH 143-1 (a1) or CH 143-2 (a2), the charge held in CH 513-3 (a5), and the input charge described above are shared. The shared charge is thus held in CH 143-1 (a1) or CH 143-2 (a2), CH 513-3 (a5), and CR 152-1 (a6) or CR 152-2 (a7), and potential V1 is determined.

At the same time, amplifier 141 (b1) monitors potential V1, amplifies potential V1 by a factor of A1, and charges one of CH 143-1 (a1) and CH 143-2 (a2) that does not share charge with CH 513-3 (a5), with the amplified potential. Amplifier 511 (b2) monitors potential V1, amplifies potential V1 by a factor of A2, and charges CH 513-2 (a4) with the amplified potential.

On the other hand, in the interval where DUMP is high, the charge held in one of CR 152-1 (a6) and CR 152-2 (a7) that does not share charge with CH 513-3 (a5), and the charge held in CB 520 (a8) are shared. The shared charge is held in one of CR 152-1 (a6) and CR 152-2 (a7) that does not share charge with CH 513-3 (a5), and in CB 520(a8), and output potential Vout is determined. In the interval where RES is high, DUMP is low and the charge in one of CR 152-1 (a6) and CR 152-2 (a7) that does not share charge with CH 513-3 (a5) is grounded and reset.

[3] Interval where S3 is High

In the interval where LO is high, the input current is accumulated as charge (i.e., input charge) in CH 143-1 (a1) or CH 143-2 (a2), CR 152-1 (a6) or CR 152-2 (a7), and CH 513-1 (a3). In the interval where S3 is high, the charge held in CH 143-1 (a1) or CH 143-2 (a2), the charge held in CH 513-1 (a3), and the input charge described above are shared. The shared charge is held in CH 143-1 (a1) or CH 143-2 (a2), CH 513-1 (a3), and CR 152-1 (a6) or CR 152-2 (a7), and potential V1 is determined.

At the same time, amplifier 141 (b1) monitors potential V1, amplifies potential V1 by a factor of A1, and charges one of CH 143-1 (a1) and CH 143-2 (a2) that does not share charge with CH 513-1 (a3), with the amplified potential. Amplifier 511 (b2) monitors potential V1, amplifies potential V1 by a factor of A2, and charges CH 513-3 (a5) with the amplified potential.

On the other hand, in the interval where DUMP is high, the charge held in one of CR 152-1 (a6) and CR 152-2 (a7) that does not share charge with CH 513-1 (a3), and the charge held in CB 520 (a8) are shared. The shared charge is held in one of CR 152-1 (a6) and CR 152-2 (a7) that does not share charge with CH 513-1 (a3), and in CB 520 (a8), and output potential Vout is determined. In the interval where RES is high, DUMP is low and the charge held in one of CR 152-1 (a6) and CR 152-2 (a7) that does not share charge with CH 513-1 (a3) is grounded and reset.

In [4] and thereafter, the operations in [1], [2], and [3] are repeated.

As described above, the discrete-time analog circuit according to the present embodiment is provided with a timing for the discrete-time analog circuit to wait for 1 timing before the charge weighted by amplifier 511 (b2) and held is shared, thus providing the denominator of the transfer function with a second-order term.

The above operation is described by a difference equation as follows:

[11]

$$q_{in}(n) + A_1 C_{H1} v_1(n-N) + A_2 C_{H2} v_1(n-2N) = (C_R + C_{H1} + C_{H2}) v_1(n) \quad \text{(Equation 11)}$$

In equation 11, the first term on the left side corresponds to the input charge, and the second term is the charge held in CH1 based on the potential determined by charge sharing performed 1 timing before the charge inputting and multiplied by A1. Furthermore, in equation 11, the third term on the left side is the charge held in CH2 based on the potential determined by charge sharing performed two timings before the charge inputting and multiplied by A2.

[12]

$$C_R v_1(n) + C_B v_{out}(n-N) = (C_R + C_B) v_{out}(n) \quad \text{(Equation 12)}$$

Performing z transform on equations 11 and 12 and organizing the results derives a transfer function expressed by equation 13 as follows:

(Equation 13)

$$\frac{V_{out}}{V_{in}} = \frac{g_m T_{LO}}{\pi} \cdot \frac{1 - z^{-N}}{1 - z^{-1}} \cdot T_{IIR} \cdot \frac{C_R / (C_R + C_B)}{1 - \{C_B / (C_R + C_B)\} z^{-N}} \quad [13]$$

(Equation 14)

$$T_{IIR} = \frac{1/(C_R + C_{H1} + C_{H2})}{1 - \{A_1 C_{H1} / (C_R + C_{H1} + C_{H2})\} z^{-N} + \{A_2 C_{H2} / (C_R + C_{H1} + C_{H2})\} z^{-2N}} \quad [14]$$

The discrete-time analog circuit according to the present embodiment provides the denominator of the transfer function with a second-order polynomial having optional coefficients, as indicated by equations 13 and 14.

Discrete-time analog circuit 500 described above is an example of the upstream type using history capacitors as components of the coefficient circuit. Downstream discrete-time analog circuit 200 using buffer capacitors as components of the coefficient circuit can provide the denominator of the transfer function with a second-order term, as in discrete-time analog circuit 500.

Next, a description will be given of a configuration that provides the denominator of the transfer function of a downstream discrete-time analog circuit with a second-order term.

[Exemplary Use of Downstream Type in Sampling Mixer, and Extension to Second-Order (Downstream Cb Denominator Type)]

Figure 17:
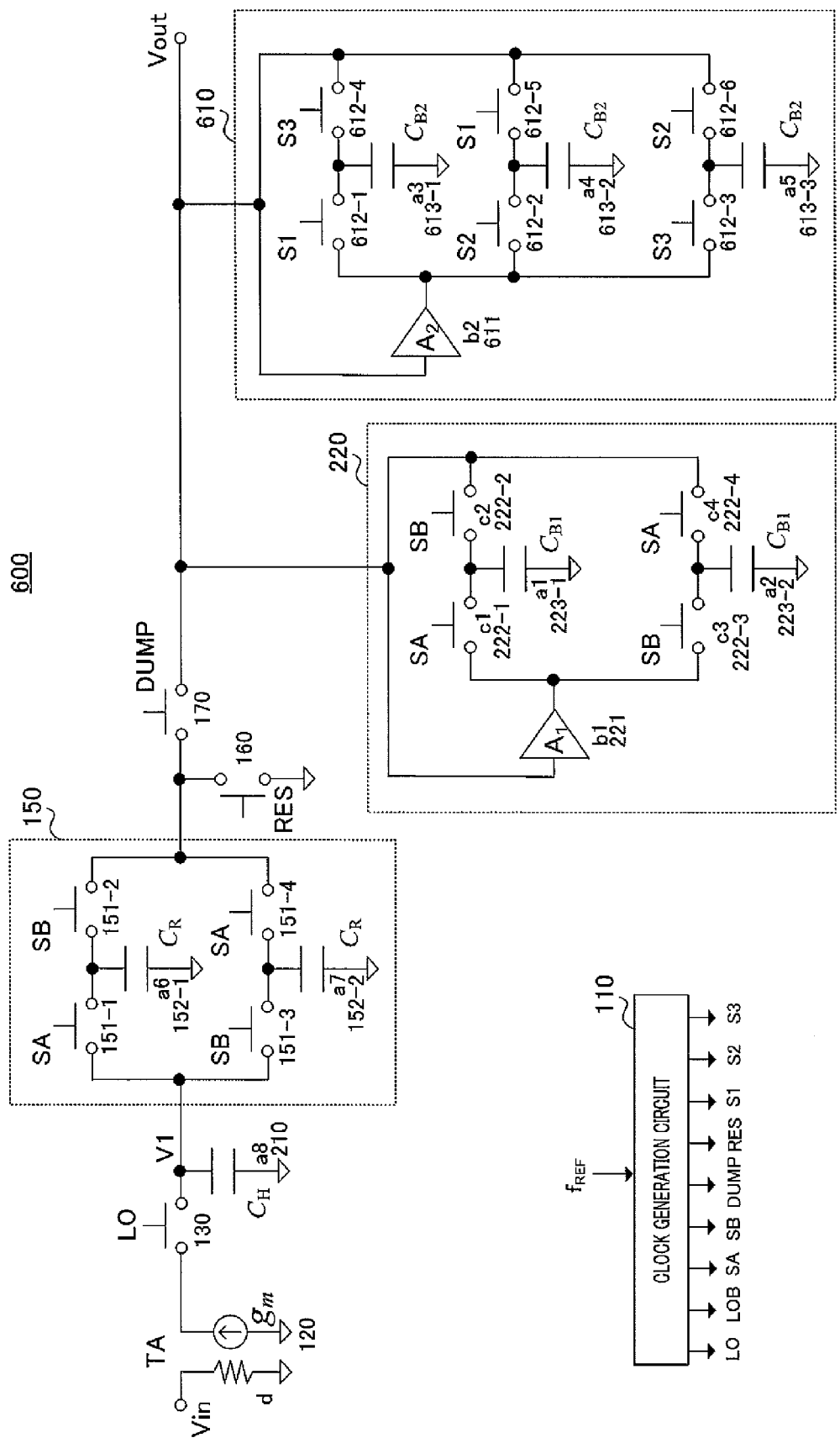
FIG. 17 shows another configuration of the discrete-time analog circuit according to Embodiment 2.

FIG. 17 is a block diagram showing an example of another key configuration of discrete-time analog circuit 13 according to the present embodiment. In FIG. 17, discrete-time analog circuit 600 corresponds to discrete-time analog circuit 13 shown in FIG. 7 and forms a sampling mixer having a transfer function whose denominator has second-order coefficients. In discrete-time analog circuit 600 shown in FIG. 17, components common to those of discrete-time analog circuit 200 shown in FIG. 10 are assigned the same reference numerals as those in FIG. 10, and the descriptions thereof will be omitted. Discrete-time analog circuit 600 shown in FIG. 17 differs from discrete-time analog circuit 200 shown in FIG. 10 in that coefficient circuit 610 is added. More specifically, discrete-time analog circuit 600 has a configuration in which coefficient circuit 220 and coefficient circuit 610 are disposed in positions downstream of rotating capacitor circuit 150. Discrete-time analog circuit 600 provides the denominator of the transfer function with a second-order polynomial by using the two coefficient circuits, which are coefficient circuits 220 and 610.

Coefficient circuit 610 includes amplifier 611 (b2), switches 612-1 to 612-6, and buffer capacitors (CBs) 613-1 to 613-3 (a3 to a5).

[Operation of Discrete-Time Analog Circuit 600]

Clock generation circuit 110 generates control signals LO, SA, SB, S1, S2, S3, RES, and DUMP from reference frequency signal 24 produced by reference frequency oscillating section 14 and supplies the circuits with the control signals.

TA 120 receives analog RF signal 23 amplified by low noise amplifier 12 as an input voltage signal and converts the voltage signal into a current (gm×Vin).

Coefficient circuit 220 operates in the same manner as in Embodiment 1, and the description thereof will be omitted. The operation of coefficient circuit 610 will be primarily described below.

[1] Interval where S1 is High

In the interval where LO is high, the input current (gm×Vin) is accumulated as charge (i.e., input charge) in CR 152-1 (a6) or CR 152-2 (a7) and CH 210 (a8). In the interval where S1 is high, the charge held in CR 152-1 (a6) or CR 152-2 (a7), the charge held in CH 210 (a8), and the input charge described above are shared. The shared charge is held in CR 152-1 (a6) or CR 152-2 (a7) and CH 210 (a8), and potential V1 is determined.

The charge sampling allows discrete-time analog circuit 600 to perform frequency conversion at the same time, and the RF signal is converted into an IF signal or BB signal.

On the other hand, in the interval where DUMP is high, one of CR 152-1 (a6) and CR 152-2 (a7) that does not share charge with CH 210 (a8) shares charge with the following buffer capacitor (CB). The charge held in the capacitor that does not share charge with CH 210 (a8), the charge held in CB 223-1 (a1) or CB 223-2 (a2) (after multiplication by A1), and the charge held in CB 613-2 (a4) (after multiplication by A2) are shared. The shared charge is held in one of CR 152-1 (a6) and CR 152-2 (a7) that does not share charge with CH 210 (a8), in CB 613-2 (a4), and in CB 223-1 (a1) or CB 223-2 (a2). Output potential Vout is thus determined.

At the same time, amplifier 221 (b1) monitors output potential Vout, amplifies output potential Vout by a factor of A1, and charges one of CB 223-1 (a1) and CB 223-2 (a2) that does not share charge with CB 613-2 (a4), with the amplified potential. Amplifier 611 (b2) monitors output potential Vout, amplifies output potential Vout by a factor of A2, and charges CB 613-1 (a3) with the amplified potential. Output potential Vout is outputted as baseband signal 25.

In the interval where RES is high, DUMP is low and the charge held in one of CR 152-1 (a6) and CR 152-2 (a7) that does not share charge with CH 210 (a8), is grounded and reset.

[2] Interval where S2 is High

In the interval where LO is high, the input current (gm× Vin) is accumulated as charge (i.e., input charge) in CR 152-1 (a6) or CR 152-2 (a7) and CH 210 (a8). In the interval where S2 is high, the charge held in CR 152-1 (a6) or CR 152-2 (a7), the charge held in CH 210 (a8), and the input charge described above are shared. The shared charge is then held in CR 152-1 (a6) or CR 152-2 (a7) and CH 210 (a8), and potential V1 is determined.

On the other hand, in the interval where DUMP is high, one of CR 152-1 (a6) and CR 152-2 (a7) that does not share charge with CH 210 (a8) shares charge with the following buffer capacitor (CB). The charge held in the capacitor that does not share charge with CH 210 (a8), the charge held in CB 223-1 (a1) or CB 223-2 (a2) (after multiplication by A1), and the charge held in CB 613-3 (a5) (after multiplication by A2) are shared. The shared charge is held in one of CR 152-1 (a6) and CR 152-2 (a7) that does not share charge with CH 210 (a8), in CB 613-3 (a5), and in CB 223-1 (a1) or CB 223-2 (a2). Output potential Vout is thus determined. At the same time, amplifier 221 (b1) monitors output potential Vout, amplifies output potential Vout by a factor of A1, and charges one of CB 223-1 (a1) and CB 223-2 (a2) that does not share charge with CB 613-3 (a5), with the amplified potential. Amplifier 611 (b2) monitors output potential Vout, amplifies output potential Vout by a factor of A2, and charges CB 613-2 (a4) with the amplified potential.

In the interval where RES is high, DUMP is low and the charge held in one of CR 152-1 (a6) and CR 152-2 (a7) that does not share charge with CH 210 (a8) is grounded and reset.

[3] Interval where S3 is High

In the interval where LO is high, the input current (gm× Vin) is accumulated as charge (i.e., input charge) in CR 152-1 (a6) or CR 152-2 (a7) and CH 210 (a8). In the interval where S3 is high, the charge held in CR 152-1(a6) or CR 152-2 (a7), the charge held in CH 210 (a8), and the input charge described above are shared. The shared charge is held in CR 152-1 (a6) or CR 152-2 (a7) and CH 210 (a8), and potential V1 is determined.

On the other hand, in the interval where DUMP is high, one of CR 152-1 (a6) and CR 152-2 (a7) that does not share charge with CH 210 (a8) shares charge with the following buffer capacitor (CB). The charge held in the capacitor that does not share charge with CH 210 (a8), the charge held in CB 223-1 (a1) or CB 223-2 (a2) (after multiplication by A1), and the charge held in CB 613-1 (a3) (after multiplication by A2) are shared. The shared charge is held in one of CR 152-1 (a6) and CR 152-2 (a7) that does not share charge with CH 210 (a8), in CB 613-1 (a3), and in CB 223-1 (a1) or CB 223-2 (a2). Output potential Vout is thus determined.

At the same time, amplifier 221 (b1) monitors output potential Vout, amplifies output potential Vout by a factor of A1, and charges one of CB 223-1 (a1) and CB 223-2 (a2) that does not share charge with CB 613-1 (a3), with the amplified potential. Amplifier 611 (b2) monitors output potential Vout, amplifies output potential Vout by a factor of A2, and charges CB 613-3 (a5) with the amplified potential.

In the interval where RES is high, DUMP is low and the charge held in one of CR 152-1 (a6) and CR 152-2 (a7) that does not share charge with CH 210 (a8) is grounded and reset.

In [4] and thereafter, the operations in [1], [2], and [3] are repeated.

The discrete-time analog circuit according to the present embodiment is provided with a timing for the discrete-time analog circuit to wait for 1 timing before the charge weighted by amplifier 611 (b2) and held is shared, thereby providing the denominator of the transfer function with a second-order term.

The above operation is described by a difference equation as follows:

[15]

$$q_{in}(n)+C_H v_1(n-N)=(C_R+C_H)v_1(n) \qquad \text{(Equation 15)}$$

[16]

$$C_R v_1(n)+A_1 C_{B1} v_{out}(n-N)+A_2 C_{B2} v_{out}(n-N)=(C_R+C_{B1}+C_{B2})v_{out}(n) \qquad \text{(Equation 16)}$$

Performing z transform on equation 16 and organizing the result derives a transfer function expressed by the following equation:

(Equation 17)

$$\frac{V_{out}}{V_{in}} = \frac{g_m T_{LO}}{\pi} \cdot \frac{1-z^{-N}}{1-z^{-1}} \cdot \frac{1/(C_R+C_H)}{1-\{C_H/(C_R+C_H)\}z^{-N}} T_{IIR} \qquad [17]$$

(Equation 18)

$$T_{IIR} = \frac{C_R/(C_R+C_{B1}+C_{B2})}{1-\{A_1 C_{B1}/(C_R+C_{B1}+C_{B2})\}z^{-N} + \{A_2 C_{B2}/(C_R+C_{B1}+C_{B2})\}z^{-2N}} \qquad [18]$$

The discrete-time analog circuit according to the present embodiment provides the denominator of transfer function $T_{IIR}$ with a second-order polynomial having optional coefficients, as indicated by equations 17 and 18.

The effectiveness of the present embodiment will be described next by comparing a calculation result with a simulation result in the discrete-time analog circuit according to the present embodiment on the Chebyshev characteristic.

[Design Approach for Achieving Chebyshev Characteristic]

When a transfer function whose denominator has a second-order polynomial in the s region (which is capable of achieving Butterworth characteristic or Chebyshev characteristic) is transformed by bilinear transform into a transfer function in the z region, the transfer function is expressed as follows:

(Equation 19)

$$T_1 = K \frac{1+2z^{-1}+z^{-2}}{1+a_1 z^{-1}+a_2 z^{-2}} \qquad [19]$$

An example of coefficients that achieve a second-order Chebyshev characteristic is as follows: a1=−1.9547; a2=0.9562; and K=3.658×10^(−4).

The present embodiment can provide an optional second-order denominator polynomial. Accordingly, in the present embodiment, the gain of equation 19 is normalized to one, and the coefficient of the denominator of the resultant equation, which only has a denominator, is compared with equation 18. Based on the comparison result, the transconductance gm of TA 120 and the value of each capacitor are set as follows, for example:

gm=3.6506 mS,CR=1.18494 pF,CB1=19.395 pF,and
CB2=9.4204 pF

It is assumed in the process described above that the gains of amplifiers 221 and 611 (b2), each of which forms a potential holding section, are set at A1=3 and A2=−3, respectively.

Figure 18:
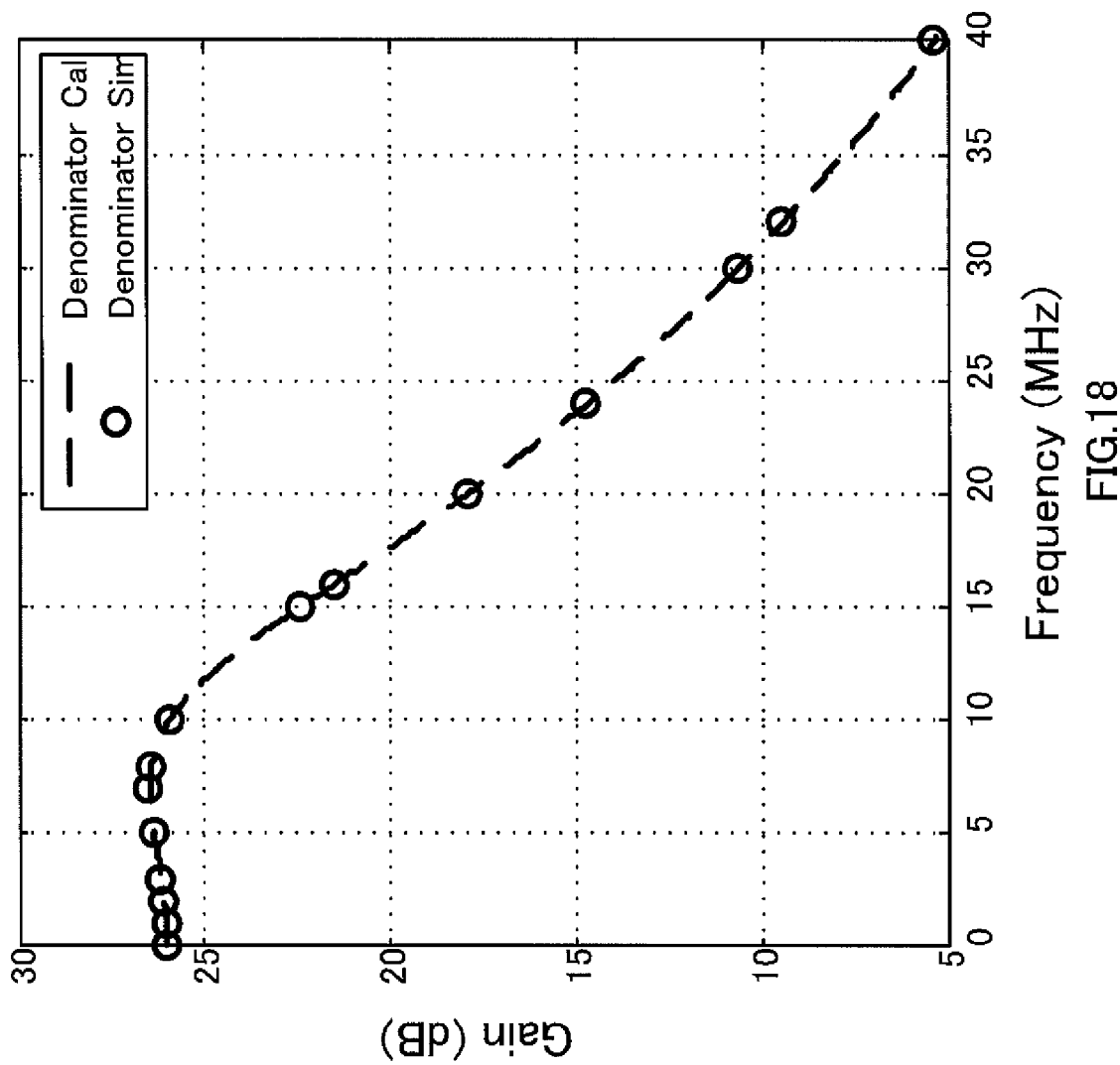
FIG. 18 is a characteristic diagram showing an example of a filter characteristic based on a calculation result and a simulation result.

FIG. 18 shows a calculation result (denominator Cal) of a numerator constant (which is set so that DC gain is 26 dB in differential operation) in equation 19 having coefficients that provide the Chebyshev characteristic. FIG. 18 also shows a simulation result (i.e., denominator Sim) based on simulation program with integrated circuit emphasis (SPICE). The horizontal axis of FIG. 18 represents frequency after frequency conversion. DC (0 Hz) in FIG. 18 corresponds to frequency LO. It is noted that the calculation and the simulation were conducted with an assumption that frequency LO was 1.5 GHz. The simulation was also conducted using ideal TA 120, switches, and capacitors in the configuration of discrete-time analog circuit 600 shown in FIG. 17. Furthermore, the values of the history capacitors and the rotating capacitors were equal to each other so that a ripple due to the Chebyshev characteristic clearly appears.

As seen from FIG. 18, the evaluation result shows that the calculation result well agrees with the simulation result, and that discrete-time analog circuit 600 operates as intended, by employing the configuration shown in FIG. 17.

As described above, the discrete-time analog circuit according to the present embodiment can provide the denominator of the transfer function of the discrete-time analog circuit with a polynomial having second-order optional coefficients. In the present embodiment, a broadband and steep characteristic can be provided by fitting the coefficients of the polynomial with the Butterworth characteristic or the Chebyshev characteristic.

The configurations shown in FIGS. 15 and 17 allow not only frequency conversion based on charge sampling but also filtering expressed by a transfer function whose denominator is formed of a second-order polynomial having optional coefficients. The configurations shown in FIGS. 15 and 17 differ from each other in that the denominator-type coefficient circuit is connected or not at the time of charge sampling for the frequency conversion, and it is believed that the difference affects noise and linearity.

As described above, the discrete-time analog circuit according to the present embodiment allows frequency conversion and filtering expressed by a transfer function whose denominator is formed of a second-order polynomial having optional coefficients.

Embodiment 3

Embodiment 2 has been described with reference to a discrete-time analog circuit capable of providing the denominator of the transfer function with a polynomial having second-order optional coefficients. The present embodiment will be described with reference to a discrete-time analog circuit that allows the order to be extended to an n-th order and provides the denominator of the transfer function with a polynomial having n-th-order optional coefficients.

Figure 19:
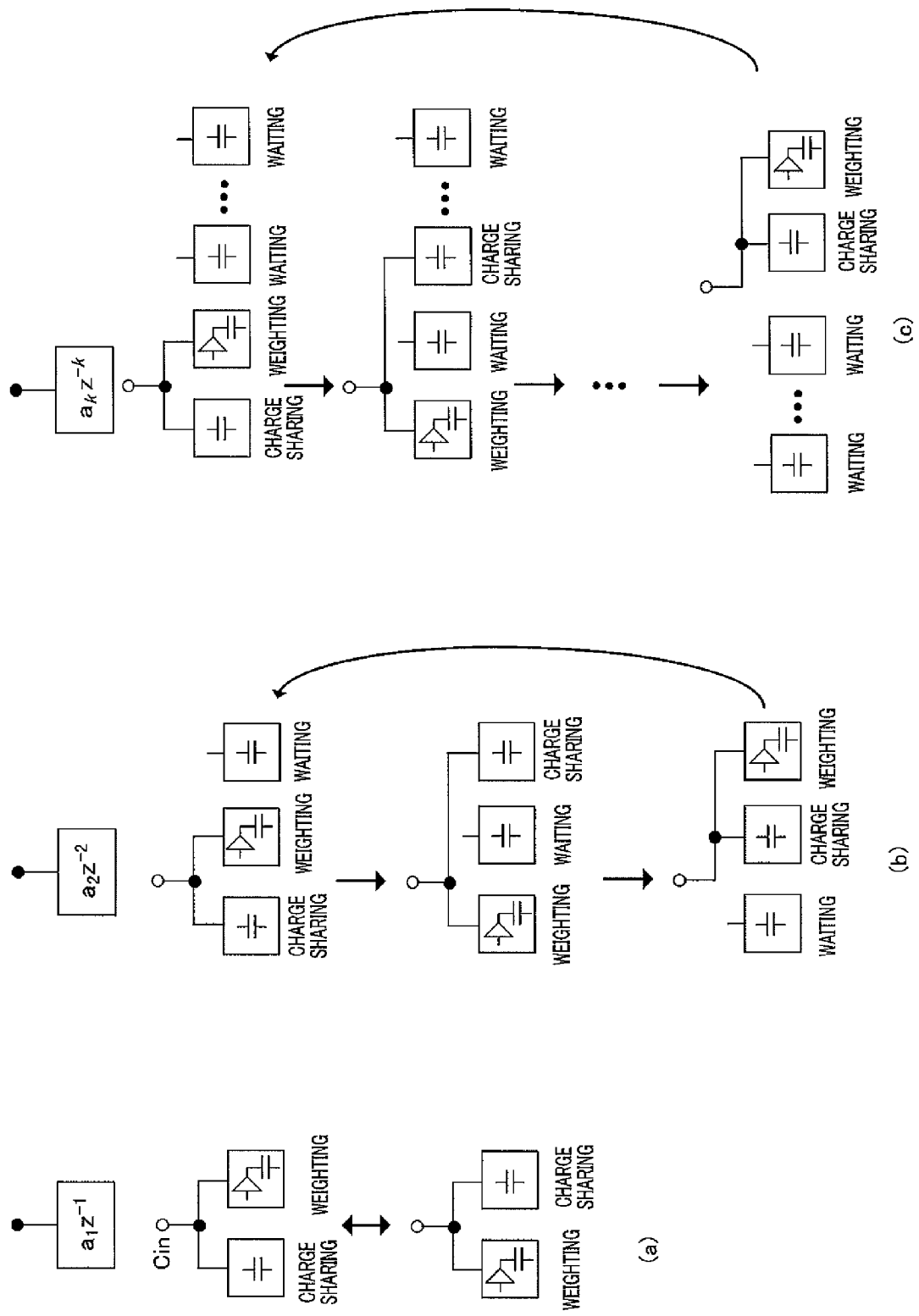
FIG. 19 shows a principle of the operation of a coefficient circuit according to Embodiment 3.

FIG. 19 describes a procedure of allowing a coefficient circuit to have a higher order configuration. FIG. 19(*a*) shows a first-order configuration. In the procedure of achieving the first-order configuration, a timing at which charge is held and weighted by a factor of A and a timing at which the charge is shared are alternately repeated. Since a difference equation that expresses the charge sharing has a term v(n−1), a first-order term can be provided.

FIG. 19(*b*) shows a second-order configuration. In the procedure of achieving the second-order configuration, a "wait" timing is provided between the charge holding and A-times weighting timing and the charge sharing timing. Since a difference equation that expresses the charge sharing thus has a term v(n−2), a second-order term can be provided.

FIG. 19(*c*) shows a k-th-order configuration. In the procedure of achieving the k-th-order configuration, (k+1) capacitors are provided in a coefficient circuit, and (k−1) "wait" timings are provided between the charge holding and A-times weighting timing and the charge sharing timing. A difference equation that expresses the charge sharing thus has a term v(n−k), whereby a k-th-order term can be provided.

Figure 20:
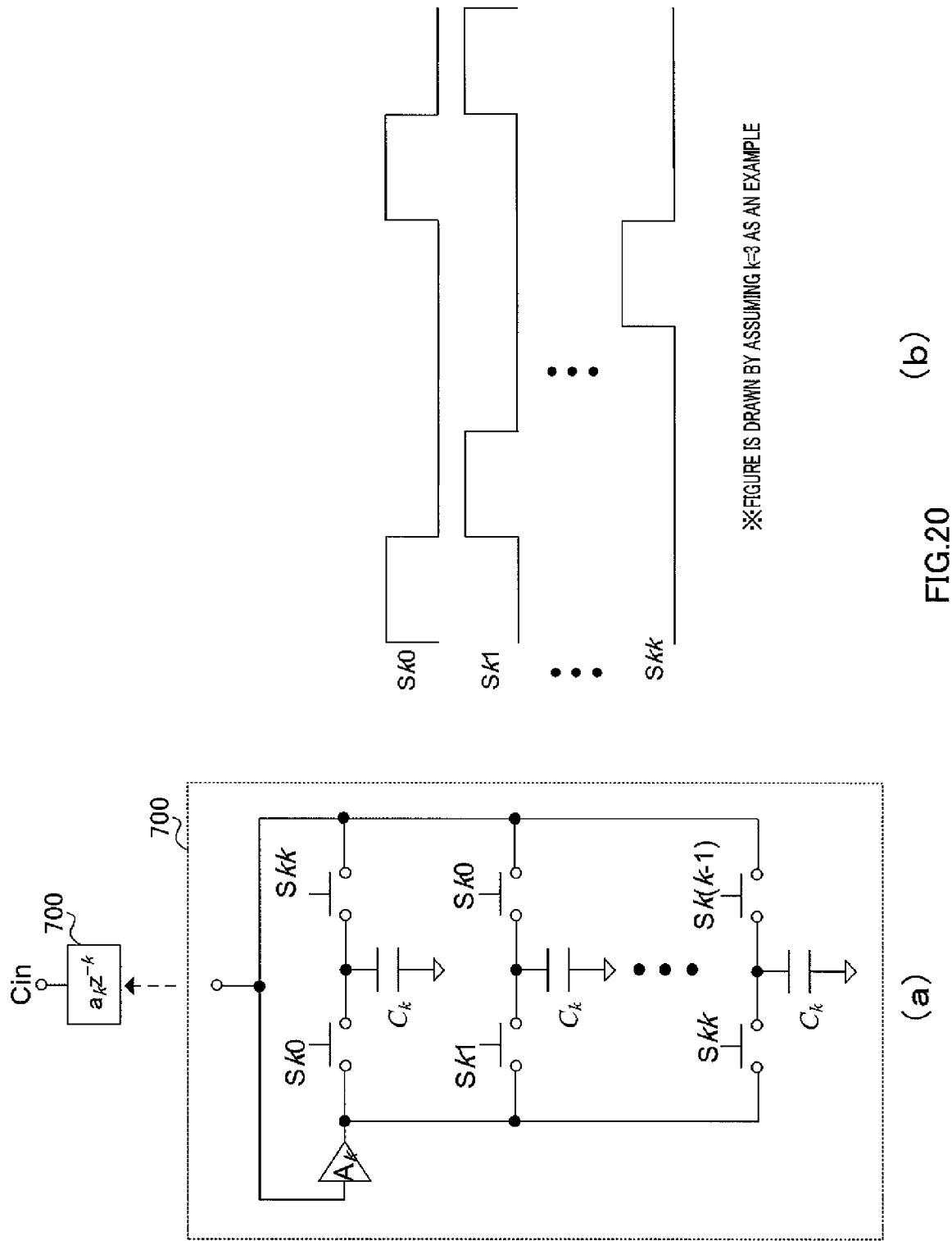
FIG. 20 shows a specific configuration of the coefficient circuit according to Embodiment 3.

FIG. 20(*a*) shows a circuit configuration of coefficient circuit 700 having a configuration extended to a k-th order. Coefficient circuit 700 includes (k+1) capacitors and 2×(k+1) switches. FIG. 20(*b*) is a timing chart of Sk0 to Skk inputted to the switches in coefficient circuit 700.

Coefficient circuit 700, to which the clocks labeled with Sk0 to Skk are inputted, operates in such a way that a first capacitor at an i-th timing is a second capacitor at an (i+n−1)-th timing. Furthermore, coefficient circuit 700 operates in such a way that the second capacitor at the i-th timing is the first capacitor at an (i+1)-th timing. Coefficient circuit 700 can thus provide a k-th-order term. Moreover, coefficient circuit 700 can set an optional-value coefficient by multiplying a potential by A before the potential is held.

In coefficient circuit 700 shown in FIG. 20(*a*), in which all the capacitors have a single value Ck, the values Ck of the capacitors can be individually changed to appropriate values. The degree of freedom in designing a filter is increased this way as well.

A description will next be given of an example in which the configuration of discrete-time analog circuit 500 shown in FIG. 15 is extended to an n-th-order configuration.

Figure 21:
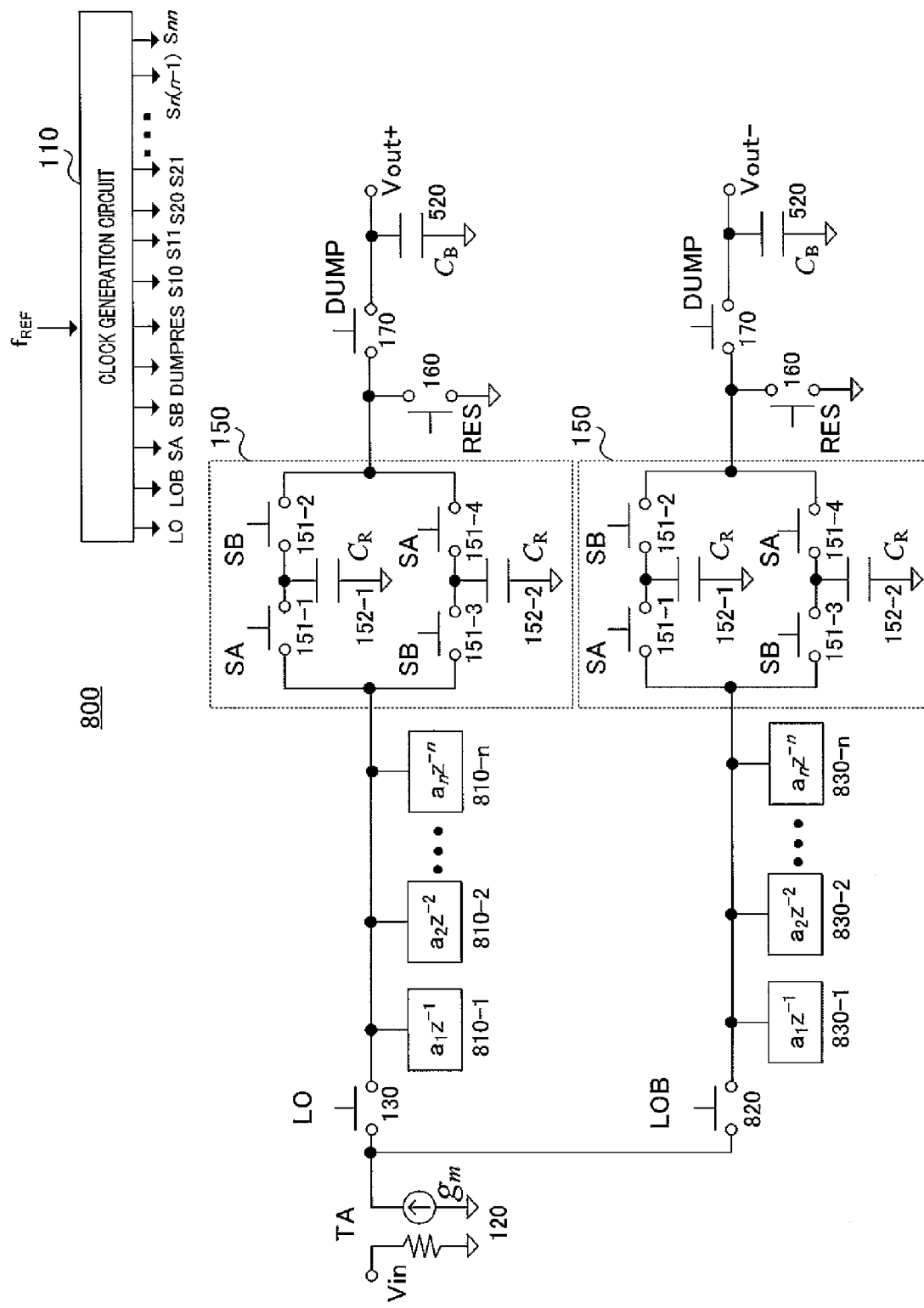
FIG. 21 shows a configuration of the discrete-time analog circuit according to Embodiment 3.

FIG. 21 shows the case where the configuration of discrete-time analog circuit 500 shown in FIG. 15 is extended to an n-th-order configuration. In FIG. 21, coefficient circuits 810-*k* and coefficient circuits 830-*k* (where k=1 to n) provide the denominator of the transfer function of discrete-time analog circuit 800 with a k-th-order term.

Discrete-time analog circuit 800 shown in FIG. 21 has not only a system connected to sampling switch 130 but also a system connected to sampling switch 820, which form a differential configuration. Sampling switch 130 receives LO as an input, and sampling switch 820 receives LOB as an input. LOB is a signal having a phase shifted by 180 degrees from the phase of LO, and the system connected to sampling switch 820, to which LOB is inputted, therefore operates as a differential system having an opposite phase.

Figure 22:
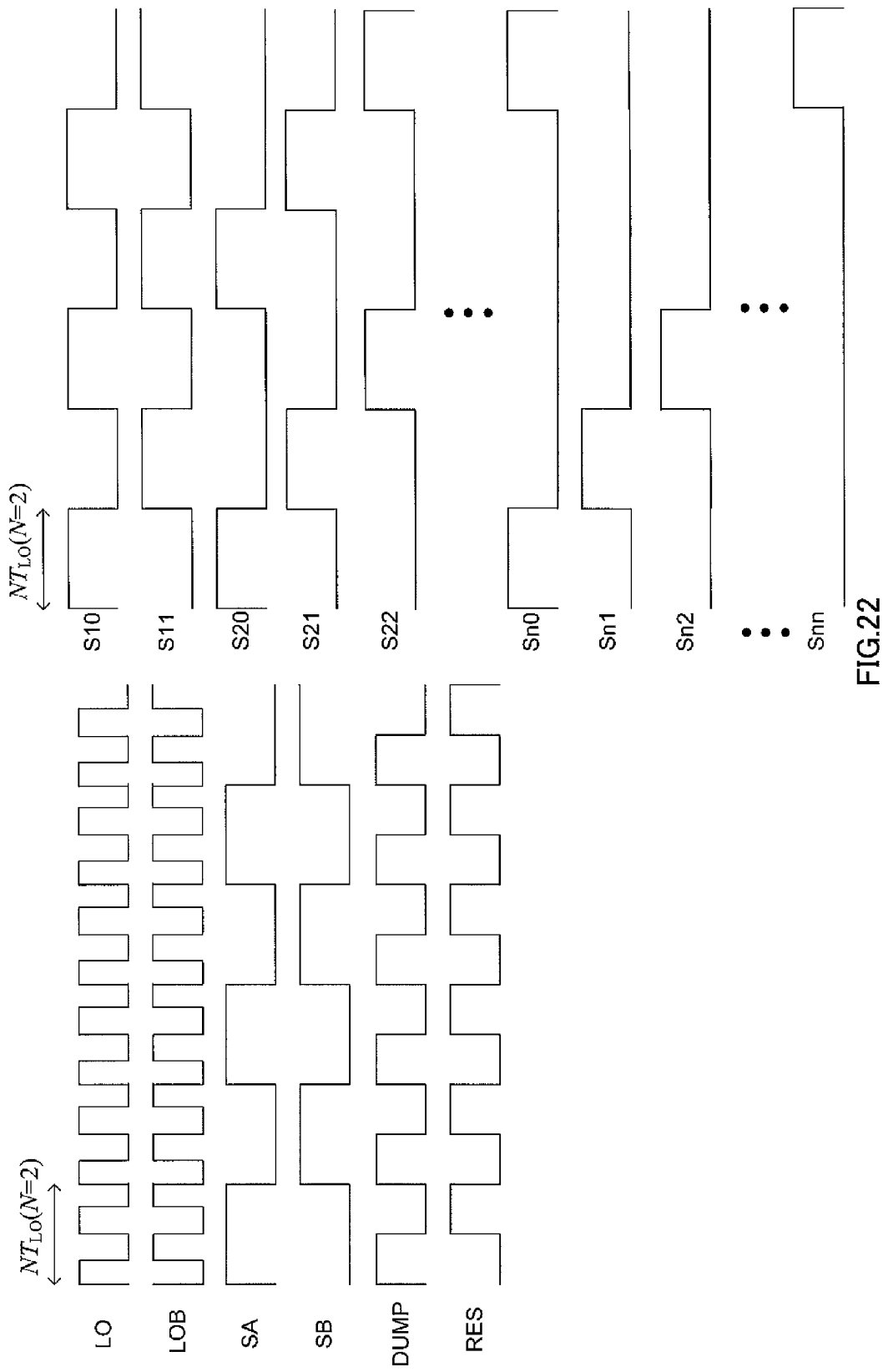
FIG. 22 shows clocks (i.e., control signals) provided from a clock generation circuit.

FIG. 22 shows clocks (control signals) inputted to discrete-time analog circuit 800 shown in FIG. 21.

Based on the descriptions provided above, the charge sharing can be expressed by the following difference equation:

(Equation 20)

$$q_{in}(n) + \sum_{k=1}^{n} A_k C_{Hk} v_1(n-kN) = \left(C_R + \sum_{k=1}^{n} C_{Hk}\right) v_1(n) \quad [20]$$

In equation 20, the first term on the left side is input charge. Furthermore, in equation 20, the second term on the left side is the charge held in CHk (sum of k=1 to n) based on the potential determined by the charge sharing performed k timings before the charge inputting and multiplied by Ak.

[21]

$$C_R v_1(n) + C_B v_{out}(n-N) = (C_R + C_B) v_{out}(n) \quad \text{(Equation 21)}$$

Performing z transform on equation 21 and organizing the result derives a transfer function expressed as follows:

(Equation 22)

$$\frac{V_{out}}{V_{in}} = \frac{g_m T_{LO}}{\pi} \cdot \frac{1-z^{-N}}{1-z^{-1}} \cdot T_{IIR} \cdot \frac{C_R}{C_R + C_B(1-z^{-N})} \quad [22]$$

(Equation 23)

$$T_{IIR} = \frac{1}{C_R + \sum_{k=1}^{n} C_{Hk} - \sum_{k=1}^{n} A_k C_{Hk} z^{-kN}} \quad [23]$$

Equations 22 and 23 show that the discrete-time analog circuit according to the present embodiment can provide a transfer function whose denominator has optional order coefficients. As a result, the number and the values of poles of the transfer function can be optionally set, whereby the degree of freedom in designing a filter can be increased.

Next, a description will be given of a case where the configuration of discrete-time analog circuit 200 shown in FIG. 10 is extended to an n-th-order configuration.

Figure 23:
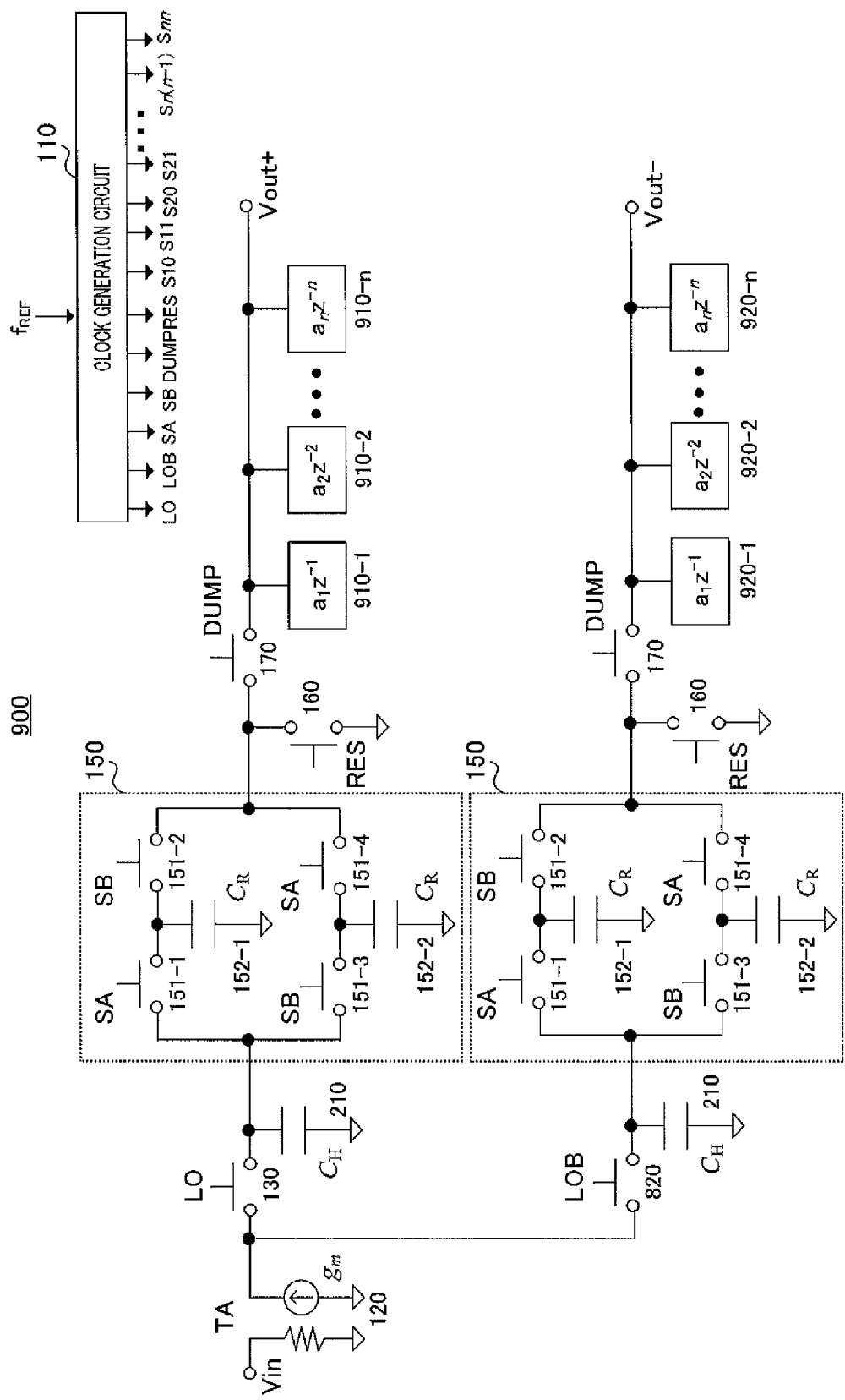
FIG. 23 shows another configuration diagram of an n-th-order discrete-time analog circuit according to Embodiment 3.

FIG. 23 shows an example in which the configuration of discrete-time analog circuit 200 shown in FIG. 10 is extended to an n-th-order configuration. In FIG. 23, coefficient circuits 910-$k$ and coefficient circuits 920-$k$ (where k=1 to n) provide the denominator of the transfer function of discrete-time analog circuit 900 with a k-th-order term. Discrete-time analog circuit 900 shown in FIG. 23 has not only a system connected to sampling switch 130 but also a system connected to sampling switch 820. Sampling switch 130 receives LO as an input, and sampling switch 820 receives LOB as an input. LOB is a signal having a phase shifted by 180 degrees from the phase of LO, and the system connected to sampling switch 820, to which LOB is inputted, therefore operates as a differential system having an opposite phase.

Discrete-time analog circuit 900 receives clocks (i.e., control signals) shown in FIG. 22, as in discrete-time analog circuit 800.

Based on the descriptions provided above, the charge sharing can be expressed by the following difference equation:

(Equation 24)

$$q_{in}(n) + C_H v_1(n-N) = (C_R + C_H) v_1(n) \quad [24]$$

(Equation 25)

$$C_R v_1(n) + \sum_{k=1}^{n} A_k C_{Bk} v_{out}(n-kN) = \left(C_R + \sum_{k=1}^{n} C_{Bk}\right) v_{out}(n) C_B \quad [25]$$

Performing z transform on equation 25 and organizing the result derives a transfer function expressed by equation 26 as follows:

(Equation 26)

$$\frac{V_{out}}{V_{in}} = \frac{g_m T_{LO}}{\pi} \cdot \frac{1-z^{-N}}{1-z^{-1}} \cdot \frac{C_R}{C_R + C_H(1-z^{-N})} \cdot T_{IIR} \quad [26]$$

(Equation 27)

$$T_{IIR} = \frac{1}{C_R + \sum_{k=1}^{n} C_{Bk} - \sum_{k=1}^{n} A_k C_{Bk} z^{-kN}} \quad [27]$$

Equations 26 and 27 show that the discrete-time analog circuit according to the present embodiment can provide a transfer function whose denominator has optional order coefficients. As a result, the number and the values of the poles of the transfer function can be optionally set, whereby the degree of freedom in designing a filter can be increased.

It has been assumed in the above description that n is one or greater, but a denominator-type coefficient circuit of n=0 can be defined as a single capacitor (CH or CB) having no potential holding circuit.

The configurations shown in FIGS. 21 and 23 allow not only frequency conversion based on charge sampling but also filtering expressed by a transfer function whose denominator is formed of an n-th-order polynomial having optional coefficients. The configurations shown in FIGS. 21 and 23 differ from each other in that the denominator-type coefficient circuit is connected or not at the time of charge sampling for the frequency conversion, and it is believed that the difference affects noise and linearity.

As described above, the discrete-time analog circuit according to the present embodiment allows filtering which is expressed by a transfer function whose denominator is formed of an n-th-order polynomial having optional coefficients and in which the poles of the transfer function can be optionally set.

Embodiment 4

Embodiments 1 to 3 have been described with reference to discrete-time analog circuits having a transfer function whose denominator has optional order coefficients (i.e., denominator-type discrete-time analog circuit). The present embodiment will be described with reference to a discrete-time analog circuit having a transfer function whose numerator has optional order coefficients (i.e., numerator-type discrete-time analog circuit).

FIG. 24 shows a configuration of coefficient circuit 1000 used in a numerator-type discrete-time analog circuit and clocks inputted to coefficient circuit 1000.

[Configuration of Coefficient Circuit 1000]

Coefficient circuit 100 includes rotating capacitors (CRs) 1030-1 and 1030-2 (a1, a2), amplifier 1010 (b), and switches 1020-1 to 1020-4 (c1 to c4). Coefficient circuit 1000 receives S1 and S2 as inputs from a clock generation circuit (not shown).

FIG. 24(a) shows a charge-sharing-type coefficient circuit, and FIG. 24(b) shows a potential-holding-type coefficient circuit. The potential-holding-type coefficient circuit shown in FIG. 24(b) will be described below.

[Operation of Coefficient Circuit 1000]

Clock generation circuit 110 supplies the switches with control signals S1 and S2.

In the interval where S1 is high, amplifier 1010 (b) monitors the potential at node Cin, amplifies the potential at node Cin by a factor of B, and accumulates the amplified potential in CR 1030-1 (a1) via switch 1020-1 (c1). At the same time, CR 1030-2 (a2) is connected to an external circuit at node Cout via switch 1020-4 (c4).

In the interval where S2 is high, amplifier 1010 (b) monitors the potential at node Cin, amplifies the potential at node Cin by a factor of B, and accumulates the amplified potential in CR 1030-2 (a2) via switch 1020-3 (c3). At the same time, CR 1030-1 (a1) is connected to the external circuit at node Cout via switch 1020-2 (c2).

The operation described above is repeated.

Next, a description will be made of the configuration and operation of a discrete-time analog circuit including coefficient circuit 1000 configured as described above.

[Exemplary Use in Sampling Mixer of Numerator Charge Sharing Type]

Figure 25:
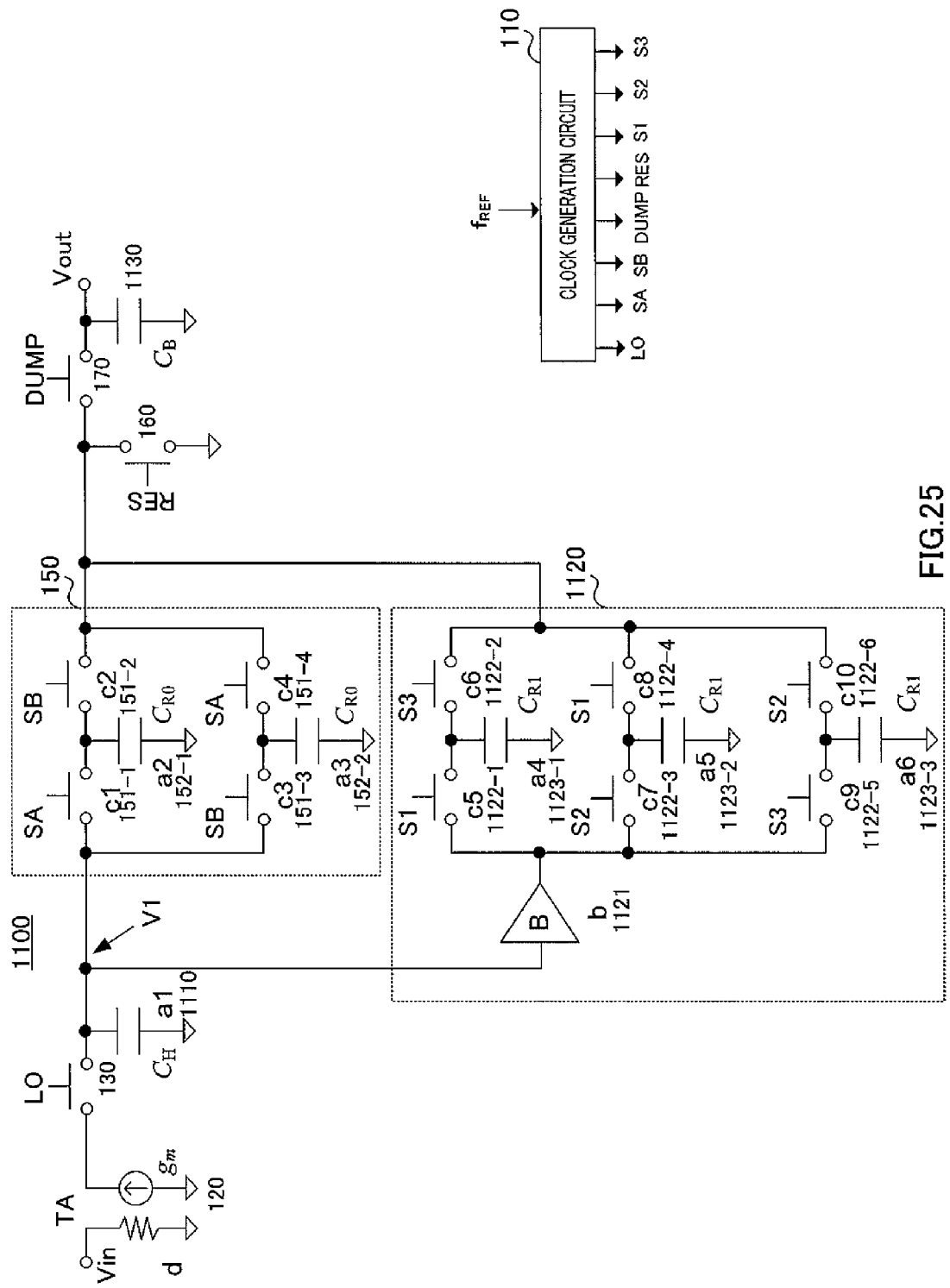
FIG. 25 shows a configuration diagram of a discrete-time analog circuit according to Embodiment 4.

FIG. 25 shows a key configuration of discrete-time analog circuit 13 according to the present embodiment. In FIG. 25, discrete-time analog circuit 1100 corresponds to discrete-time analog circuit 13 shown in FIG. 7 and forms a sampling mixer. In discrete-time analog circuit 1100 shown in FIG. 25, components common to those of discrete-time analog circuit 100 shown in FIG. 8 are assigned the same reference characters as those in FIG. 8, and the descriptions thereof will be omitted. Discrete-time analog circuit 1100 shown in FIG. 25 differs from discrete-time analog circuit 100 shown in FIG. 8 in that coefficient circuit 140 is replaced with coefficient circuit 1120 and history capacitor (CH) 1110 and buffer capacitor (CB) 1130 are added.

Coefficient circuit 1120 includes amplifier 1121 (b), switches 1122-1 to 1122-6, rotating capacitors (CRs) 1123-1 to 1123-3 (a4, a5, a6).

Discrete-time analog circuit 1100 shown in FIG. 25 includes coefficient circuit 1120 disposed in parallel with rotating capacitor circuit 150, thereby allowing the transfer function to have a higher-order numerator.

[Operation of Discrete-Time Analog Circuit 1100]

Figure 26:
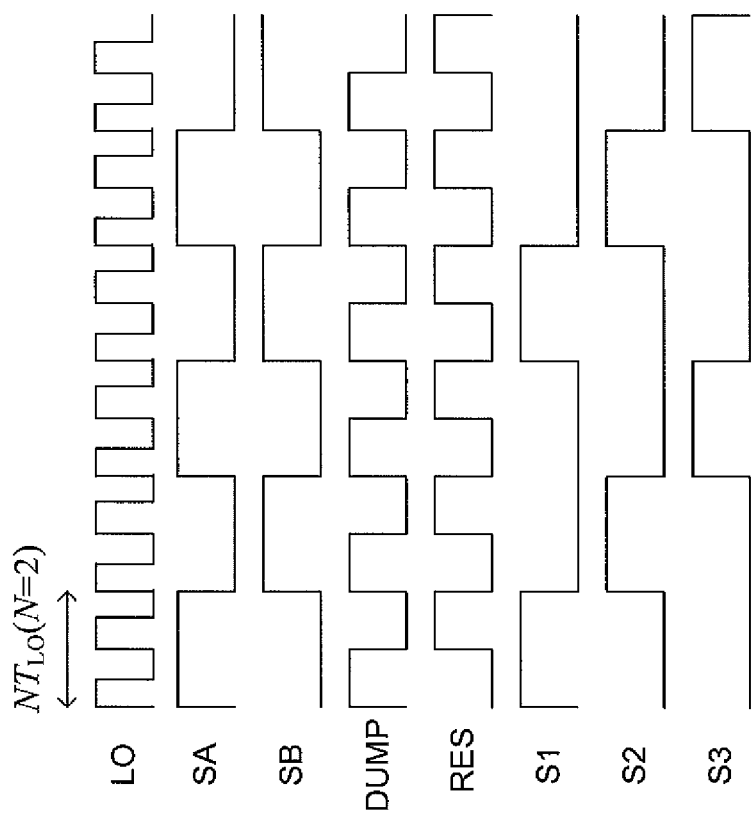
FIG. 26 shows clocks (i.e., control signals) provided from a clock generation circuit.

Clock generation circuit 110 generates control signals LO, SA, SB, S1, S2, S3, RES, and DUMP shown in FIG. 26 from reference frequency signal 24 produced by reference frequency oscillating section 14 and supplies the switches with the control signals.

TA 120 receives analog RF signal 23 amplified by low noise amplifier 12 as an input voltage signal and converts the voltage signal into a current (gm×Vin).

The operation of discrete-time analog circuit 1100 will be described below with reference to the interval where S1 to S3 are high.

[1] Interval where S1 is High

In the interval where LO is high, the input current (gm×Vin) is accumulated as charge (i.e., input charge) in CH 1110 (a1), CR 152-1 (a2) or CR 152-2 (a3). In the interval where S1 is high, the input charge described above and the charge held in CH 1110 (a1) are shared and held in CH 1110 (a1) and CR 152-1 (a2) or CR 152-2 (a3), and potential V1 is determined.

At the same time, amplifier 1121 (b) monitors potential V1, amplifies potential V1 by a factor of B, and charges CR 1123-1 (a4) with the amplified potential.

The charge sampling allows discrete-time analog circuit 1100 according to the present embodiment to perform frequency conversion at the same time, and the RF signal is converted into an IF signal or BB signal.

On the other hand, in the interval where DUMP is high, the charge held in CR 152-1 (a2) or CR 152-2 (a3), the charge held in CR 1123-2 (a5), and the charge held in CB 1130 are shared, and output potential Vout is determined. Output potential Vout is outputted as IF signal or BB signal 25.

In the interval where RES is high, DUMP is low and the charge held in CR 152-1 (a2) or CR 152-2 (a3) and CR 1123-2 (a5) is grounded and reset.

[2] Interval where S2 is High

In the interval where LO is high, the input current (gm×Vin) is accumulated as charge (i.e., input charge) in CH 1110 (a1) and CR 152-1 (a2) or CR 152-2 (a3). In the interval where S2 is high, the input charge described above and the charge held in CH 1110 (a1) are shared and held in CH 1110 (a1) and CR 152-1 (a2) or CR 152-2 (a3), and potential V1 is determined.

At the same time, amplifier 1121 (b) monitors potential V1, amplifies potential V1 by a factor of B, and charges CR 1123-2 (a5) with the amplified potential.

On the other hand, in the section where DUMP is high, the charge held in CR 152-1 (a2) or CR 152-3 (a3), the charged held in CR 1123-3 (a6), and the charged held in buffer capacitor CB 1130 are shared. Output potential Vout is thus determined. Output potential Vout is outputted as IF signal or BB signal 25.

In the interval where RES is high, DUMP is low and the charge held in CR 152-1 (a2) or CR 152-2 (a3) and CR 1123-3 (a6) is grounded and reset.

[3] Interval where S3 is High

In the interval where LO is high, the input current (gm×Vin) is accumulated as charge (i.e., input charge) in CH 1110 (a1) and CR 152-1 (a2) or CR 152-2 (a3). In the interval where S3 is high, the input charge described above and the charge held in CH 1110 (a1) are shared and held in CH 1110 (a1) and CR 152-1 (a2) or CR 152-2 (a3), and potential V1 is determined.

At the same time, amplifier 1121 (b) monitors potential V1, amplifies potential V1 by a factor of B, and charges CR 1123-3 (a6) with the amplified potential.

On the other hand, in the interval where DUMP is high, the charge held in CR 152-1 (a2) or CR 152-2 (a3), the charged held in CR 1123-1 (a4), and the charged held in CB 1130 are shared. Output potential Vout is thus determined. Output potential Vout is outputted as IF signal or BB signal 25.

In the interval where RES is high, DUMP is low and the charge held in CR 152-1 (a2) or CR 152-2 (a3) and CR 1123-1 (a4) is grounded and reset.

In [4] and thereafter, the operations in [1], [2], and [3] are repeated.

The above operation is described by a difference equation as follows:

[28]

$$q_{in}(n) + C_H v_1(n-N) = (C_{R0} + C_H) v_1(n) \quad \text{(Equation 28)}$$

In equation 28, the first term on the left side is the input charge. Furthermore, in equation 28, the second term on the left side is the charge determined by charge sharing of the charge held in the CH performed 1 timing before the charge inputting.

[29]

$$C_{R0} v_1(n) + B_1 C_{R1} v_1(n-N) + C_B v_{out}(n-N) = (C_{R0} + C_{R1} + C_B) v_{out}(n) \quad \text{(Equation 29)}$$

In equation 29, the first term on the left side is the charge held in CR0. Moreover, in equation 29, the second term on the left side is the charge held in CR1 based on the potential in CR0 determined by charge sharing performed 1 timing before the charge inputting and multiplied by B1. The third term on the left side in equation 29 is the charge determined by charge sharing on the output side performed 1 timing before charge is held in the CB.

Performing z transform on equation 29 and organizing the result derives a transfer function expressed by the following equation:

(Equation 30)

$$\frac{V_{out}}{V_{in}} = \frac{g_m T_{LO}}{\pi} \cdot \frac{1-z^{-N}}{1-z^{-1}} \cdot \frac{1/(C_{R0}+C_H)}{1-\{C_H/(C_{R0}+C_H)\}z^{-N}} \cdot T_{IIR} \quad [30]$$

(Equation 31)

$$T_{IIR} = \frac{(C_{R0}+C_{R1}B_1 z^{-N})/(C_{R0}+C_{R1}+C_B)}{1-\{C_B/(C_{R0}+C_{R1}+C_B)\}z^{-N}} \quad [31]$$

The discrete-time analog circuit according to the present embodiment can provide the numerator of transfer function $T_{IIR}$ with a first-order polynomial having a constant term and optional coefficients, as indicated by equations 30 and 31.

In the present embodiment, coefficient circuit 1000 is configured both as the charge sharing type and the potential holding type, but coefficient circuit 1000 can alternatively be configured only as the charge sharing type or the potential holding type.

When only the charge sharing type is used, amplifier 1121 is simply a wiring line. A difference in operation between the case where only the charge sharing type is used and the case where only the potential holding type is used is that sharing the input charge and the charge in CH and CR0 also involves CR1 and the charge in CR1 is not multiplied by B1.

The above situation is expressed by a difference equation as follows:

[32]

$$q_{in}(n)+C_H v_1(n-N) = (C_{R0}+C_{R1}+C_H)v_1(n) \quad \text{(Equation 32)}$$

[33]

$$C_{R0}v_1(n)+C_{R1}v_1(n-N)+C_B v_{out}(n-N) = (C_{R0}+C_{R1}+C_B)v_{out}(n) \quad \text{(Equation 33)}$$

The transfer function is expressed as follows:

(Equation 34)

$$\frac{V_{out}}{V_{in}} = \frac{g_m T_{LO}}{\pi} \cdot \frac{1-z^{-N}}{1-z^{-1}} \cdot \frac{1/(C_{R0}+C_{R1}+C_H)}{1-\{C_H/(C_{R0}+C_{R1}+C_H)\}z^{-N}} \cdot T_{IIR} \quad [34]$$

(Equation 35)

$$T_{IIR} = \frac{(C_{R0}+C_{R1}z^{-N})/(C_{R0}+C_{R1}+C_B)}{1-\{C_B/(C_{R0}+C_{R1}+C_B)\}z^{-N}} \quad [35]$$

The discrete-time analog circuit according to the present embodiment can provide the numerator of transfer function $T_{IIR}$ with a first-order polynomial having a constant term and optional coefficients, as indicated by equations 34 and 35.

When only the potential holding type is used, the charge in the rotating capacitors is not shared, and thus the configuration in this case differs from those having been described above. Accordingly, the configuration in this case will be described below.

[Sampling Mixer of Numerator Potential Holding Type]

Figure 27:
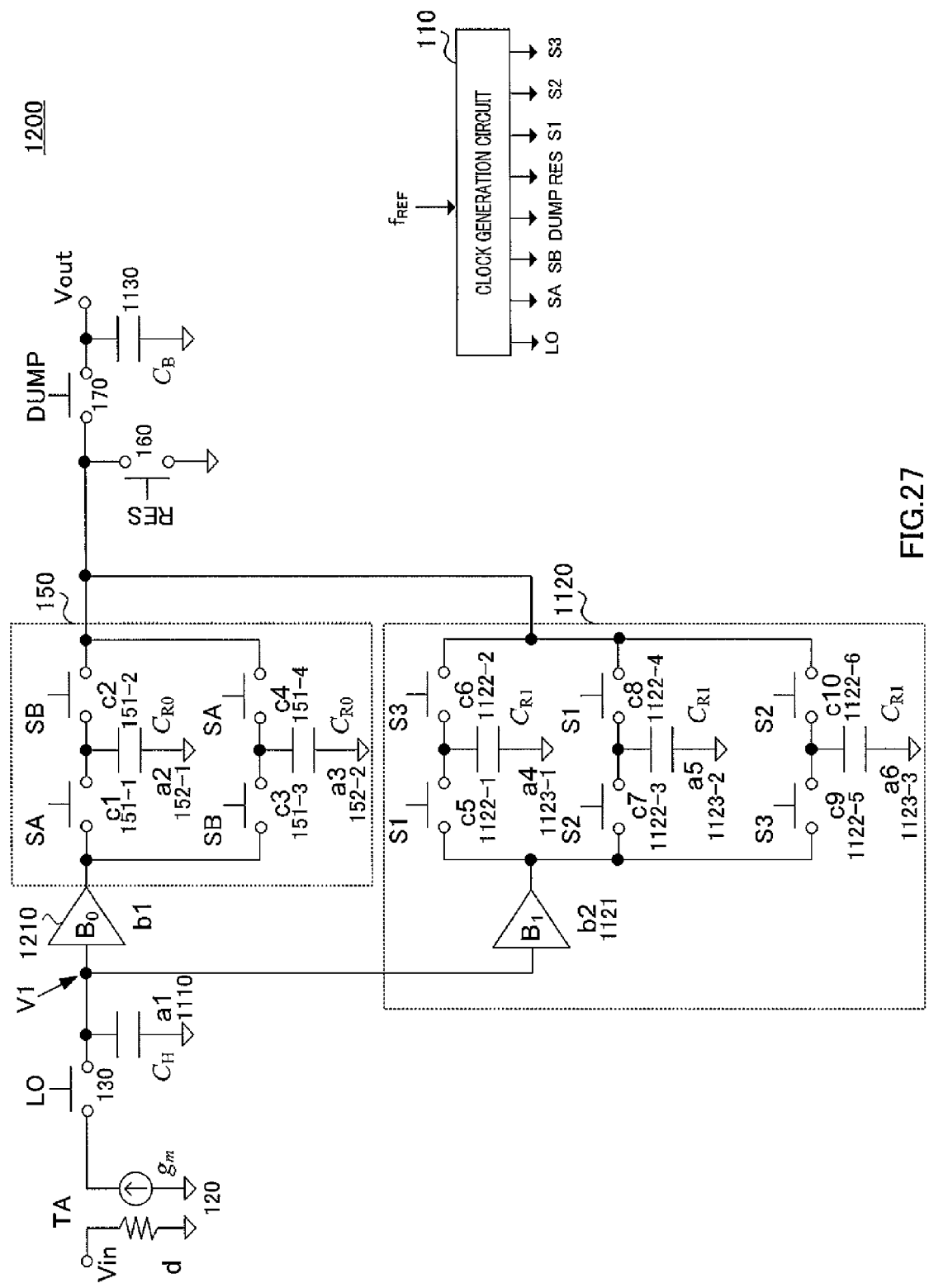
FIG. 27 shows another configuration diagram of the discrete-time analog circuit according to Embodiment 4.

FIG. 27 shows a key configuration of discrete-time analog circuit 13 according to the present embodiment. In FIG. 27, discrete-time analog circuit 1200 corresponds to discrete-time analog circuit 13 shown in FIG. 7 and forms a sampling mixer. In discrete-time analog circuit 1200 shown in FIG. 27, components common to those of discrete-time analog circuit 1100 shown in FIG. 25 are assigned the same reference numerals as those in FIG. 25, and the descriptions thereof will be omitted. Discrete-time analog circuit 1200 shown in FIG. 27 differs from discrete-time analog circuit 1100 shown in FIG. 25 in that amplifier 1210 is added between CH 1110 and rotating capacitor circuit 150.

Discrete-time analog circuit 1200 shown in FIG. 27 includes amplifier 1210 between CH 1110 and rotating capacitor circuit 150, thereby allowing the transfer function to have a higher-order numerator.

[Operation of Discrete-Time Analog Circuit 1200]

Figure 28:
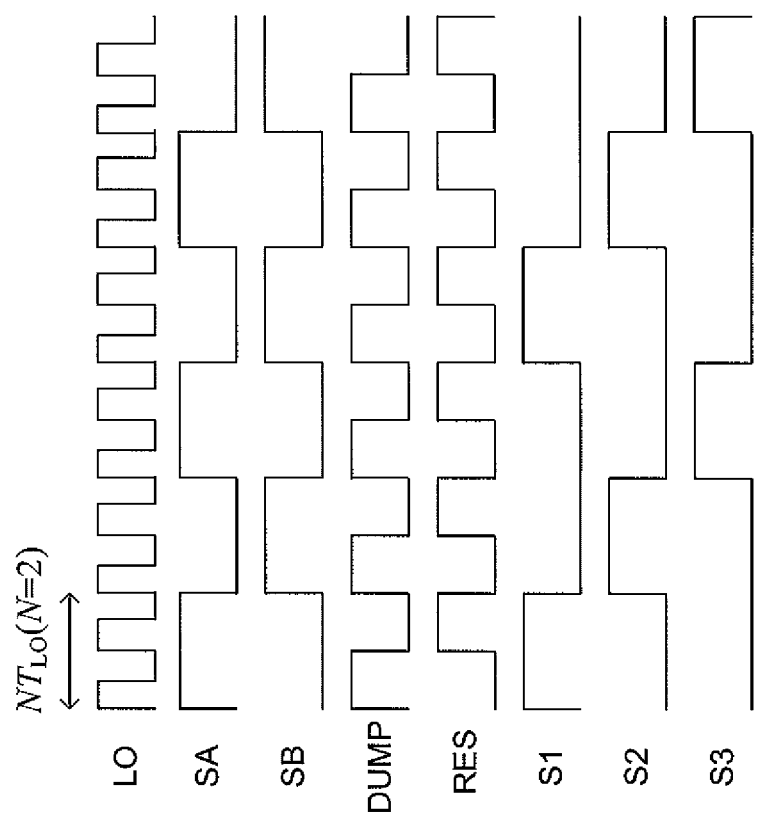
FIG. 28 shows clocks (i.e., control signals) provided from the clock generation circuit.

Clock generation circuit 110 generates control signals LO, SA, SB, S1, S2, S3, RES, and DUMP shown in FIG. 28 from reference frequency signal 24 produced by reference frequency oscillating section 14 and supplies the switches with the control signals.

TA 120 receives analog RF signal 23 amplified by low noise amplifier 12 as an input voltage signal and converts the voltage signal into a current (gm×Vin).

The operation of discrete-time analog circuit 1200 will be described below with reference to the interval where S1 to S3 are high.

[1] Interval where S1 is High

In the interval where LO is high, the input current (gm× Vin) is accumulated as charge (i.e., input charge) in CH 1110 (a1). In the interval where S1 is high, the input charge described above and the charge held in CH 1110 (a1) are shared, and potential V1 is determined.

At the same time, amplifier 1210 (b1) monitors potential V1, amplifies potential V1 by a factor of B0, and charges CR 152-1 (a2) or CR 152-2 (a3) with the amplified potential. Amplifier 1121 (b2) monitors potential V1, amplifies potential V1 by a factor of B1, and charges CR 1123-1 (a4) with the amplified potential.

The charge sampling allows the discrete-time analog circuit according to the present embodiment to perform frequency conversion at the same time, and the RF signal is converted into an IF signal or BB signal.

On the other hand, in the interval where DUMP is high, the charge held in CR 152-1 (a2) or CR 152-2 (a3), the charge held in CR 1123-2 (a5), and the charge held in CB 1130 are shared, and output potential Vout is determined. Output potential Vout is outputted as IF signal or BB signal 25.

In the interval where RES is high, DUMP is low and the charge held in CR 152-1 (a2) or CR 152-2 (a3) and CR 1123-2 (a5) is grounded and reset.

[2] Interval where S2 is High

In the interval where LO is high, the input current (gm× Vin) is accumulated as charge (i.e., input charge) in CH 1110 (a1). In the interval where S2 is high, the input charge described above and the charge held in CH 1110 (a1) are shared, and potential V1 is determined.

At the same time, amplifier 1210 (b1) monitors potential V1, amplifies potential V1 by a factor of B0, and charges CR 152-1 (a2) or CR 152-2 (a3) with the amplified potential. Amplifier 1121 (b2) monitors potential V1, amplifies potential V1 by a factor of B1, and charges CR 1123-2 (a5) with the amplified potential.

On the other hand, in the interval where DUMP is high, the charge held in CR 152-1 (a2) or CR 152-2 (a3), the charge held in CR 1123-3 (a6), and the charge held in CB 1130 is shared. Output potential Vout is thus determined. Output potential Vout is outputted as IF signal or BB signal 25.

In the interval where RES is high, DUMP is low and the charge held in CR 152-1 (a2) or CR 152-2 (a3) and CR 1123-3 (a6) is grounded and reset.

[3] Interval where S3 is High

In the interval where LO is high, the input current (gm× Vin) is accumulated as charge (i.e., input charge) in CH 1110 (a1). In the interval where S3 is high, the input charge described above and the charge held in CH 1110 (a1) are shared, and potential V1 is determined.

At the same time, amplifier 1210 (b1) monitors potential V1, amplifies potential V1 by a factor of B0, and charges CR 151-1 (a2) or CR 151-2 (a3) with the amplified potential. Amplifier 1121 (b2) monitors potential V1, amplifies potential V1 by a factor of B1, and charges CR 1123-3 (a6) with the amplified potential.

On the other hand, in the interval where DUMP is high, the charge held in CR 152-1 (a2) or CR 152-2 (a3), the charge held in CR 1123-1 (a4), and the charge held in CB 1130 are shared. Output potential Vout is thus determined. Output potential Vout is outputted as IF signal or BB signal 25.

In the interval where RES is high, DUMP is low and the charge in CR 152-1 (a2) or CR 152-2 (a3) and CR 1123-1 (a4) is grounded and reset.

In [4] and thereafter, the operations in [1], [2], and [3] are repeated.

The above operation is described by a difference equation as follows:

[36]

$$q_{in}(n)+C_H v_1(n-N)=C_H v_1(n) \quad \text{(Equation 36)}$$

[37]

$$B_0 C_{R0} v_1(n)+B_1 C_{R1} v_1(n-N)+C_B v_{out}(n-N)=(C_{R0}+C_{R1}+C_B)v_{out}(n) \quad \text{(Equation 37)}$$

Performing z transform on equation 37 and organizing the result derives a transfer function expressed by the following equation:

(Equation 38)

$$\frac{V_{out}}{V_{in}} = \frac{g_m T_{LO}}{\pi} \cdot \frac{1-z^{-N}}{1-z^{-1}} \cdot \frac{1}{C_H(1-z^{-N})} \cdot T_{IIR} \quad [38]$$

(Equation 39)

$$T_{IIR} = \frac{(C_{R0}+B_1 C_{R1} z^{-N})/(C_{R0}+C_{R1}+C_B)}{1-\{C_B/(C_{R0}+C_{R1}+C_B)\}z^{-N}} \quad [39]$$

The discrete-time analog circuit according to the present embodiment can provide the numerator of transfer function $T_{IIR}$ with a first-order polynomial having a constant term and optional coefficients, as indicated by equations 38 and 39. Equation 38 shows that the DC gain is infinity, but the DC gain has a finite value in an actual circuit because output resistance and parasitic capacitance of TA 120 affect the DC gain.

A discrete-time analog circuit capable of providing the numerator of the transfer function with a polynomial having first-order optional coefficients has been described.

Next, a description will be given of a discrete-time analog circuit that allows the order to be extended to an n-th order and provides the numerator of the transfer function with a polynomial having optional n-th-order coefficients.

[Numerator Type (n-th Order)]

The present embodiment can provide the numerator of the transfer function with a polynomial having n-th-order optional coefficients, as in the case where the denominator of the transfer function is provided with a polynomial having n-th-order optional coefficients.

Specifically, discrete-time analog circuit 1100 shown in FIG. 25 and discrete-time analog circuit 1200 shown in FIG. 27 can be configured in such a way that the transfer function has a higher-order numerator term, as in the principle of providing a higher-order denominator term shown in FIG. 19.

Figure 29:
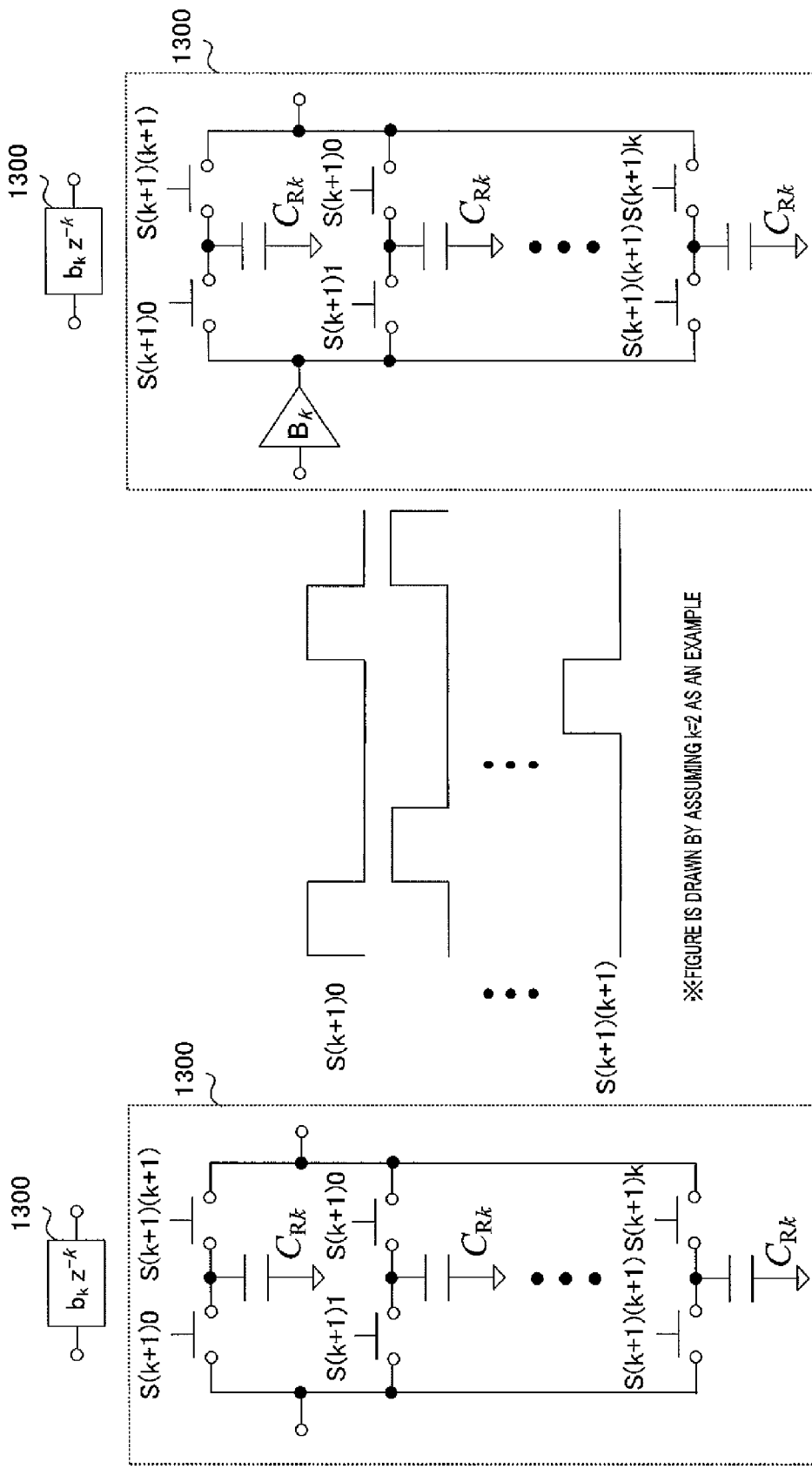
FIG. 29 shows a configuration of a k-th-order coefficient circuit according to Embodiment 4.

FIG. 29 shows a configuration of coefficient circuit ($b_k z^{-k}$) 1300 that provides a k-th-order term and clocks inputted from clock generation circuit 110 to coefficient circuit 1300.

When the order is the 0-th order (k=0) and the configuration shown in FIG. 29(b) is employed, discrete-time analog circuit 1100 shown in FIG. 25 is provided. On the other hand, when the order is the 0-th order (k=0) and a configuration with k=0 shown in FIG. 29(a) is employed, discrete-time analog circuit 1200 shown in FIG. 27 is provided. That is, the difference between discrete-time analog circuit 1100 and discrete-time analog circuit 1200 is that a constant term is provided by charge sharing or potential holding and weighting.

Although all capacitors have a single value CRk in coefficient circuit 1300 shown in FIG. 29, the values of CRk of the capacitors can be individually set to appropriate values, whereby the degree of freedom in designing a filter is increased.

Figure 30:
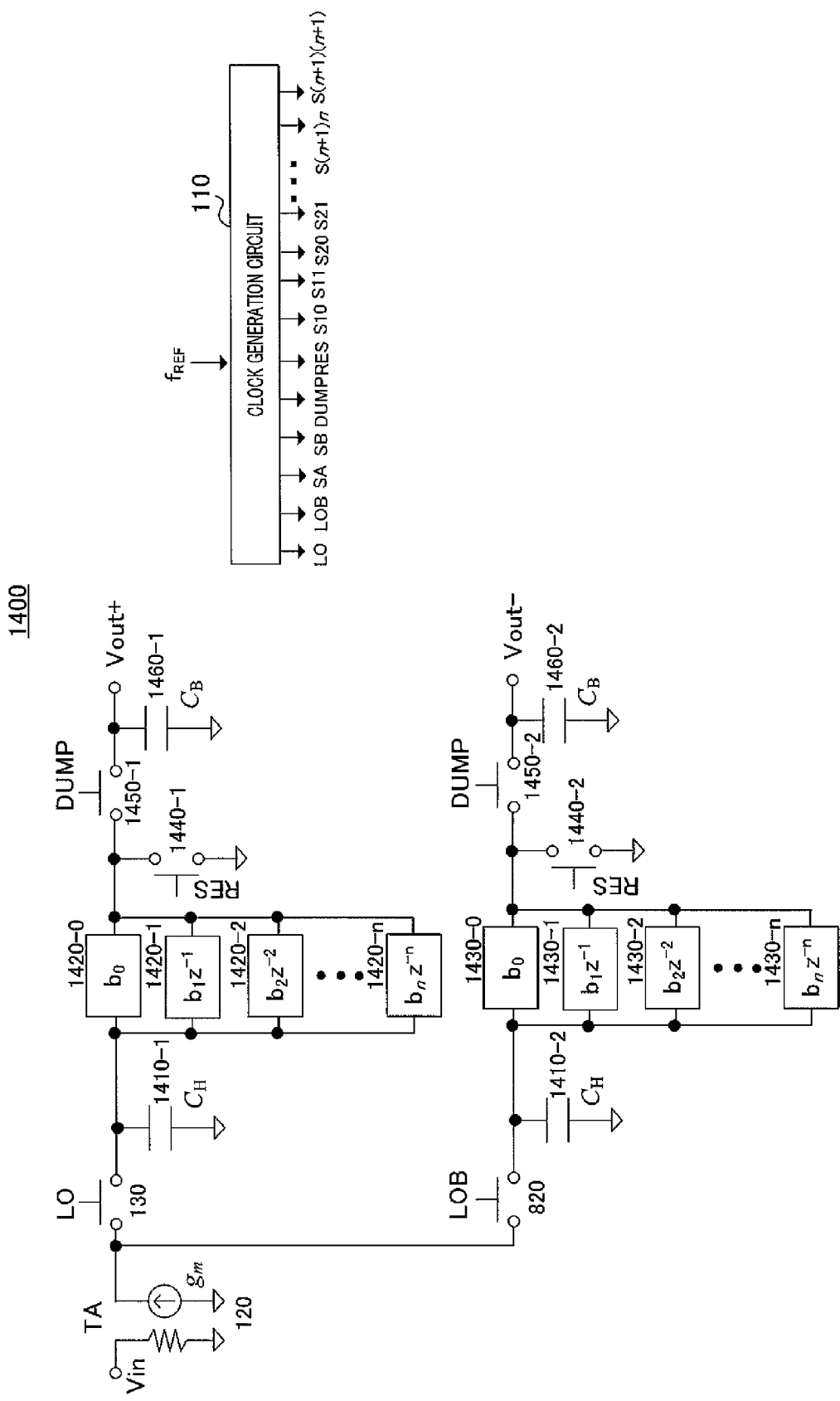
FIG. 30 shows a configuration diagram of an n-th-order discrete-time analog circuit according to Embodiment 4.

FIG. 30 shows a key configuration of a discrete-time analog circuit capable of providing the numerator of the transfer function with a polynomial having n-th-order optional coefficients.

Discrete-time analog circuit 1400 shown in FIG. 30 includes clock generation circuit 110, TA 120, sampling switches 1410-1 and 1410-2, coefficient circuits 1420-k (k=0 to n) and 1430-k, reset switches 1440-1 and 1440-2, dump switches 1450-1 and 1450-2, and CBs (buffer capacitors) 1460-1 and 1460-2.

Discrete-time analog circuit 1400 shown in FIG. 30 includes numerator-type coefficient circuits labeled as 1420-0 to 1420-n and 1430-0 to 1430-n, each of which can be of the charge sharing type or the potential holding type.

Specifically, the configurations of coefficient circuits 1420-0 to 1420-n and 1430-0 to 1430-n are classified into a case where only the charge sharing type is used, a case where the charge sharing type and the potential holding type are combined, and a case where only the potential holding type is used. A difference equation representing the operation of an n-th-order, numerator, charge sharing-type coefficient circuit and a transfer function derived by performing z transform for each of the charge sharing type, the potential holding type, and the combination thereof is as follows:

<Case where Only Charge Sharing Type is Used to Form n-th-order Coefficient Circuit>

(Equation 40)

$$q_{in}(n) + C_H v_1(n-N) = \left(\sum_{k=0}^{n} C_{Rk} + C_H\right) v_1(n) \quad [40]$$

(Equation 41)

$$\sum_{k=0}^{n} C_{Rk} v_1(n-kN) + C_B v_{out}(n-N) = \left(\sum_{k=0}^{n} C_{Rk} + C_B\right) v_{out}(n) \quad [41]$$

Performing z transform on equation 41 and organizing the result derives a transfer function expressed by the following equation:

(Equation 42)

$$\frac{V_{out}}{V_{in}} = \frac{g_m T_{LO}}{\pi} \cdot \frac{1-z^{-N}}{1-z^{-1}} \cdot \frac{1/\left(\sum_{k=0}^{n} C_{Rk} + C_H\right)}{1 - \left\{C_H / \left(\sum_{k=0}^{n} C_{Rk} + C_H\right)\right\} z^{-N}} \cdot \frac{1/\left(\sum_{k=0}^{n} C_{Rk} + C_B\right)}{1 - \left\{C_B / \left(\sum_{k=0}^{n} C_{Rk} + C_B\right)\right\} z^{-N}} \cdot T_{FIR}$$ [42]

(Equation 43)

$$T_{FIR} = \sum_{k=0}^{n} C_{Rk} z^{-kN}$$ [43]

<Case where Charge Sharing Type and Potential Holding Type are Combined to Form n-th-order Coefficient Circuit>

Let kci (i=1 to l) be k of a coefficient circuit of charge sharing type and khj (j=1 to n+1−l) be k of a coefficient circuit of potential holding type. The action of charge sharing is described by a difference equation as follows:

(Equation 44)

$$q_{in}(n) + C_H v_1(n-N) = \left(\sum_{i=1}^{l} C_{Rkci} + C_H\right) v_1(n)$$ [44]

(Equation 45)

$$\sum_{i=1}^{l} C_{Rkci} v_1(n-kciN) + \sum_{j=1}^{n+1-l} B_{khj} C_{Rkhj} v_1(n-khjN) + C_B v_{out}(n-N) = \left(\sum_{k=0}^{n} C_{Rk} + C_B\right) v_{out}(n)$$ [45]

Performing z transform on equations 44 and 45 and organizing the result derives a transfer function expressed by the following equation:

(Equation 46)

$$\frac{V_{out}}{V_{in}} = \frac{g_m T_{LO}}{\pi} \cdot \frac{1-z^{-N}}{1-z^{-1}} \cdot \frac{1/\left(\sum_{i=1}^{l} C_{Rkci} + C_H\right)}{1 - \left\{C_H / \left(\sum_{i=1}^{l} C_{Rkci} + C_H\right)\right\} z^{-N}} \cdot \frac{1/\left(\sum_{k=0}^{n} C_{Rk} + C_B\right)}{1 - \left\{C_B / \left(\sum_{k=0}^{n} C_{Rk} + C_B\right)\right\} z^{-N}} \cdot T_{FIR}$$ (46)

(Equation 47)

$$T_{FIR} = \sum_{i=1}^{l} C_{Rkci} z^{-kciN} + \sum_{j=1}^{n+1-l} B_{khj} C_{Rkhj} z^{-khjN}$$ [47]

<Case where Only Potential Holding Type is Used to Form n-th-order Coefficient Circuit>

(Equation 48)

$$q_{in}(n) + C_H v_1(n-N) = C_H v_1(n)$$ [48]

(Equation 49)

$$\sum_{k=0}^{n} B_k C_{Rk} v_1(n-kN) + C_B v_{out}(n-N) = \left(\sum_{k=0}^{n} C_{Rk} + C_B\right) v_{out}(n)$$ [49]

Performing z transform on equations 48 and 49 and organizing the results derives a transfer function expressed by the following equation:

(Equation 50)

$$\frac{V_{out}}{V_{in}} = \frac{g_m T_{LO}}{\pi} \cdot \frac{1-z^{-N}}{1-z^{-1}} \cdot \frac{1}{C_H(1-z^{-n})} \cdot \frac{1/\left(\sum_{k=0}^{n} C_{Rk} + C_B\right)}{1 - \left\{C_B / \left(\sum_{k=0}^{n} C_{Rk} + C_B\right)\right\} z^{-N}} \cdot T_{FIR}$$ [50]

(Equation 51)

$$T_{FIR} = \sum_{k=0}^{n} B_k C_{Rk} z^{-kN}$$ [51]

The discrete-time analog circuit according to the present embodiment can provide a transfer function whose numerator has optional order coefficients, as indicated by equations 50 and 51.

When a numerator-type coefficient circuit is of potential holding type, it is not always necessary to ground and reset the charge in the rotating capacitors in the potential holding type coefficient circuit in response to RES.

As described above, the present embodiment allows the transfer function to have an optional number of zero at optional frequencies. In the present embodiment, a remez algorithm can be used to determine the coefficients of an FIR filter, and the values of CRk and Bk are set so that these values have the thus determined coefficients. A broadband filter characteristic can be thus achieved by the FIR filter.

The configurations shown in FIGS. 25 and 27 allow not only frequency conversion based on charge sampling but also filtering expressed by a transfer function whose numerator is formed of a second-order polynomial having optional coefficients. The configurations shown in FIGS. 25 and 27 differ from each other in that the numerator-type coefficient is connected via an amplifier or not at the time of charge sampling for the frequency conversion, and the difference changes the configuration of the transfer function. In addition, it is believed that the difference affects noise and linearity.

The configuration shown in FIG. 30 allows frequency conversion based on charge sampling and filtering expressed by a transfer function whose numerator is formed of an n-th-order polynomial having optional coefficients.

When a numerator-type coefficient circuit includes no amplifier, a charge holding circuit in the numerator-type coefficient circuit is used for charge sharing. When a numerator-type coefficient circuit includes an amplifier, a charge holding circuit in the numerator-type coefficient circuit charges the charge holding circuit in the numerator-type coefficient circuit with the charge corresponding to amplified (i.e., held) potential.

It is believed that the greater the number of numerator-type coefficient circuits including no amplifier, the lower the consumed electric power. When a large number of charge holding circuits are used at the time of input, however, the DC gain decreases accordingly.

As described above, the discrete-time analog circuit according to the present embodiment allows frequency conversion and filtering expressed by a transfer function whose denominator is formed of an n-th-order polynomial having optional coefficients.

Embodiment 5

Embodiment 3 has been described with reference to a discrete-time analog circuit having a transfer function whose denominator has k-th-order coefficients. Embodiment 4 has been described with reference to a discrete-time analog circuit having a transfer function whose numerator has k-th-order coefficients. The present embodiment will be described with reference to a discrete-time analog circuit having a transfer function whose numerator and denominator each have second-order coefficients.

[Numerator+Denominator-Type Sampling Mixer]

Figure 31:
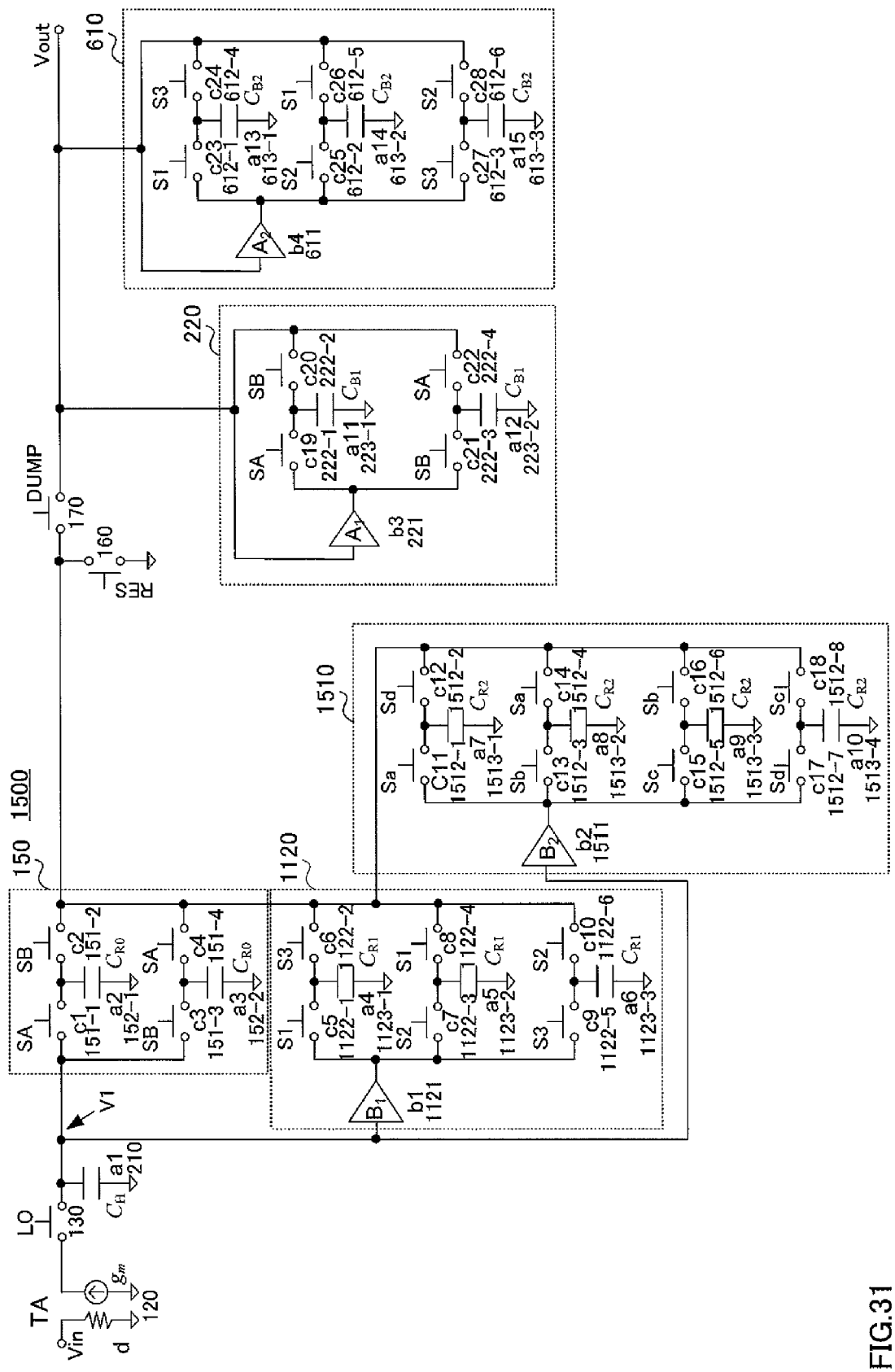
FIG. 31 shows a configuration diagram of a discrete-time analog circuit according to Embodiment 5.

FIG. 31 is a block diagram showing an example of a key configuration of a discrete-time analog circuit according to the present embodiment. In FIG. 31, discrete-time analog circuit 1500 corresponds to discrete-time analog circuit 13 shown in FIG. 7 and forms a sampling mixer having a transfer function whose numerator and denominator each have a second-order polynomial. In discrete-time analog circuit 1500 shown in FIG. 31, components common to those shown in FIGS. 8, 17, and 27 are assigned the same reference numerals, and the descriptions thereof will be omitted. Discrete-time analog circuit 1500 shown in FIG. 31 differs from discrete-time analog circuit 1100 shown in FIG. 27 in that numerator-type coefficient circuit 1510 and denominator-type coefficient circuits 220 and 610 are added.

Specifically, discrete-time analog circuit 1500 includes numerator-type coefficient circuits 150, 1120, and 1510, each of which is formed of rotating capacitors, and coefficient circuits 220 and 610, each of which is formed of buffer capacitors. Thus configured discrete-time analog circuit 1500 provides each of the numerator and the denominator with a second-order polynomial.

Figure 33:
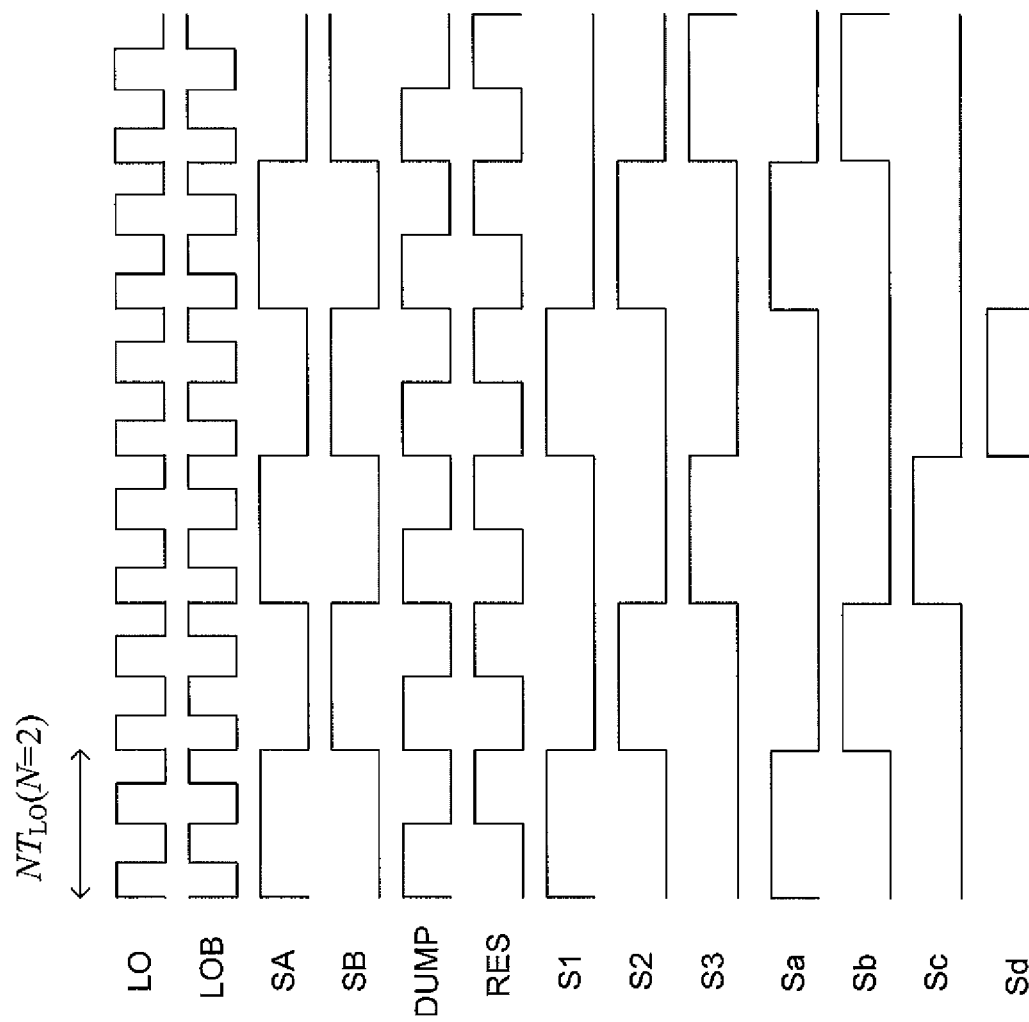
FIG. 33 shows clocks (i.e., control signals) provided from a clock generation circuit.

The switches in discrete-time analog circuit 1500 receive clocks (i.e., control signals) shown in FIG. 33 as inputs from clock generation circuit 110.

[Operation of Discrete-Time Analog Circuit 1500]

A description will be given based on the description provided above.

First, in charge sharing on the input side, the input charge and the charge (CHv(n−N)) produced 1 timing before the charge inputting are shared in CH 210 (a1) and CR0. V1 is thus determined. It is noted that CR0 is CR 152-1 (a2) or CR 152-2 (a3).

Amplifier 1211 (b1) multiplies thus determined V1 by B1, and the resultant potential is held in CR1. It is noted that CR1 is CR 1123-1 (a4), CR 1123-2 (a5), or CR 1123-3 (a6). Amplifier 1511 (b2) amplifies the potential by a factor of B2, and the potential multiplied by B2 is held in CR2.

At the same time, the following charge is shared on the output side: the charge held in CR0 (CRv1($n$)); the charge held in CR1 (B1CR1v1($n$−N)); the charge held in CR2 (B2CR2vout(n−2N)); the charge held in CB1 (A1CB1vout (n−N)); and the charge held in CB2 (A2CB1vout(n−2N)). Thus, output potential Vout is determined. It is noted that CB1 is CB 223-1 (a11) or CB 223-2 (a12). Moreover, CB2 is CB 613-1 (a13), CB 613-2 (a14), or CB 613-3 (a15).

Amplifier 221 (b3) amplifies thus determined Vout by a factor of A1, and the resultant potential is held in CB1. Amplifier 611 (b4) amplifies Vout by a factor of A2, and the resultant potential is held in CB2.

The operation described above is repeated.

The above operation is described by a difference equation as follows:

[52]

$$q_{in}(n)+C_H v_1(n-N)=(C_{R0}+C_H)v_1(n) \quad \text{(Equation 52)}$$

[53]

$$C_{R0}v_1(n)+B_1 C_{R1} v_1(n-N)+B_2 C_{R2} v_1(n-2N)+C_{B1}v_{out}(n-N)+C_{B2}v_{out}(n-2N)=(C_{R0}+C_{R1}+C_{R2}+C_{B1}+C_{B2})v_{out}(n) \quad \text{(Equation 53)}$$

Performing z transform on equation 53 and organizing the result derives a transfer function expressed by the following equation:

(Equation 54)

$$\frac{V_{out}}{V_{in}} = \frac{g_m T_{LO}}{\pi} \cdot \frac{1-z^{-N}}{1-z^{-1}} \cdot \frac{1/(C_{R0}+C_H)}{1-\{C_H/(C_{R0}+C_H)\}z^{-N}} \cdot T_{IIR} \quad [54]$$

(Equation 55)

$$T_{IIR} = \frac{\dfrac{(C_{R0}+C_{R1}B_1 z^{-N}+C_{R2}B_2 z^{-2N})}{(C_{R0}+C_{R1}+C_{R2}+C_{B1}+C_{B2})}}{1-\{C_{B1}/(C_{R0}+C_{R1}+C_{R2}+C_{B1}+C_{B2})\}z^{-N}-\{C_{B2}/(C_{R0}+C_{R1}+C_{R2}+C_{B1}+C_{B2})\}z^{-2N}} \quad [55]$$

Equations 54 and 55 show that the discrete-time analog circuit according to the present embodiment can provide each of the numerator and the denominator of transfer function $T_{IIR}$ with a second-order polynomial having optional coefficients. That is, the discrete-time analog circuit can form a sampling mixer having a transfer function obtained by transforming a second-order filter function from the s region to the z region in bilinear transform.

In the above description, the numerator type of k=0 is of charge sharing type, and the numerator types of k=1, 2 are of potential holding type. Alternatively, the numerator types of k=0, 1, 2 can be of charge sharing type or potential holding type. The difference in transfer function will be described when an n-th-order transfer function is described.

[Numerator+Denominator-Type Sampling Filter]

Figure 32:
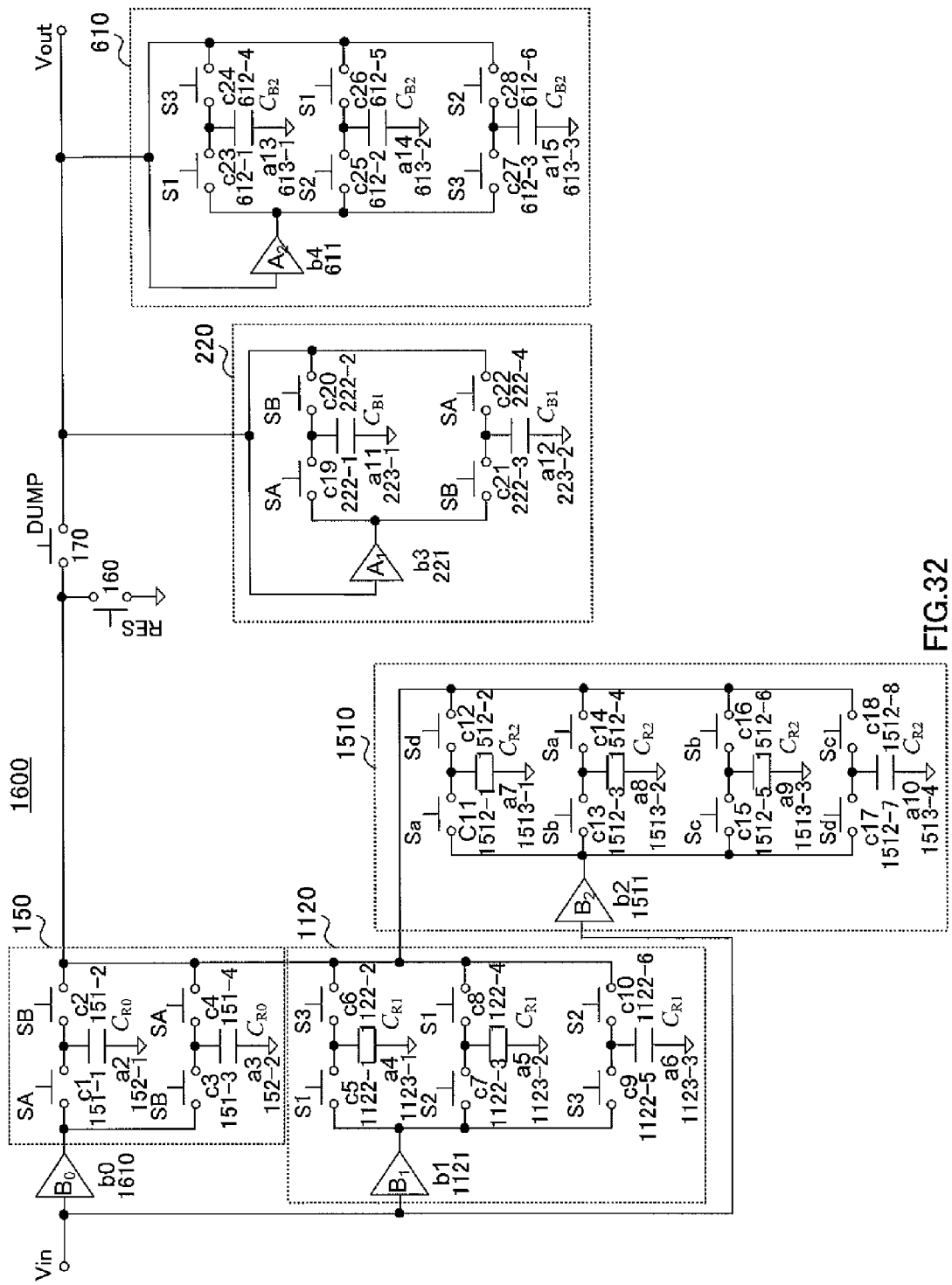
FIG. 32 shows another configuration diagram of the discrete-time analog circuit according to Embodiment 5.

FIG. 32 is a block diagram showing an example of another key configuration of the discrete-time analog circuit according to the present embodiment. In FIG. 32, discrete-time analog circuit 1600 forms a sampling filter having a transfer function whose denominator and numerator each have second-order coefficients. In discrete-time analog circuit 1600 shown in FIG. 32, components common to those of discrete-time analog circuit 1500 shown in FIG. 31 are assigned the same reference characters as those in FIG. 31, and the descriptions thereof will be omitted. Discrete-time analog circuit 1600 shown in FIG. 32 differs from discrete-time analog circuit 1500 shown in FIG. 31 in that TA 120 and CH 1110 are omitted. Furthermore, discrete-time analog circuit 1600 shown in FIG. 32 has a configuration in which amplifier 1610 disposed in a position upstream of switches 152-1 and 152-2 is added (corresponding to a change in the type of coefficient circuit 150 from the numerator charge sharing type to the numerator potential holding type).

Specifically, discrete-time analog circuit 1600 includes numerator-type coefficient circuits 1120 and 1510, each of which is formed of rotating capacitors, and coefficient circuits 220 and 610, each of which is formed of buffer capacitors. Thus configured discrete-time analog circuit 1600 provides each of the numerator and the denominator with a second-order polynomial.

The switches in discrete-time analog circuit 1600 receive clocks (i.e., control signals) shown in FIG. 33 as inputs from clock generation circuit 110.

[Operation of Discrete-Time Analog Circuit 1600]

A description will be given based on the description provided above.

First, on the input side, amplifier 1610 (b0) amplifies input potential Vin by a factor of B0, and the resultant potential is held in CR0. It is noted that CR0 is CR 152-1 (a2) or CR 152-2 (a3). In addition, amplifier 1121 (b1) amplifies input potential Vin by a factor of B1, and the resultant potential is held in CR1. It is noted that CR1 is CR 1123-1 (a4), CR 1123-2 (a5), or CR 1123-3 (a6). Amplifier 1511 (b2) then amplifies the potential Vin by a factor of B2, and the potential multiplied by B2 is held in CR2. It is noted that CR2 is CR 1513-1 (a7), CR 1513-2 (a8), CR 1513-3 (a9), or CR 1513-4 (a10).

At the same time, the following charge on the output side is shared: the charge held in CR0 (CR0B0v1($n$)); the charge held in CR1 (B1CR1v1($n$−N)); the charge held in CR2 (B2CR2vout($n$−2N)); the charge held in CB1 (A1CB1vout($n$−N)); and the charge held in CB2 (A2CB1Vout($n$−2N)) are shared. Thus, output potential Vout is determined. It is noted that CB1 is CB 223-1 (a11) or CB 223-2 (a12). It is also noted that CB2 is CB 613-1 (a13), CB 613-2 (a14), or CB 613-3 (a15).

Amplifier 221 (b3) amplifies thus determined Vout by a factor of A1, and the resultant potential is held in CB1. Amplifier 611 (b4) amplifies Vout by a factor of A2, and the resultant potential is held in CB2.

The operation described above is repeated.

The above operation is described by a difference equation as follows:

[56]

$$B_0 C_{R0} v_{in}(n) + B_1 C_{R1} v_{in}(n-N) + B_2 C_{R2} v_{in}(n-2N) + C_{B1} v_{out}(n-N) + C_{B2} v_{out}(n-2N) = (C_{R0} + C_{R1} + C_{R2} + C_{B1} + C_{B2}) v_{out}(n)$$ (Equation 56)

Performing z transform on equation 56 and organizing the result derives a transfer function expressed by the following equation:

(Equation 57)

$$T_{IIR} = \frac{\frac{(B_0 C_{R0} + C_{R1} B_1 z^{-N} + C_{R2} B_2 z^{-2N})}{(C_{R0} + C_{R1} + C_{R2} + C_{B1} + C_{B2})}}{1 - \{C_{B1}/(C_{R0} + C_{R1} + C_{R2} + C_{B1} + C_{B2})\} z^{-N} - \{C_{B2}/(C_{R0} + C_{R1} + C_{R2} + C_{B1} + C_{B2})\} z^{-2N}}$$ [57]

Equation 57 shows that the discrete-time analog circuit according to the present embodiment can provide each of the numerator and the denominator of transfer function $T_{IIR}$ with a second-order polynomial having optional coefficients. That is, the discrete-time analog circuit according to the present embodiment can form a sampling filter having a transfer function obtained by transforming a filter function from the s region to the z region in bilinear transform.

In the above description, the numerator-type of k=0, 1, 2 are of potential holding type. Alternatively, the numerator-type of k=0, 1, 2 can be of charge sharing type or potential holding type. The difference in transfer function will be described when an n-th-order transfer function is described.

A description has been given of a discrete-time analog circuit capable of providing each of the numerator and the denominator of the transfer function with a second-order polynomial. A description will next be given of an effectiveness of the present embodiment by comparing a calculation result with a simulation result in the discrete-time analog circuit according to the present embodiment on the Chebyshev characteristic.

[Achievement of Chebyshev Characteristic in Bilinear Transform]

When a transfer function whose denominator has a second-order polynomial in the s region (capable of achieving Butterworth characteristic or Chebyshev characteristic) is transformed by bilinear transform into a transfer function in the z region, the transfer function is expressed as follows:

(Equation 58)

$$T_1 = K \frac{1 + 2z^{-1} + z^{-2}}{1 + a_1 z^{-1} + a_2 z^{-2}}$$ [58]

Coefficients that achieve a second-order Chebyshev characteristic are, for example, a1=−1.9547, a2=0.9562, and K=3.658×10^(−4).

In the present embodiment, each of the numerator and the denominator can be provided with optional coefficients. In this respect, in the present embodiment, for example, transconductance gm of TA 120 and the values of the capacitors are set by comparing the coefficients of the numerator and the denominator in equation 58 and those in equation 57 as follows:

gm=0.91265 mS,CR0=CR1=CR2=0.39480 pF,CB1=19.395 pF,and CB2=9.4204 pF

Gains of amplifiers b1 and b2 as weighting amplifiers in a charge supply potential weighting unit are set as follows: B1=2, B2=1, A1=3, and A2=−3.

FIGS. 34(a) and 34(b) show comparison between a calculation result and a SPICE-simulation result on a second-order Chebyshev characteristic. The horizontal axis in FIG. 34 represents frequency after frequency conversion. In FIG. 34, the solid lines represent calculation results for the numerator+denominator type, and the dotted lines represent a calculation result for the denominator type for reference.

DC (0 Hz) in FIG. 34 corresponds to frequency LO. It is noted that the calculation and the simulation were conducted by assuming that frequency LO was 1.5 GHz. The simulation was conducted using ideal TA 120, the switches, and the capacitors in the configuration of discrete-time analog circuit 1600 shown in FIG. 31. Furthermore, for a second-order Chebyshev characteristic, the values of history capacitors CH and rotating capacitors CR were set equal to each other so that a ripple due to the Chebyshev characteristic clearly appears.

As seen from FIG. 34(a), it is demonstrated that the calculation result well agrees with the simulation result in a narrow band, and that discrete-time analog circuit 1600, which has the configuration shown in FIG. 31, operates as intended. In FIG. 34(b), in the denominator type, the simulation result deviates from the Chebyshev transfer function determined in bilinear transform in the vicinity of one-half the sampling frequency. In the numerator+denominator type, however, the calculation result agrees with the simulation result even in a broadband characteristic when a higher-order numerator of the transfer function is used.

As described above, the discrete-time analog circuit according to the present embodiment can provide each of the numerator and the denominator of the transfer function with a polynomial having optional order coefficients, whereby a broadband and steep characteristic is achieved. In the present embodiment, since a polynomial having optional order coefficients is provided not only in the denominator but also in the numerator, the number and the values of poles of the transfer function can be optionally set, whereby the degree of freedom in designing a filter can be increased.

Furthermore, in a method for providing the numerator with a second-order polynomial, any of the charge sharing type, the potential holding type, and the combination thereof can be used. In a method for providing the denominator with a second-order polynomial, the upstream type or the downstream type can be used. The difference in transfer function will be described when an n-th-order transfer function is described.

The configuration shown in FIG. 31 allows not only frequency conversion based on charge sampling but also filtering expressed by a transfer function whose numerator and denominator are each formed of a second-order polynomial having optional coefficients.

The configuration shown in FIG. 32 allows filtering expressed by a transfer function whose numerator and denominator are each formed of a second-order polynomial having optional coefficients.

Furthermore, in the present embodiment, a second-order filter function (such as Butterworth characteristic and Chebyshev characteristic) can be achieved by providing each of the numerator and the denominator with a second-order polynomial having optional coefficients, whereby a broadband filter characteristic can be achieved.

As described above, the discrete-time analog circuit according to the present embodiment allows filtering expressed by a transfer function whose numerator and denominator each have a second-order term having optional coefficients.

Embodiment 6

Embodiment 5 has been described with reference to a second-order numerator+denominator-type discrete-time analog circuit. The present embodiment will be described with reference to an n-th-order numerator+denominator-type discrete-time analog circuit.

Figure 35:
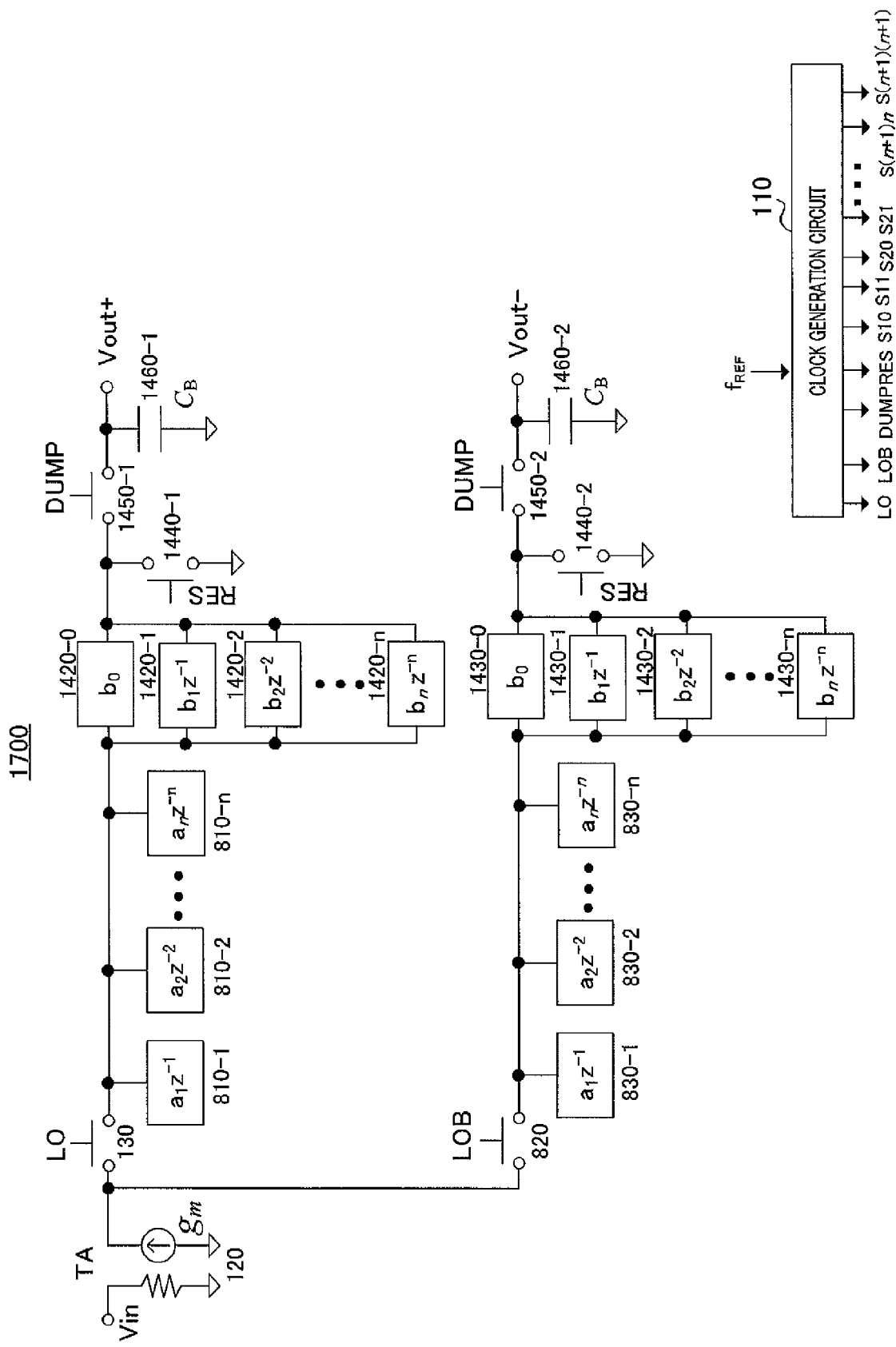
FIG. 35 shows a configuration diagram of an n-th-order discrete-time analog circuit according to Embodiment 6.

FIG. 35 is a block diagram showing an example of a key configuration of a discrete-time analog circuit according to the present embodiment. In FIG. 35, discrete-time analog circuit 1700 corresponds to discrete-time analog circuit 13 shown in FIG. 7 and forms a sampling mixer having a transfer function whose denominator and numerator each have n-th-order coefficients. In discrete-time analog circuit 1700 shown in FIG. 35, components common to those shown in FIGS. 21 and 30 are assigned the same reference characters as those shown in FIGS. 21 and 30, and the descriptions thereof will be omitted.

Discrete-time analog circuit 1700 shown in FIG. 35 includes clock generation circuit 110, TA 120, sampling switches 130 and 820, denominator-type coefficient circuits 810-$k$ and 820, numerator-type coefficient circuits 1420-$k$ and 1430-$k$, reset switches 1440-1 and 1440-2, dump switches 1450-1 and 1450-2, and buffer capacitors (CBs) 1460-1 and 1460-2.

As described above, discrete-time analog circuit 1700 includes numerator-type coefficient circuits 1420-$k$ and 1430-$k$ (k=0 to n), each of which is formed of rotating capacitors. Discrete-time analog circuit 1700 further includes denominator-type coefficient circuits 810-$k$ and 830-$k$ (k=1 to n), each of which is formed of history capacitors. Thus configured discrete-time analog circuit 1700 provides each of the denominator and the numerator with an n-th-order polynomial.

Based on the descriptions provided above, the charge sharing operation in discrete-time analog circuit 1700 is based on a combination of the n-th-order numerator type and the n-th-order upstream denominator type.

When the numerator is formed of a combination of the charge sharing type and the potential holding type (including charge sharing type and potential holding type), for example, let kci (i=1 to l) be k of a charge-sharing-type coefficient circuit and khj (j=1 to n+1−l) be k of a potential-holding-type coefficient circuit. In this case, when the denominator is of upstream type, a difference equation that describes the operation is expressed as follows:

(Equation 59)

$$q_{in}(n) + \sum_{k=1}^{n} A_k C_{Hk} v_1(n-kN) = \left( \sum_{i=1}^{l} C_{Rkci} + \sum_{i=1}^{n} C_{Hk} \right) v_1(n) \quad [59]$$

(Equation 60)

$$\sum_{i=0}^{l} C_{Rkci} v_1(n-kciN) + \sum_{j=1}^{n+1-l} B_{khj} C_{Rkhj} v_1(n-khjN) + C_B v_{out}(n-N) = \left( \sum_{k=0}^{n} C_{Rk} + C_B \right) v_{out}(n). \quad [60]$$

Performing z transform on equation 60 and organizing the result derives a transfer function expressed by the following equation:

(Equation 61)

$$\frac{V_{out}}{V_{in}} = \frac{g_m T_{LO}}{\pi} \cdot \frac{1-z^{-N}}{1-z^{-1}} \cdot \frac{1 / \left( \sum_{k=0}^{n} C_{Rk} + C_B \right)}{1 - \left\{ C_B / \left( \sum_{k=0}^{n} C_{Rk} + C_B \right) \right\} z^{-N}} \cdot T_{IIR} \quad [61]$$

(Equation 62)

$$T_{IIR} = \frac{\left( \sum_{i=1}^{l} C_{Rkci} z^{-kciN} + \sum_{j=1}^{n+1-l} B_{khj} C_{Rkhj} z^{-khjN} \right) \left( \sum_{ci=1}^{l} C_{Rkci} + \sum_{k=1}^{n} C_{Hk} \right)}{\sum_{i=1}^{l} C_{Rkci} + \sum_{k=1}^{n} C_{Hk} - \sum_{k=1}^{n} A_k C_{Hk} z^{-kN}} \quad [62]$$

The discrete-time analog circuit according to the present embodiment can provide each of the numerator and the denominator of the transfer function with a polynomial having optional order coefficients, as indicated by equations 61 and 62, whereby the degree of freedom in designing a filter can be increased.

Figure 36:
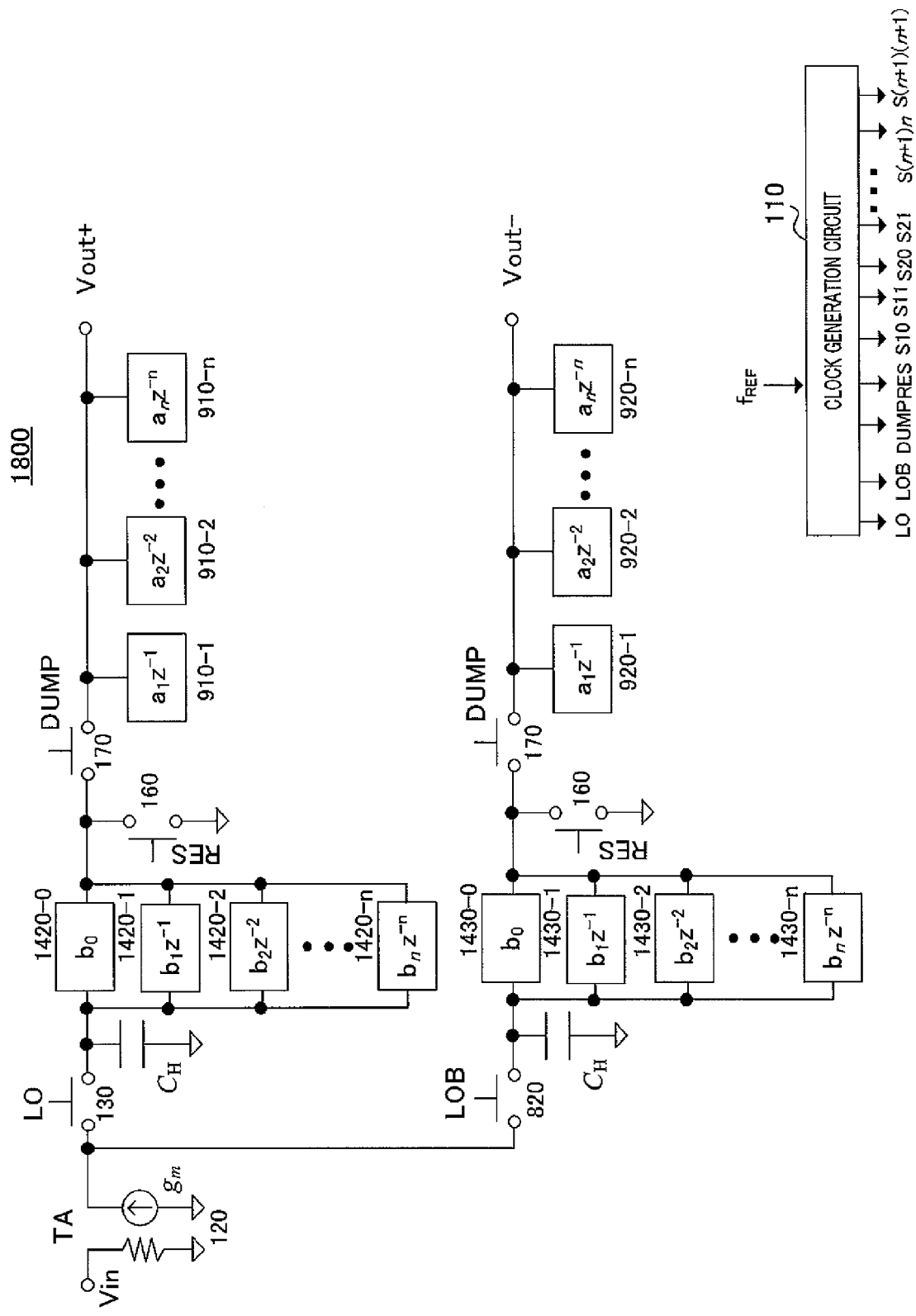
FIG. 36 shows another configuration diagram of the n-th-order discrete-time analog circuit according to Embodiment 6.

FIG. 36 is a block diagram showing an example of another key configuration of the discrete-time analog circuit according to the present embodiment. In FIG. 36, discrete-time analog circuit 1800 corresponds to the discrete-time analog circuit 13 shown in FIG. 7 and forms a sampling mixer having a transfer function whose numerator and denominator each have n-th-order coefficients. In discrete-time analog circuit 1800 shown in FIG. 36, components common to those in FIG. 35 are assigned the same reference numerals as those in FIG. 35, and the descriptions thereof will be omitted.

As described above, discrete-time analog circuit 1800 includes numerator-type coefficient circuits 1420-$k$ and 1430-$k$ ($k$=0 to n), each of which is formed of rotating capacitors. Discrete-time analog circuit 1800 further includes numerator-type coefficient circuits 910-$k$ and 920-$k$ ($k$=1 to n), each of which is formed of buffer capacitors, whereby each of the denominator and the numerator can be provided with an n-th-order polynomial.

Based on the descriptions provided above, the charge sharing operation in discrete-time analog circuit 1800 is based on a combination of the n-th-order numerator type and the n-th-order downstream denominator type.

When the numerator is formed of a combination of the charge sharing type and the potential holding type (including charge sharing type and potential holding type), for example, let kci (i=1 to l) be k of a charge-sharing-type coefficient circuit and khj (j=1 to n+1−l) be k of a potential-holding-type coefficient circuit. In this case, when the denominator is of downstream type, a difference equation that describes the operation is expressed as follows:

(Equation 63)

$$q_{in}(n) + C_H v_1(n-N) = \left(\sum_{i=1}^{l} C_{Rkci} + C_H\right) v_1(n) \quad [63]$$

(Equation 64)

$$\sum_{i=1}^{l} C_{Rkci} v_1(n - kciN) + \sum_{j=1}^{n+1-l} B_{khj} C_{Rkhj} v_1(n - khjN) + \sum_{k=1}^{n} A_k C_{Bk} v_{out}(n - kN) = \left(\sum_{k=0}^{n} C_{Rk} + \sum_{k=1}^{n} C_{Bk}\right) v_{out}(n) \quad [64]$$

Performing z transform on equation 64 and organizing the result derives a transfer function expressed by the following equation:

(Equation 65)

$$\frac{V_{out}}{V_{in}} = \frac{g_m T_{LO}}{\pi} \cdot \frac{1 - z^{-N}}{1 - z^{-1}} \cdot \frac{1}{\sum_{i=0}^{l} C_{Rkci} + C_H(1 - z^{-N})} \cdot T_{IIR} \quad [65]$$

(Equation 66)

$$T_{IIR} = \frac{\sum_{i=1}^{l} C_{Rkci} z^{-kciN} + \sum_{j=1}^{n+1-l} B_{khj} C_{Rkhj} z^{-khjN}}{\sum_{k=1}^{n} C_{Rk} + \sum_{k=1}^{n} C_{Bk} - \sum_{k=1}^{n} A_k C_{Bk} z^{-kn}} \quad [66]$$

The discrete-time analog circuit according to the present embodiment can provide each of the numerator and the denominator of the transfer function with a polynomial having optional order coefficients, as indicated by equations 65 and 66. That is, in the present embodiment, since the zero and poles can be freely set, the degree of freedom in designing a filter can be increased.

The above description has been made with reference to the case where the order of each of the numerator and the denominator is n. However, the numerator and the denominator do not necessarily have the same number of order coefficients. The discrete-time analog circuit according to the present embodiment can include m numerator-type coefficient circuits and n denominator-type coefficient circuits and use a transfer function having an m-th-order numerator and an n-th-order denominator, where n and m are each an integer greater than or equal to zero. A denominator-type coefficient circuit of n=0 corresponds to a single capacitor (e.g., CH or CB) with no potential holding circuit.

The configurations shown in FIGS. 35 and 36 allow not only frequency conversion based on charge sampling but also filtering expressed by a transfer function whose numerator and denominator are each formed of an n-th-order polynomial having optional coefficients. The configurations shown in FIGS. 35 and 36 differ from each other in that the denominator-type coefficient circuit is connected or not at the time of charge sampling for the frequency conversion, and it is believed that the difference affects noise and linearity.

As described above, the discrete-time analog circuit according to the present embodiment allows filtering which is expressed by a transfer function whose numerator and denominator are each formed of an n-th-order polynomial having optional coefficients and in which the zero and poles of the transfer function can be optionally set.

Embodiment 7

The present embodiment will be described with reference to a discrete-time analog circuit that provides higher-order optional coefficients by connecting the discrete-time analog circuit described in any of the above embodiments in cascade.

[Cascade Connection: n-th-order Numerator+Denominator, Upstream Sampling Filter, n-th-order Numerator+Denominator, Downstream Sampling Filter]

Basic components used in the cascade connection will first be described.

Figure 37:
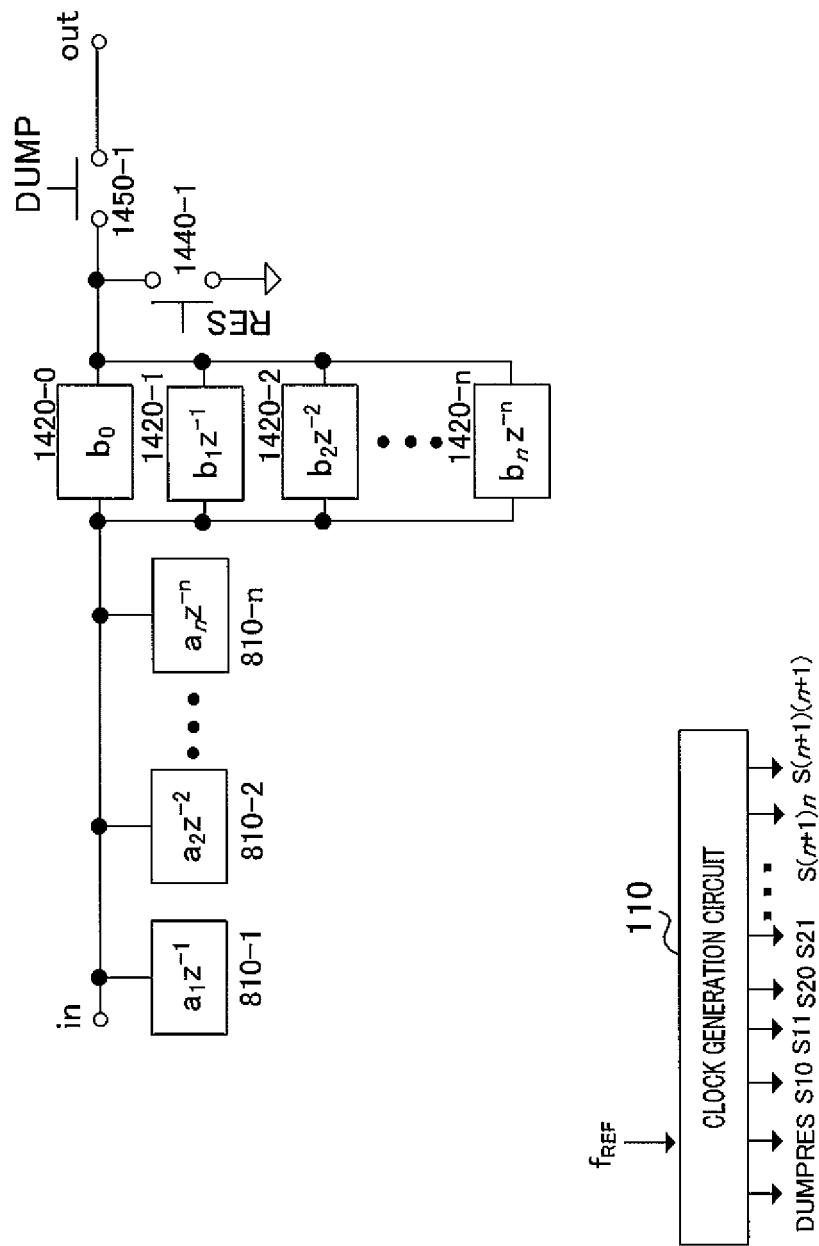
FIG. 37 shows a configuration diagram of a discrete-time analog circuit according to Embodiment 7.
Figure 38:
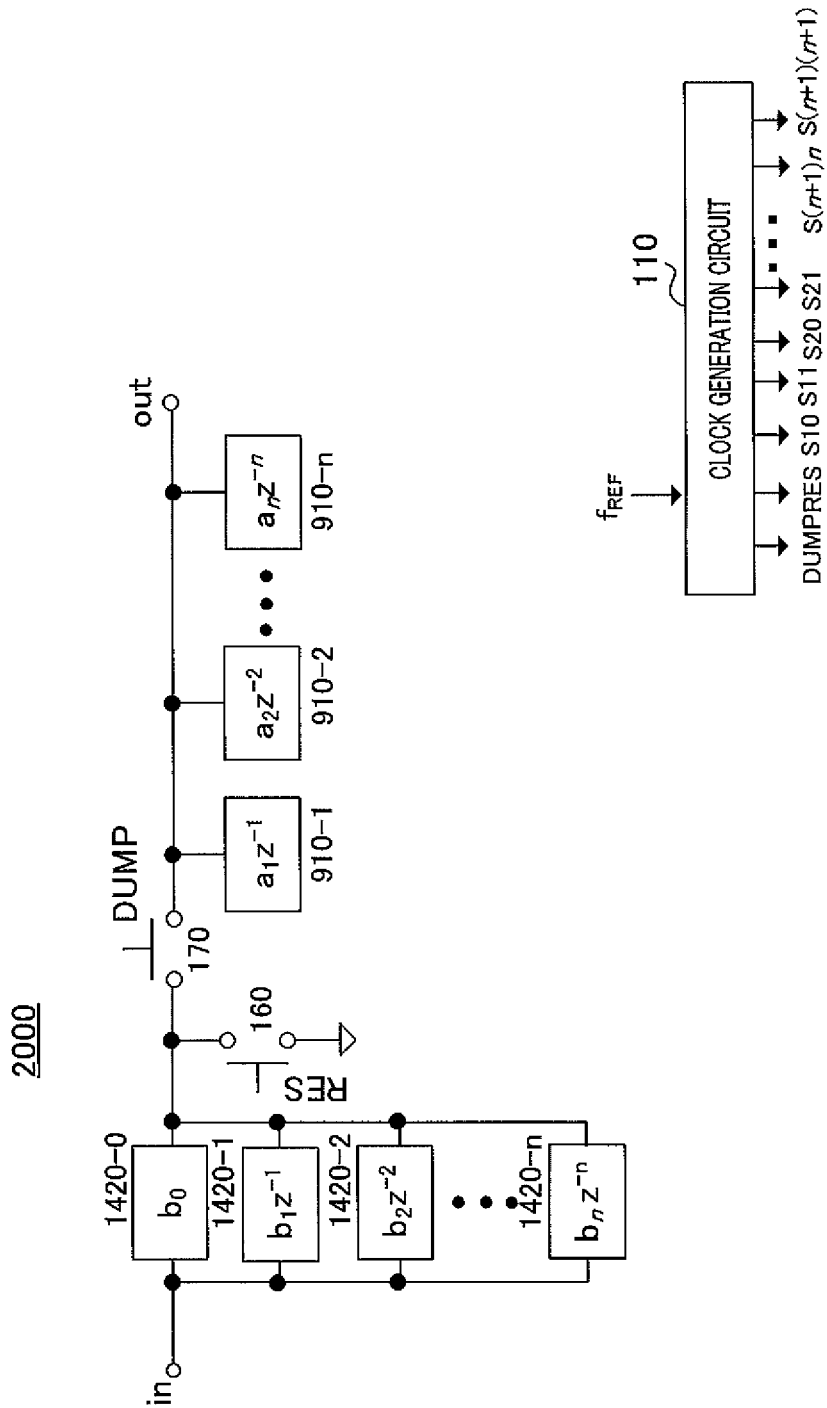
FIG. 38 shows another configuration diagram of the discrete-time analog circuit according to Embodiment 7.

The basic components may include the n-th-order, upstream sampling filter shown in FIG. 37 and the n-th-order, downstream sampling filter shown in FIG. 38.

FIG. 37 is a block diagram showing an example of another key configuration of the discrete-time analog circuit according to the present embodiment. In FIG. 37, discrete-time analog circuit 1900 forms a sampling filter having transfer function whose numerator and denominator each have n-th-order coefficients. In discrete-time analog circuit 1900 shown in FIG. 37, components common to those of discrete-time analog circuit 1700 shown in FIG. 35 are assigned the same reference numerals as those in FIG. 35, and the descriptions thereof will be omitted. Discrete-time analog circuit 1900 shown in FIG. 37 differs from discrete-time analog circuit 1700 shown in FIG. 35 in that TA 120 and CBs 1460 are omitted.

As described above, discrete-time analog circuit 1900 shown in FIG. 37 includes numerator-type coefficient circuits 1420-0 to 1420-$n$, each of which is formed of rotating capacitors, and denominator-type coefficient circuits 810-1 to 810-$n$. Thus configured discrete-time analog circuit 1900 provides each of the numerator and the denominator with an n-th-order polynomial.

FIG. 38 is a block diagram showing an example of another key configuration of the discrete-time analog circuit according to the present embodiment. In FIG. 38, discrete-time analog circuit 2000 forms a sampling filter having a transfer function whose numerator and denominator each have n-th-order coefficients. In discrete-time analog circuit 2000 shown in FIG. 38, components common to those of discrete-time analog circuit 1800 shown in FIG. 36 are assigned the same reference characters as those in FIG. 36, and the descriptions thereof will be omitted. Discrete-time analog circuit 2000 shown in FIG. 38 differs from discrete-time analog circuit 1800 shown in FIG. 36 in that TA 120 and CBs 1460 are omitted.

As described above, discrete-time analog circuit 2000 includes numerator-type coefficient circuits 1420-0 to 1420-n, each of which is formed of rotating capacitors, and denominator-type coefficient circuits 910-1 to 910-n. Thus configured discrete-time analog circuit 2000 provides each of the numerator and the denominator with an n-th-order polynomial.

Figure 39:
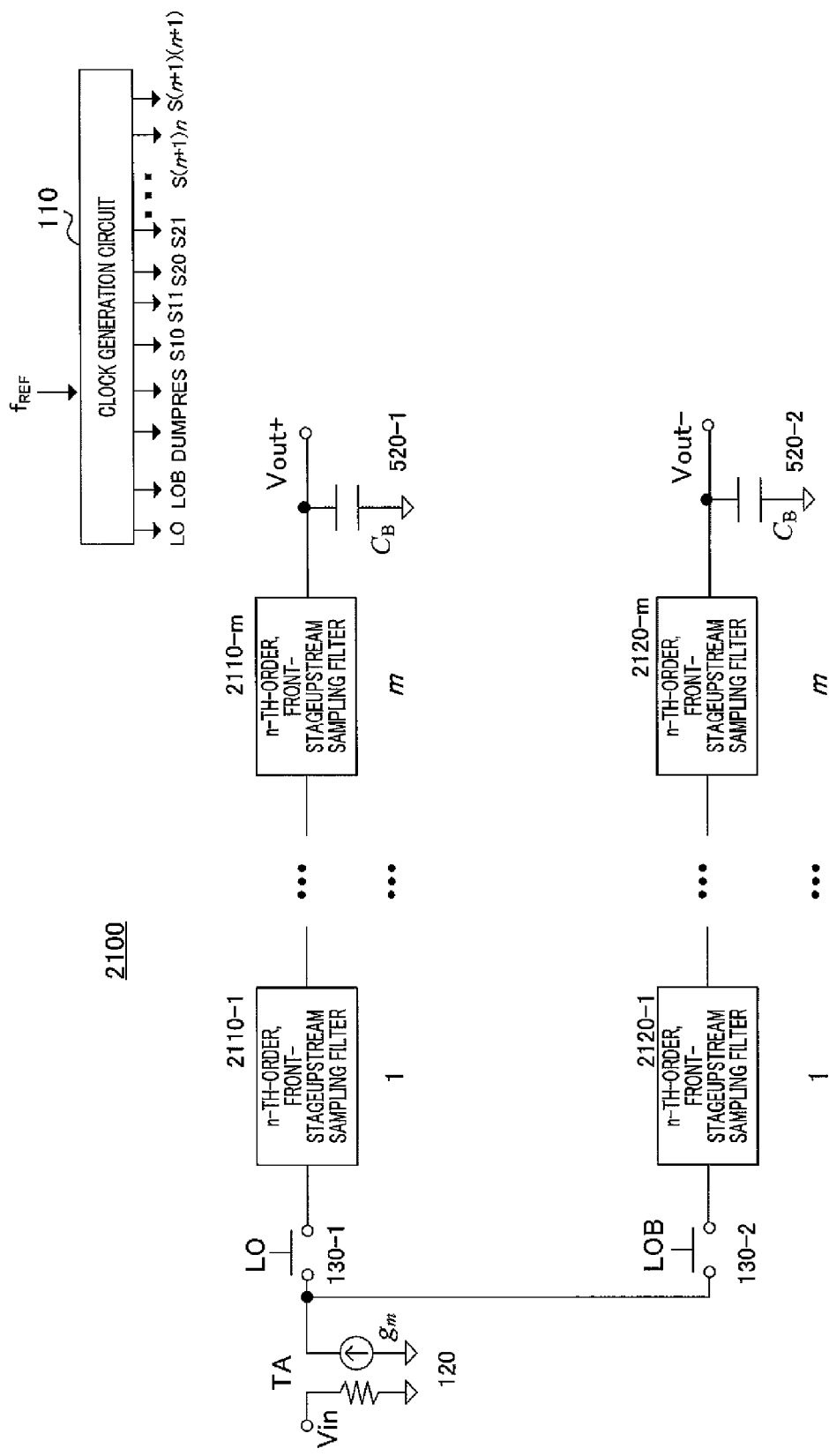
FIG. 39 shows still another configuration diagram of the discrete-time analog circuit according to Embodiment 7.

FIG. 39 is a block diagram showing an example of a key configuration of the discrete-time analog circuit according to the embodiment. In FIG. 39, discrete-time analog circuit 2100 has a configuration in which discrete-time analog circuit 1900 (i.e., n-th-order, upstream sampling filter) shown in FIG. 37 is provided at m locations (2110-1 to 2110-m) downstream of the output of TA 120 and connected to each other. Furthermore, discrete-time analog circuit 2100 has a configuration in which buffer capacitors 520 are connected to the output of discrete-time analog circuit 2100. A differential, opposite-phase system is connected to sampling switch 130-2.

[Operation of Discrete-Time Analog Circuit 2100]

Based on the descriptions provided above, the charge sharing operation of discrete-time analog circuit 2100 is based on the n-th-order numerator type and the n-th-order, upstream denominator type connected in cascade to form a plurality of stages.

In each of the stages 1 to m, when the numerator is formed of a combination of the charge sharing type and the potential holding type, for example, let kci (i=1 to l) be k of a charge-sharing-type coefficient circuit and khj (j=1 to n+1−l) be k of a potential-holding-type coefficient circuit. The combination means that l=n+1 always corresponds to the charge sharing type, and l=0 always corresponds to the potential holding type. In this configuration, when the denominator is of upstream type, a difference equation that describes the operation is expressed as below. It is noted that m representing the number of stages is added as a subscript to each element name (CRmk, CBmk).

(Equation 67)

$$q_{in}(n) + \sum_{k=1}^{n} A_{1k} C_{H1k} v_1(n-kN) = \left(\sum_{i=1}^{l} C_{R1kci} + \sum_{k=1}^{n} C_{H1k}\right) v_1(n) \quad [67]$$

(Equation 68)

$$\sum_{i=1}^{l} C_{R1kci} v_1(n-kciN) + \sum_{j=1}^{n+1-l} B_{1khj} C_{R1khj} v_1(n-khjN) + \sum_{k=1}^{n} A_{2k} C_{H2k} v_2(n-kN) = \left(\sum_{k=0}^{n} C_{R1k} + \sum_{i=1}^{l} C_{R2kci} + \sum_{k=1}^{n} C_{H2k}\right) v_2(n) \quad [68]$$

(Equation 69)

$$\sum_{i=1}^{l} C_{R2kci} v_2(n-kciN) + \sum_{j=1}^{n+1-l} B_{2khj} C_{R2khj} v_2(n-khjN) + \sum_{k=1}^{n} A_{3k} C_{H3k} v_3(n-kN) = \left(\sum_{k=0}^{n} C_{R2k} + \sum_{i=1}^{l} C_{R3kci} + \sum_{k=1}^{n} C_{H3k}\right) v_3(n) \quad [69]$$

...

$$\sum_{i=1}^{l} C_{Rmkci} v_m(n-kciN) + \sum_{j=1}^{n+1-l} B_{mkhj} C_{Rmkj} v_m(n-khjN) + C_B v_{out}(n-N) = \left(\sum_{k=0}^{n} C_{Rk} + C_B\right) v_{out}(n)$$

Performing z transform equations 68 and 69 and organizing the results derives a transfer function expressed by the following equation:

(Equation 70)

$$\frac{V_{out}}{V_{in}} = \frac{g_m T_{LO}}{\pi} \cdot \frac{1-z^{-N}}{1-z^{-1}} \cdot \frac{1 / \left(\sum_{k=0}^{n} C_{Rk} + C_B\right)}{1 - \left\{C_B / \left(\sum_{k=0}^{n} C_{Rk} + C_B\right)\right\} z^{-N}} \cdot T_{IIR} \quad [70]$$

(Equation 71)

$$T_{IIR} = \frac{\sum_{i=1}^{l} C_{R1kci} z^{-kciN} + \sum_{j=1}^{n+1-l} B_{1khj} C_{R1khj} z^{-khjN}}{\sum_{i=1}^{l} C_{R1kci} + \sum_{k=1}^{n} C_{H1k} - \sum_{k=1}^{n} A_{1k} C_{H1k} z^{-N}} \cdot \prod_{p=2}^{m} \frac{\sum_{i=1}^{l} C_{Rpkci} z^{-kciN} + \sum_{j=1}^{n+1-l} B_{pkhj} C_{Rpkhj} z^{-khjN}}{\sum_{k=0}^{n} C_{R(p-1)k} + \sum_{i=1}^{l} C_{Rpkci} + \sum_{k=1}^{n} C_{Hpk} - \sum_{k=1}^{n} A_{pk} C_{Hpk} z^{-kN}} \quad [71]$$

Figure 40:
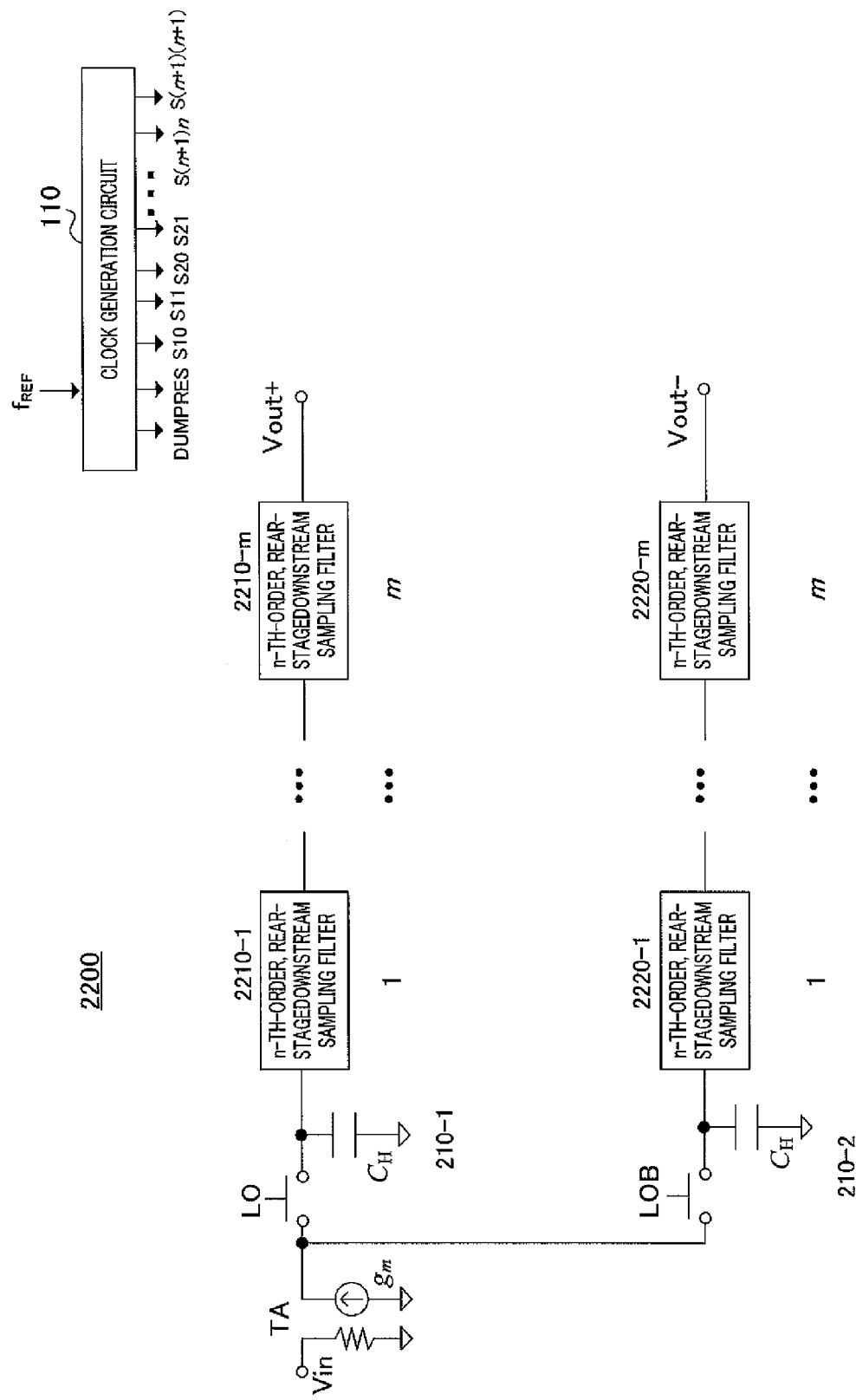
FIG. 40 shows still another configuration diagram of the discrete-time analog circuit according to Embodiment 7.

FIG. 40 is a block diagram showing an example of a key configuration of the discrete-time analog circuit according to the present embodiment. Discrete-time analog circuit 2200 shown in FIG. 40 has a configuration in which discrete-time analog circuit 2000 shown in FIG. 38 (n-th-order, downstream sampling filter) is provided at m−1 locations (2210-1 to 2210-m) downstream of the output of discrete-time analog circuit 1800 shown in FIG. 36 and connected to each other. A differential, opposite-phase system is connected to sampling switch 130-2.

[Operation of Discrete-Time Analog Circuit 2200]

Based on the descriptions provided above, the charge sharing operation of discrete-time analog circuit 2200 is based on the n-th-order numerator type and the n-th-order, downstream denominator type connected in cascade to form a plurality of stages.

In each of the stages 1 to m, when the numerator is formed of a combination of the charge sharing type and the potential holding type, for example, let kci (i=1 to l) be k of a charge-sharing-type coefficient circuit and khj (j=1 to n+1−l) be k of a potential-holding-type coefficient circuit. The combination means that l=n+1 always corresponds to the charge sharing type, and l=0 always corresponds to the potential holding type. In this configuration, when the denominator is of upstream type, a difference equation that describes the operation is as follows:

(Equation 72)

$$q_{in}(n) + C_H v_1(n-N) = \left(\sum_{i=1}^{l} C_{R1kci} + C_H\right) v_1(n) \quad [72]$$

(Equation 73)

$$\sum_{i=1}^{l} C_{R1kci} v_1(n-kciN) + \sum_{j=1}^{n+1-l} B_{1khj} C_{R1kj} v_1(n-khjN) + \quad [73]$$

$$\sum_{k=1}^{n} A_{1k} C_{B1k} v_2(n-kN) = \left(\sum_{k=0}^{n} C_{R1k} + \sum_{i=1}^{l} C_{R2kci} + \sum_{k=1}^{n} C_{B1k}\right) v_2(n)$$

(Equation 74)

$$\sum_{i=1}^{l} C_{R2kci} v_2(n-kciN) + \quad [74]$$

$$\sum_{j=1}^{n+1-l} B_{2khj} C_{R2kj} v_2(n-khjN) + \sum_{k=1}^{n} A_{2k} C_{B2k} v_3(n-kN) =$$

$$\left(\sum_{k=0}^{n} C_{R2k} + \sum_{i=1}^{l} C_{R3kci} + \sum_{k=1}^{n} C_{B2k}\right) v_3(n)$$

...

$$\sum_{i=1}^{l} C_{Rmkci} v_m(n-kciN) + \sum_{k=1}^{n+1-l} B_{mkhj} C_{Rmkj} v_m(n-khjN) +$$

$$\sum_{k=1}^{n} A_{mk} C_{Bmk} v_{out}(n-kN) = \left(\sum_{k=0}^{n} C_{Rk} + C_B\right) v_{out}(n)$$

Performing z transform on equations 73 and 74 and organizing the results derives a transfer function expressed as follows:

(Equation 75)

$$\frac{V_{out}}{V_{in}} = \frac{g_m T_{LO}}{\pi} \cdot \frac{1-z^{-N}}{1-z^{-1}} \cdot \frac{1 / \left(\sum_{i=1}^{l} C_{R1kci} + C_H\right)}{1 - \left\{C_H / \left(\sum_{i=1}^{l} C_{R1kci} + C_H\right)\right\} z^{-N}} \cdot T_{IIR} \quad [75]$$

(Equation 76)

$$T_{IIR} = \frac{\left(\sum_{i=1}^{l} C_{Rmkci} + \sum_{j=1}^{n+1-l} B_{mkhj} C_{Rmkj} z^{-khiN}\right)}{\left(\sum_{k=0}^{n} C_{Rk} + C_B - \sum_{k=1}^{n} A_{mk} C_{Bmk} z^{-kN}\right)} \cdot \quad [76]$$

$$\prod_{p=2}^{m} \frac{\left(\sum_{i=1}^{l} C_{R(m-1)kci} z^{-kciN} + \sum_{j=1}^{n+1-l} B_{(m-1)khj} C_{R(m-1)kj} z^{-khiN}\right)}{\left(\sum_{k=0}^{n} C_{R(m-1)k} z^{-kciN} + \sum_{i=1}^{l} C_{Rmkci} + \sum_{k=1}^{n} C_{B(m-1)k} - \sum_{k=1}^{n} A_{(m-1)k} C_{B(m-1)k} z^{-kN}\right)}$$

Equations 75 and 76 show that the discrete-time analog circuit according to the present embodiment has m n-th-order numerator+denominator transfer functions connected in cascade.

The above description has been made with reference to the case where the order of each of the numerator and the denominator is n. The numerator and the denominator do not necessarily have the same order number. In the present embodiment, l numerator-type coefficient circuit and n denominator-type coefficient circuits can be provided, and a transfer function having an l-th-order numerator and an n-th-order denominator can be used, where l and n are each an integer greater than or equal to zero. A denominator-type coefficient circuit of n=0 corresponds to a single capacitor (CH or CB) with no potential holding circuit.

[Example of Achievement of Higher-Order Chebyshev Characteristic]

Let us consider a method for achieving a higher-order Chebyshev characteristic in the following description. An example of achieving a fourth-order Chebyshev characteristic is presented below.

First, let us consider a circuit having the configuration shown in FIG. 40 under the following conditions: the number m of stages connected in cascade is 2; each stage is of second-order, numerator+denominator type; and the numerator is of "charge sharing type when k=0 and potential holding type when k=1, 2."

A difference equation that describes the operation is as follows:

[77]

$$q_{in}(n)+C_H v_1(n-N)=(C_{R1}+C_H)v_1(n) \quad \text{(Equation 77)}$$

[78]

$$C_{R1}v_1(n)+B_{11}C_{R11}v_1(n-N)+B_{12}C_{R12}v_1(n-2N)+ \\ A_{11}C_{B11}v_2(n-N)+A_{12}C_{B12}v_2)(n-2N)=(C_{R1}+ \\ C_{R11}+C_{R12}+C_{B11}+C_{B12})v_2(n) \quad \text{(Equation 78)}$$

[79]

$$B_{20}C_{R2}v_2(n)+B_{21}C_{R21}v_2(n-N)+B_{22}C_{R22}v_2(n-2N)+ \\ A_{21}C_{B21}v_{out}(n-N)+A_{22}C_{B22}v_{out}(n-2N)=(C_{R2}+ \\ C_{R21}+C_{R22}+C_{B21}+C_{B22})v_{out}(n) \quad \text{(Equation 79)}$$

Performing z transform on equations 78 and 79 and organizing the results derives an overall transfer function expressed by the following equation:

(Equation 80)

$$\frac{V_{out}}{V_{in}} = \frac{g_m T_{LO}}{\pi} \cdot \frac{1-z^{-N}}{1-z^{-1}} \cdot \frac{1}{C_{R1}+C_H(1-z^{-N})} \cdot T_{IIR} \quad [80]$$

(Equation 81)

$$T_{IIR} = \frac{C_{R1}+B_{11}C_{R11}z^{-N}+B_{12}C_{R12}z^{-2N}}{C_{R1}+C_{R11}+C_{R12}+C_{B11}+} \cdot \quad [81]$$
$$C_{B12}-A_{11}C_{B11}z^{-N}-A_{12}C_{12}z^{-2N}$$

$$\frac{C_{R2}+B_{21}C_{R21}z^{-N}+B_{22}C_{R22}z^{-2N}}{C_{R2}+C_{R21}+C_{R22}+C_{B21}+}$$
$$C_{B22}-A_{21}C_{B21}z^{-N}-A_{22}C_{B22}z^{-2N}$$

In the following description, let us consider achieving a fourth-order Chebyshev characteristic by using the discrete-time analog circuit according to the present embodiment.

(Equation 82)

$$T = K \frac{1 + 2z^{-1} + z^{-2}}{1 + a_1 z^{-1} + a_2 z^{-2}} \cdot \frac{1 + 2z^{-1} + z^{-2}}{1 + a_3 z^{-1} + a_4 z^{-2}} \quad [82]$$

Coefficients for achieving the fourth-order Chebyshev characteristic are, for example, K=7.11384×10^(−8), a1=1.96454, a2=0.965153, a3=1.983570, and a4=0.985421.

In the present embodiment, transconductance gm of TA 120 and the values of the capacitors are set by comparing the coefficients in equation 67 and those in equation 65 as follows:

$gm$=2.91889×10^(−5)

$CR1=CR11=CR12$=0.234364 pF,$CB11$=19.6454 pF,$CB12$=9.65153 pF,$CR2=CR21=CR22$=0.103364 pF,$CB21$=1.98357 pF,and $CB22$=9.85421 pF The gains of the amplifiers in the coefficient circuits are set as follows: B11=B21=2; B12=B22=1; A11=A21=3; and A12=A22=−3.

Figure 41:
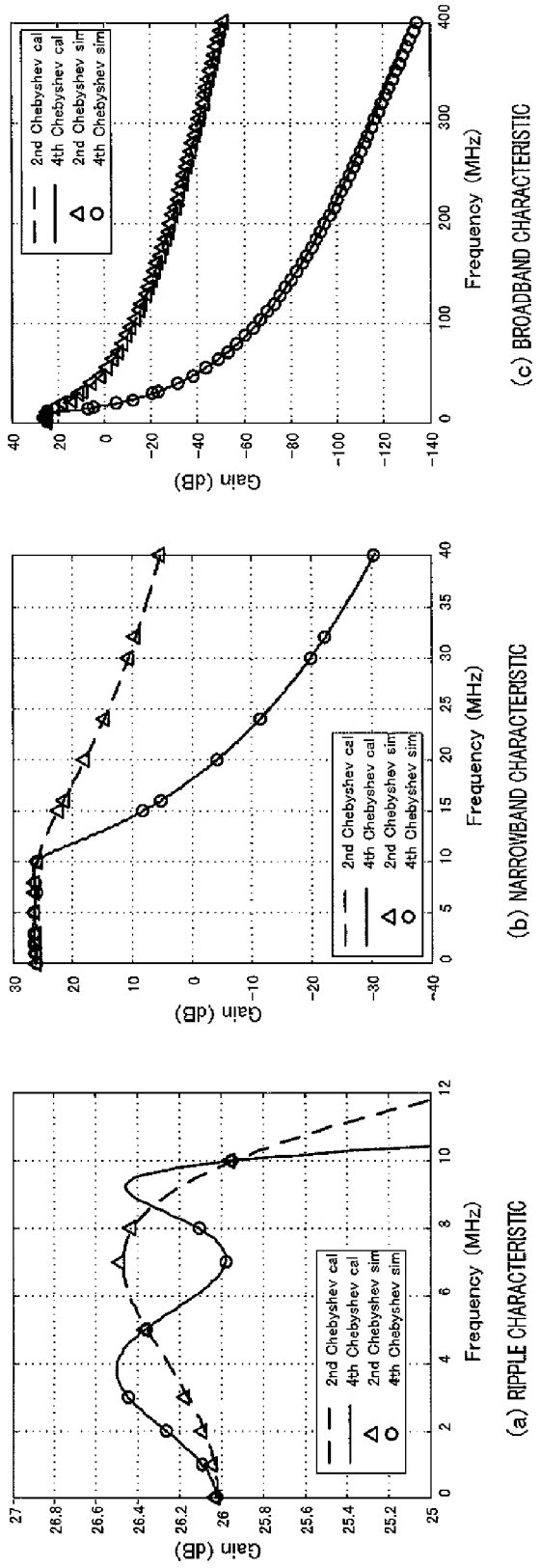
FIG. 41 is a characteristic diagram showing an example of a filter characteristic achieved by the discrete-time analog circuit according to Embodiment 7.

FIG. 41 shows comparison between a calculation result with a simulation result in the present embodiment on a transfer function having the fourth-order Chebyshev characteristic. FIG. 41(a) shows a ripple characteristic. FIG. 41(b) shows a narrowband characteristic. FIG. 41(c) shows a broadband characteristic. The horizontal axis of FIG. 41 represents frequency after frequency conversion. DC (0 Hz) in FIG. 41 corresponds to frequency LO. It is noted that the calculation and the simulation were conducted by assuming that frequency LO was 1.5 GHz. The simulation was conducted in the configuration of discrete-time analog circuit 1900 shown in FIG. 37, using ideal TA 120, switches, and capacitors. Furthermore, in the calculation of the transfer function having the fourth Chebyshev characteristic, the values of history capacitors CH and rotating capacitors CR were set equal to each other so that a ripple due to the Chebyshev characteristic clearly appears.

As seen from FIG. 41, the calculation result well agrees with the simulation result. That is, discrete-time analog circuit 2200 employs the configuration shown in FIG. 40, thereby achieving a higher-order Chebyshev characteristic and providing a broadband and steep filter characteristic.

FIG. 41 illustrates the Chebyshev characteristic. Alternatively, a more sophisticated filter characteristic, such as an elliptic-function-shaped filter characteristic, is supposedly provided by using the discrete-time analog circuit according to the present embodiment.

The configurations shown in FIGS. 37 and 38 allow filtering expressed by a transfer function whose numerator and denominator are each formed of an n-th-order polynomial having optional coefficients.

Moreover, the configurations shown in FIGS. 39 and 40 allow not only frequency conversion but also filtering that has a transfer function expressed in the form of integrating m transfer functions each having numerator and denominator each formed of an n-th-order polynomial having optional coefficients. The configurations shown in FIGS. 39 and 40 differ from each other in that the denominator-type coefficient circuit is connected or not at the time of charge sampling for the frequency conversion, and it is believed that the difference affects noise and linearity.

As described above, the discrete-time analog circuit according to the present embodiment allows filtering that has a transfer function expressed in the form of integrating m transfer functions each having a numerator and a denominator each provided with an n-th-order polynomial having optional coefficients and that includes arbitrarily settable zero and poles of the transfer function. As a result, the discrete-time analog circuit according to the present embodiment can provide a filter function of an optional order (such as Butterworth characteristic and the Chebyshev characteristic), whereby the degree of freedom in designing a filter in a discrete-time analog circuit can be greatly increased.

Embodiment 8

In the present embodiment, a description will be given of the configuration of the amplifier in the coefficient circuit described above.

[Source-Grounded Amplifier]

Figure 42:
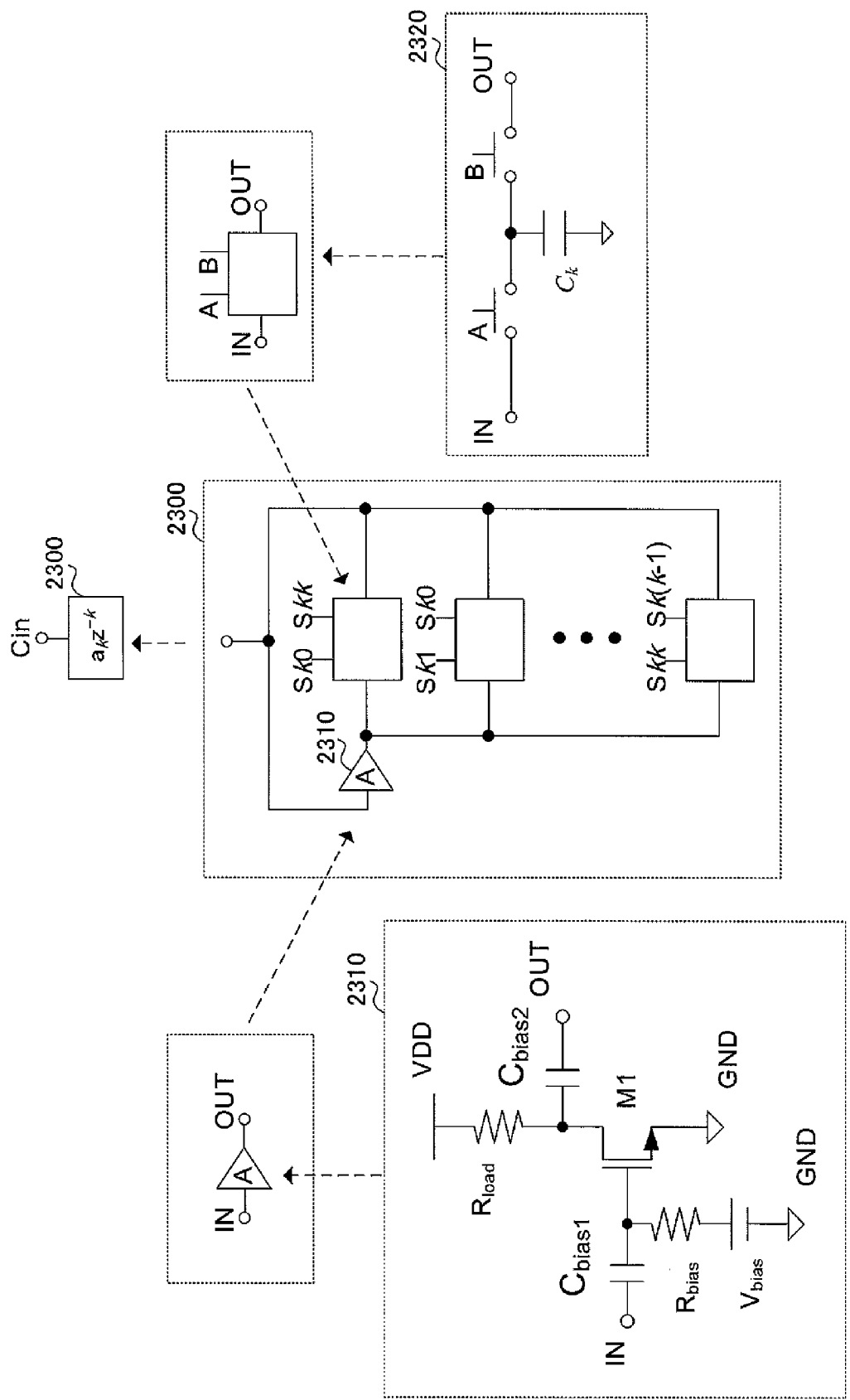
FIG. 42 shows a configuration diagram of a coefficient circuit according to Embodiment 8.

FIG. 42 shows an example of an inner configuration of coefficient circuit 2300 in which the amplifier is formed of a source-grounded amplifier.

[Configuration]

Coefficient circuit 2300 includes source-grounded amplifier 2310, connection switches, and capacitors.

Source-grounded amplifier 2310 includes a transistor (M1), a load resistor (Rload), and bias setting devices (Rbias, Cbias1, Cbias2, Vbias).

[Operation of Coefficient Circuit 2300]

When the transistor (M1) is biased so as to operate in a saturated region, the source-grounded amplifier can have a gain of −gmZload. Zload is a load formed of bias setting capacitance (Cbias1) and potential holding capacitance (Cbias2).

In the amplifier shown in FIG. 42 (i.e., source-grounded amplifier 2310), the potential of the gate of the transistor (M1) is biased by a DC power supply (i.e., Vbias) via a resistor (i.e., Rbias) having relatively large resistance. The capacitance (i.e., Cbias1, Cbias2) is provided at the input and the output for isolation from a switch bias point, but the capacitance is not always necessary. The bias setting capacitance needs to be much larger than the potential holding capacitance.

Figure 43:
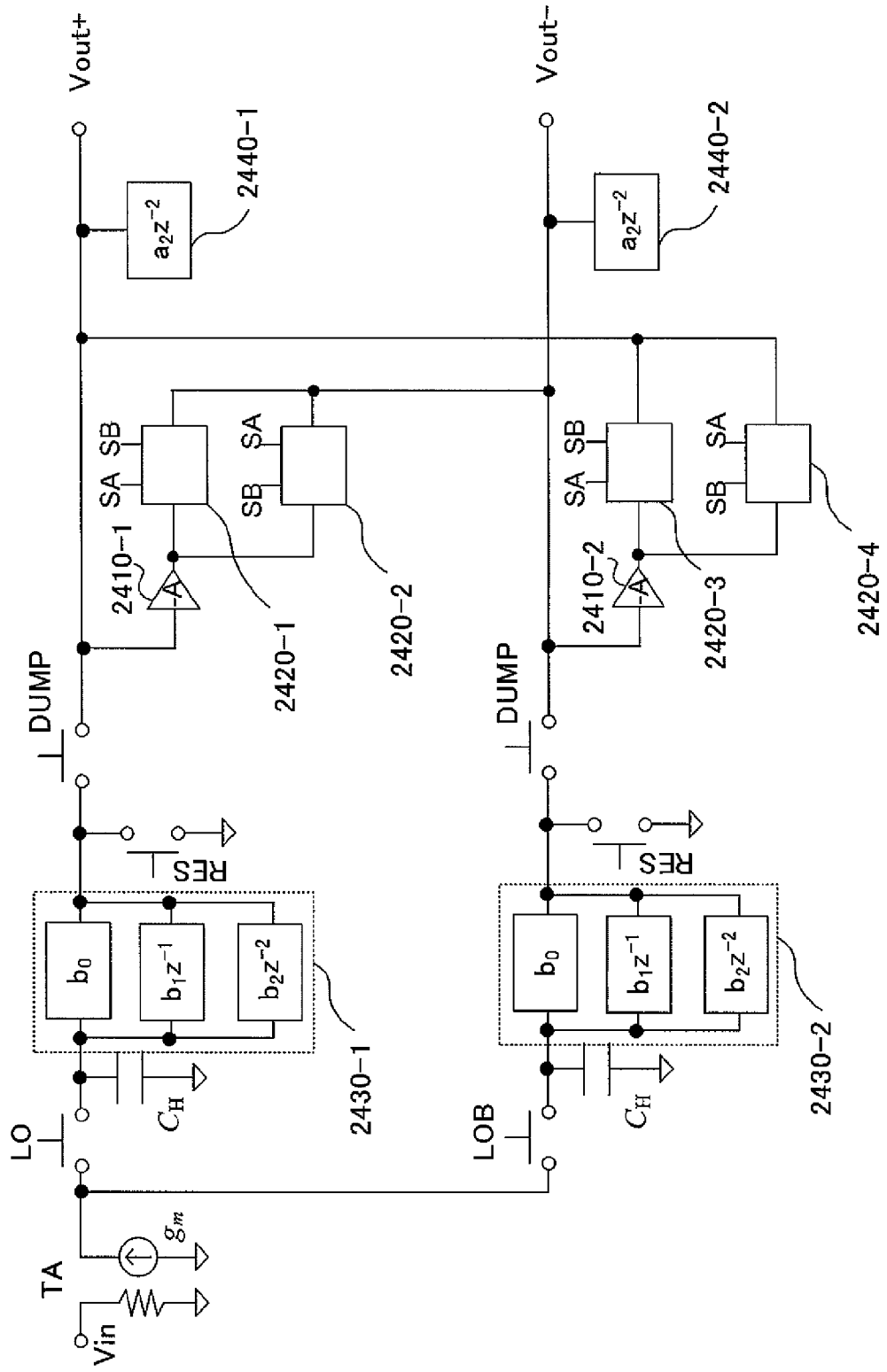
FIG. 43 shows a configuration diagram of circuit connection according to Embodiment 8.
Figure 44:
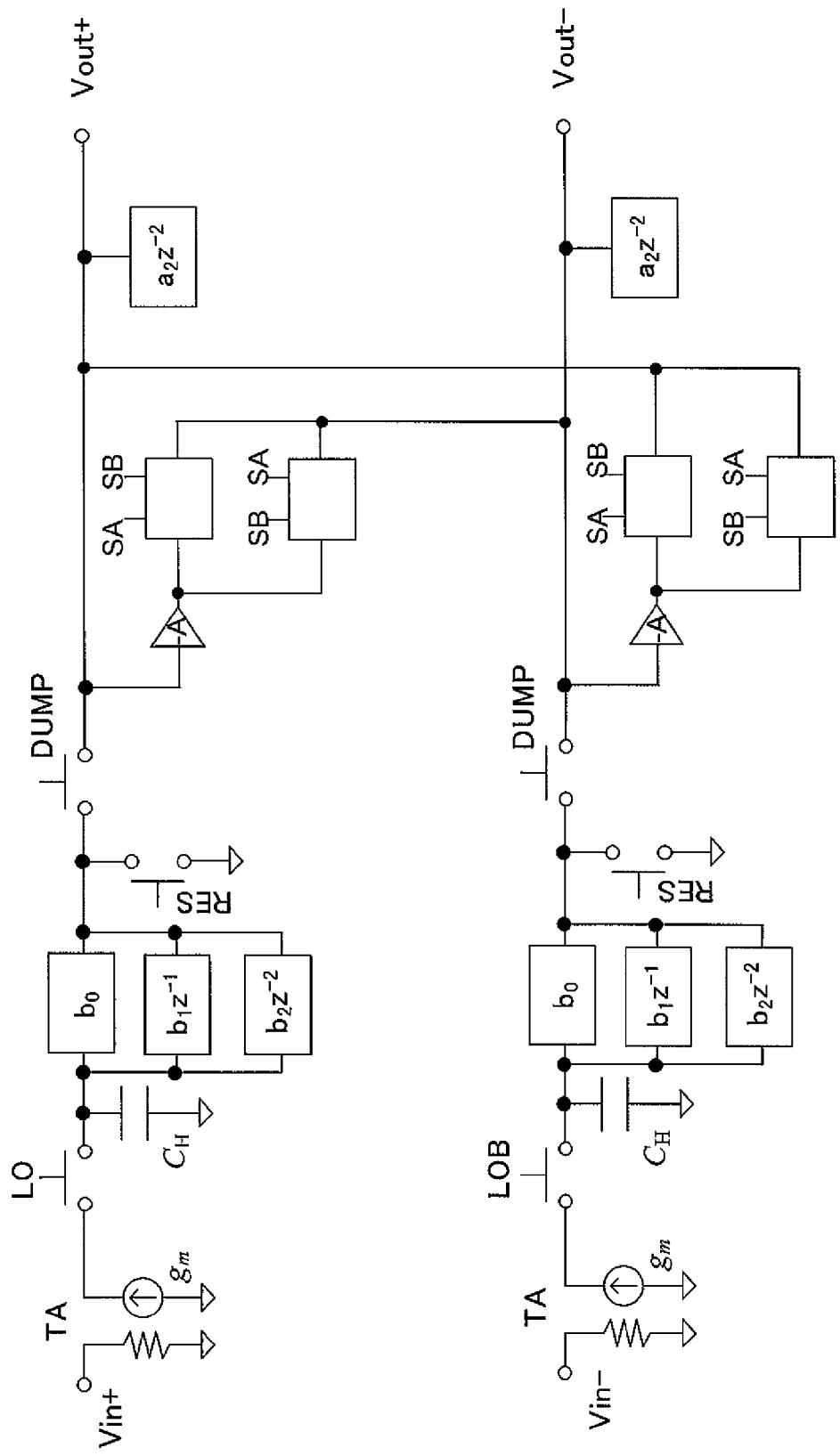
FIG. 44 shows another configuration diagram of the circuit connection according to Embodiment 8.

In general, a source-grounded amplifier has a gain expressed by −gmZload, resulting a negative coefficient, but the negative coefficient can be converted into a positive coefficient by employing the configurations shown in FIGS. 43 and 44. Each of the discrete-time analog circuits shown in FIGS. 43 and 44 provides a positive coefficient by using an opposite-phase signal.

In FIG. 43, charge holding circuits in capacitance units 2420-1 and 2420-2 in a first-order denominator coefficient circuit are connected to a positive phase at a timing when the charge holding circuits are connected to potential holding circuit 2410-1. On the other hand, the charge holding circuits in the capacitance units 2420-1 and 2420-2 in the first-order denominator coefficient circuit are connected to an opposite phase at a timing when the charge holding circuits are connected to rotating capacitor circuit 2030-2 and second-order denominator coefficient circuit 2440-2. Conversely, charge holding circuits in capacitance units 2420-3 and 2420-4 in the first-order denominator coefficient circuit are connected to the opposite phase at a timing when the charge holding circuits are connected to a potential holding circuit 2410-2. On the other hand, the charge holding circuits in capacitance units 2420-3 and 2420-4 in the first-order denominator coefficient circuit are connected to the positive phase at a timing when the charge holding circuits are connected to rotating capacitor circuit 2030-1 and second-order coefficient circuit 2440-1.

A method for generating an opposite phase in FIG. 43 differs from that in FIG. 44. In FIG. 43, a 180-degree shifted sample value system that responds to LOB is formed, whereas an opposite-phase input signal is present and a differential TA is used in FIG. 44.

In the present embodiment, a method for reversing the sign of the coefficient of the first-order denominator coefficient circuit has been described. The sign of the coefficient can be reversed even when an n-th-order denominator coefficient circuit (provided that n is an integer equal to or greater than 2) and a rotating capacitor circuit are used. Specifically, the sign of the coefficient can be reversed at the following timing by reversing the connection of the positive phase and the opposite phase. The following timing means a timing when the coefficient circuit is connected to the potential holding circuit (when charge is inputted to charge holding circuit) and a timing when the coefficient circuit is connected to the rotating capacitor circuit (i.e., when charge in charge holding circuit is outputted).

Even when the amplifier is formed of a component other than a source-grounded amplifier (such as serial-parallel conversion of capacitors, which will be described, hereinafter), a transfer function can be provided with an opposite sign by using an opposite-phase signal.

The amplifier does not necessarily have the nMOS source-grounded configuration shown in the present embodiment but can have a pMOS source-grounded configuration or any other configuration that operates as an amplifier, such as an inverter configuration and a cascode configuration.

In all the circuits having been described, a switch can be formed of an nMOS transistor or a pMOS transistor, or can be a complementary MOS switch formed of a combination of an nMOS transistor and a pMOS transistor.

As described above, the present embodiment has been described with reference to the case where a coefficient circuit includes a source-grounded amplifier. A discrete-time analog circuit using the source-grounded amplifier allows filtering that has a transfer function expressed in the form of integrating m transfer functions each having a numerator and a denominator each provided with an n-th-order polynomial having optional coefficients and that includes arbitrarily settable zero and poles of the transfer function.

Embodiment 9

In the present embodiment, a description will be given of the configurations of the potential holding circuit and the charge holding circuit in a coefficient circuit.

[Series/Parallel Connection of Voltage Follower and Capacitor]

Figure 45:
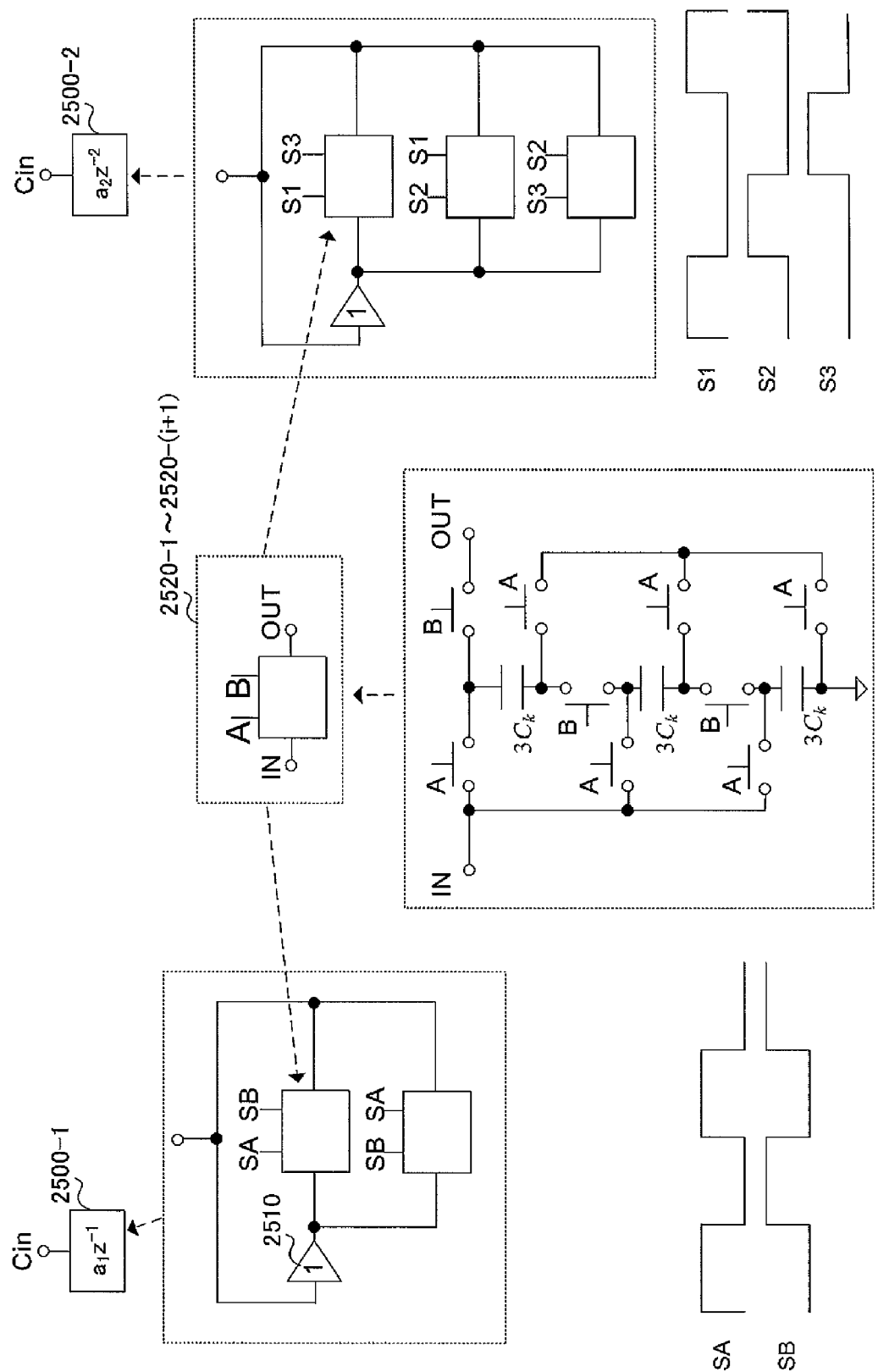
FIG. 45 shows a configuration diagram of a coefficient circuit according to Embodiment 9.

FIG. 45 shows another configuration of the coefficient circuit according to the present embodiment.

[Configuration]

Coefficient circuit 2500-$i$ (where i represents order of denominator coefficient) includes voltage follower (amplifier having a gain of about 1) 2510 and capacitance units 2520-1 to 2520-($i$+1).

Each of units 2520-1 to 2520-($i$+1) includes a plurality of connection switches and a plurality of capacitors.

[Operation of Coefficient Circuit 2500-$i$]

In the interval where control signal A is high, three capacitors are connected in parallel with each other. In the interval where control signal B is high, the three capacitors are connected in series with each other.

Assuming that the capacitance at the timing when the three capacitors are connected in parallel with each other is 9 Ck and the potential held at this point is VA, the accumulated energy is 9CkVA^2/2. When the connection is switched to the series connection, the capacitance changes to Ck but the energy is maintained. Therefore, assuming that the potential changes to VB after the connection is changed to the series connection, the following equation is satisfied:

[83]

$$9CkVA^2/2 = CkVB^2/2 \quad \text{(Equation 83)}$$

[84]

$$VB = 3VA \quad \text{(Equation 84)}$$

That is, in the series/parallel connection between the voltage follower and the capacitors, the potential is tripled when the connection is changed from parallel to series. As a result, the coefficients of a transfer function can be tripled.

FIG. 46 shows another configuration of the coefficient circuit according to the present embodiment. In coefficient circuit 2600 shown in FIG. 46, which shows a k-th order coefficient circuit, the coefficients can be multiplied by M. Coefficient circuit 2600 includes voltage follower (amplifier having a gain of about 1) 2610 and k+1 units 2620-$i$ ($i$=0 to k) that performs series/parallel conversion of capacitors and provides a k-th-order term when connected to the output side every k+1 times. When capacitance unit 2620-$i$ includes M capacitors, capacitance unit 2620-$i$ has a gain M after parallel/series conversion because the charge of each of the capacitors is multiplied by M.

The voltage follower can conceivably be a drain-grounded circuit, for example. The gain of coefficient circuit 2600 is determined by the number of capacitors provided in unit 2620-$i$. As a result, the gain can be set with precision depending on a method for forming coefficient circuit 2600, which is advantageous as compared with coefficient circuit 2300 because the gain is determined by an amplifier.

The present embodiment has been described with reference to an amplifier in which a coefficient circuit is formed of a voltage follower and a plurality of capacitors subjected to series/parallel conversion. A discrete-time analog circuit using the amplifier allows filtering that has a transfer function formed by integrating m transfer functions each having a numerator and a denominator each provided with an n-th-order polynomial having optional coefficients and that has arbitrarily settable zero and poles of the transfer function.

The disclosed contents of the specification, the drawings, and the abstract contained in Japanese Patent Application No. 2010-169628 filed on Jul. 28, 2010 are entirely incorporated herein.

INDUSTRIAL APPLICABILITY

A discrete-time analog circuit and a receiver according to the claimed invention are useful in a high-frequency signal processing circuit in a reception section in a radio communication apparatus and preferably used in frequency conversion and filtering on a signal.

REFERENCE SIGNS LIST

10 Direct sampling receiver
11 Antenna
12 Low noise amplifier
13, 100, 200, 300, 500, 600, 800, 900, 1100, 1200, 1400, 1500, 1600, 1700, 1800, 1900, 2000, 2110-1 to 2110-$m$ Discrete-time analog circuit
14 Reference frequency oscillating section
15 A/D conversion processing section 16 Digital reception processing section
110 Clock generation circuit
120 TA
130, 820, 1410-1, 1410-2 Sampling switch
140, 220, 400, 510, 610, 700, 810-$k$, 830-$k$, 910-$k$, 920-$k$, 1000, 1120, 1300, 1420-$k$, 1430-$k$, 1440-$k$, 1510, 2300, 2340-1 to 2340-2, 2500-$i$, 2600 Coefficient circuit
150 Rotating capacitor circuit
160, 1440-1, 1440-2 Reset switch
170, 1450-1, 1450-2 Dump switch
141, 221, 410, 511, 611, 1010, 1121, 1210, 1511, 1610 Amplifier
143-1, 143-2, 513-1 to 513-3, 1110 History capacitor
142-1 to 142-4, 151-1 to 151-4, 222-1 to 222-4, 420-1 to 420-4, 512-1 to 512-6, 612-1 to 612-6, 1020-1 to 1020-4, 1122-1 to 1122-6 Switch
152-1, 152-2, 1030-1, 1030-2, 1123-1 to 1123-3 Rotating capacitor
223-1, 223-2, 613-1 to 613-3, 1130, 1460-1, 1460-2 Buffer capacitor
430-1, 430-2 Capacitor
2420-1 to 2420-4, 2520-1 to 2520-($i$+1), 2620-0 to 2620-$k$ Capacitance unit
2310 Source-grounded amplifier
2410-1 to 2410-2 Charge holding circuit
2430-1 to 2430-2 Rotating capacitor unit
2510, 2610 Voltage follower

The invention claimed is:

1. A discrete-time analog circuit comprising:
a rotating capacitor circuit that includes at least one input line;
at least one coefficient circuit that includes
a potential holding section that amplifies input potential or input charge, an input line of the potential holding section being connected to the at least one input line of the rotating capacitor circuit and
n charge holding sections disposed in series with the potential holding section and in parallel with each other, an output line of the potential holding section being connected to the n charge holding sections via switches; and
a circuit connection switching section that sequentially changes the pairing of a first charge holding section and a second charge holding section among the n charge holding sections, the first charge holding section being connected to the potential holding section and charged thereby, the second charge holding section being connected to the input line not via the potential holding section and sharing charge with the rotating capacitor circuit or being held at the potential at the rotating capacitor circuit.

2. The discrete-time analog circuit according to claim 1, wherein the circuit connection switching section causes:
the first charge holding section at an i-th timing to be the second charge holding section at the i-th timing plus n−1 timings; and
the second charge holding section at the i-th timing to be the first charge holding section at the i-th timing plus 1 timing.

3. A discrete-time analog circuit comprising:
a rotating capacitor circuit that includes at least one output line;
at least one coefficient circuit that includes
a potential holding section that amplifies input potential or input charge, an input line of the potential holding section being connected to the at least one output line of the rotating capacitor circuit and
n charge holding sections disposed in series with the potential holding section and in parallel with each other, an output line of the potential holding section being connected to the n charge holding sections via switches; and
a circuit connection switching section that sequentially changes the pairing of a first charge holding section and a second charge holding section among the n charge holding sections, the first charge holding section being connected to the potential holding section and charged thereby, the second charge holding section being connected to the output line not via the potential holding section and sharing charge with the rotating capacitor circuit or held at the potential at the rotating capacitor circuit.

4. The discrete-time analog circuit according to claim 3, wherein the circuit connection switching section causes:
the first charge holding section at an i-th timing to be the second charge holding section at the i-th timing plus n−1 timings, and
the second charge holding section at the i-th timing to be the first charge holding section at the i-th timing plus 1 timing.

5. The discrete-time analog circuit according to claim 2, further comprising:
a voltage-current converter that converts an input signal in the form of voltage into a signal in the form of current, the voltage-current converter being disposed at the input line of the rotating capacitor circuit;
a sampling switch that samples the current; and
a buffer capacitor disposed at an output line of the rotating capacitor circuit.

6. The discrete-time analog circuit according to claim 4, further comprising:
a voltage-current converter that converts an input signal in the form of voltage into a signal in the form of current, the voltage-current converter being disposed at the input line of the rotating capacitor circuit;
a sampling switch that samples the current; and
a history capacitor.

7. A discrete-time analog circuit comprising:
the discrete-time analog circuit according to claim 2 disposed at 1 to k locations;
a voltage-current converter that converts an input signal in the form of voltage into a signal in the form of current, the voltage-current converter being disposed at an input line of a first rotating capacitor circuit; and
a sampling switch that samples the current,
wherein an output line of a j-th (where j=1 to k−1) rotating capacitor circuit is connected to an input line of a (j+1)-th rotating capacitor circuit, and
a buffer capacitor is connected to an output line of a k-th rotating capacitor circuit.

8. A discrete-time analog circuit comprising:
the discrete-time analog circuit according to claim 4 disposed at 1 to k locations;
a voltage-current converter that converts an input signal in the form of voltage into a signal in the form of current, the voltage-current converter being disposed at an input line of a first rotating capacitor circuit;
a sampling switch that samples the current; and
a history capacitor,
wherein an output line of a j-th (where j=1 to k−1) rotating capacitor circuit is connected to an input line of a (j+1)-th rotating capacitor circuit.

9. The discrete-time analog circuit according to claim 1, wherein the rotating capacitor circuit includes two rotating capacitors and a circuit connection switching section, and the circuit connection switching section alternately switches the two rotating capacitors between an input rotating capacitor and an output rotating capacitor, the input rotating capacitor being configured to be connected to the input line and the output rotating capacitor being configured to be connected to the output line.

10. The discrete-time analog circuit according to claim 1, wherein the rotating capacitor circuit includes:

a potential holding section that amplifies input potential or input charge, the potential holding section being connected to the input line;

m charge holding sections disposed in series with the potential holding section and in parallel with each other; and a circuit connection switching section that sequentially changes the pairing of a first charge holding section and a second charge holding section among the m charge holding sections, the first charge holding section being connected to the input line via the potential holding section and charged thereby, the second charge holding section being connected to an output line of the rotating capacitor circuit.

11. The discrete-time analog circuit according to claim 10, wherein the circuit connection switching section causes:

the first charge holding section at an i-th timing to be the second charge holding section at the i-th timing plus m−1 timing; and the second charge holding section at the i-th timing to be the first charge holding section at the i-th timing plus 1 timing.

12. The discrete-time analog circuit according to claim 1, wherein the rotating capacitor circuit includes:

m potential holding sections directly connected to the input line and disposed in parallel with each other; and a circuit connection switching section that sequentially changes the pairing of a first charge holding section and a second charge holding section among the m charge holding sections, the first charge holding section being connected to the input line and charged thereby, the second charge holding section being connected to an output line of the rotating capacitor circuit.

13. The discrete-time analog circuit according to claim 12, wherein the circuit connection switching section causes:

the first charge holding section at an i-th timing to be the second charge holding section at the i-th timing plus m−1 timing, and the second charge holding section at the i-th timing to be the first charge holding section at the i-th timing plus 1 timing.

14. The discrete-time analog circuit according to claim 1, wherein the potential holding section is a source-grounded amplifier formed of a transistor, a bias circuit that appropriately biases the transistor, and a load resistor.

15. The discrete-time analog circuit according to claim 1, wherein in the coefficient circuit or the rotating capacitor circuit, the potential holding section is formed of a voltage follower and the charge holding section is formed of M capacitors, and the circuit connection switching section connects the M capacitors in parallel with each other at a timing when the M capacitors are connected to the voltage follower, whereas the circuit connection switching section connects the M capacitors in series with each other at a timing when the M capacitors are connected to the input line not via the voltage follower.

16. The discrete-time analog circuit according to claim 1, wherein the discrete-time analog circuit has a positive-phase system and an opposite-phase system, and in at least one of the coefficient circuit and the rotating capacitor circuit, a charge holding circuit connected to a positive-phase system at a timing when the charge holding circuit is connected to the potential holding circuit is connected to an opposite-phase system at a timing when the charge holding circuit is connected to the input line or an output line of the rotating capacitor circuit, whereas the charge holding circuit connected to the opposite-phase system at the timing when the charge holding circuit is connected to the potential holding circuit is connected to the positive-phase system at the timing when the charge holding circuit is connected to the input line or the output line of the rotating capacitor circuit.

17. A receiver comprising:

the discrete-time analog circuit according to claim 1;

an antenna that receives an input signal;

a low noise amplifier that amplifies the signal received by the antenna and outputs the amplified signal to the discrete-time analog circuit; and an analog-to-digital conversion section that converts an analog baseband signal outputted from the discrete-time analog circuit into a digital baseband signal and outputs the digital baseband signal.

18. A receiver comprising:

the discrete-time analog circuit according to claim 3;

an antenna that receives an input signal;

a low noise amplifier that amplifies a signal received by the antenna and outputs the amplified signal to the discrete-time analog circuit; and an analog-to-digital conversion section that converts an analog baseband signal outputted from the discrete-time analog circuit into a digital baseband signal and outputs the digital baseband signal.

* * * * *